United States Patent
Phan et al.

(10) Patent No.: US 9,552,757 B2
(45) Date of Patent: Jan. 24, 2017

(54) IMAGE DEVICE WITH IMPROVED CHROMINANCE QUALITY

(71) Applicant: VP ASSETS LIMITED, Road Town Tortola (VG)

(72) Inventors: Gia Chuong Phan, Hong Kong (CN); Maggie Phan, Hong Kong (CN); Anthony Phan, Hong Kong (CN)

(73) Assignee: VP ASSETS LIMITED, Road Town Tortola (VG)

( * ) Notice: Subject to any disclaimer, the term of this patent is extended or adjusted under 35 U.S.C. 154(b) by 40 days.

(21) Appl. No.: 14/512,289

(22) Filed: Oct. 10, 2014

(65) Prior Publication Data

US 2016/0055782 A1  Feb. 25, 2016

Related U.S. Application Data

(63) Continuation-in-part of application No. 14/465,496, filed on Aug. 21, 2014.

(51) Int. Cl.
*G09G 3/20* (2006.01)
*H01L 27/15* (2006.01)
*G02F 1/1335* (2006.01)

(52) U.S. Cl.
CPC ....... *G09G 3/2003* (2013.01); *G02F 1/133514* (2013.01); *H01L 27/156* (2013.01); *G02F 2201/52* (2013.01); *G09G 2300/0443* (2013.01); *G09G 2300/0452* (2013.01); *G09G 2320/0242* (2013.01); *G09G 2340/06* (2013.01)

(58) Field of Classification Search
CPC ............... G09G 3/28–3/38; G09G 2300/0452; G09G 2300/0443; G09G 2320/0242; G09G 2340/06; G02F 1/133514; G02F 2201/52; H01L 27/156
USPC ........................................... 345/690, 60–108
See application file for complete search history.

(56) References Cited

U.S. PATENT DOCUMENTS

| 4,800,375 | A | 1/1989 | Silverstein et al. |
|---|---|---|---|
| 4,892,391 | A | 1/1990 | Stewart et al. |
| 5,757,452 | A | 5/1998 | Masaki et al. |
| 7,248,314 | B2 | 7/2007 | Yun |
| 7,286,136 | B2 | 10/2007 | Phan |

(Continued)

OTHER PUBLICATIONS

International Search Report and Written Opinion of the International Searching Authority (forms PCT/ISA/210 and PCT/ISA/237), issued Nov. 5, 2015, for International Application No. PCT/IB2015/056322.

*Primary Examiner* — Stephen Sherman
(74) *Attorney, Agent, or Firm* — Birch, Stewart, Kolasch & Birch, LLP

(57) ABSTRACT

The invention provides an image device with improved chrominance quality. The image device includes a plurality of RGBW pixels, a plurality of RGBY pixels, and a plurality of RBGB pixels. Each RGBW pixel includes a red sub-pixel, a green sub-pixel, a blue sub-pixel and a white sub-pixel. Each RGBY pixel includes a red sub-pixel, a green sub-pixel, a blue sub-pixel and a yellow sub-pixel. Each RBGB pixel includes a red sub-pixel, a green sub-pixel, and two blue sub-pixels. The RGBW pixels, RGBY pixels, and RBGB pixels are mixed in the image device. The image device of the present invention can solve the problem of dark yellow in the conventional RGBW display while achieving a white balance status. As a result the chrominance quality is improved.

44 Claims, 61 Drawing Sheets

(56) References Cited

U.S. PATENT DOCUMENTS

| | | |
|---|---|---|
| 7,583,279 B2 | 9/2009 | Elliott et al. |
| 7,742,205 B2 | 6/2010 | Lor et al. |
| 7,864,271 B2 | 1/2011 | Nakamura et al. |
| 7,995,019 B2 | 8/2011 | Ben-David et al. |
| 8,248,440 B2 | 8/2012 | Ben-David et al. |
| 8,441,601 B2 | 5/2013 | Lee et al. |
| 8,558,857 B2 | 10/2013 | Ben-David et al. |
| 8,749,727 B2 | 6/2014 | Itsumi et al. |
| 2005/0134785 A1* | 6/2005 | Roth .................... G09G 3/3607 349/144 |
| 2009/0128755 A1 | 5/2009 | Roth et al. |
| 2012/0062824 A1 | 3/2012 | Lee et al. |
| 2012/0249610 A1 | 10/2012 | Katagami et al. |
| 2015/0009194 A1* | 1/2015 | Kim .................... G09G 3/3233 345/211 |

\* cited by examiner

| | | | |
|---|---|---|---|
| W | R | W | R |
| B | W | B | W |
| G | B | G | B |
| R | G | R | G |
| Y | B | Y | B |
| G | R | G | R |
| B | G | B | G |
| R | B | R | B |
| W | R | W | R |
| B | W | B | W |
| G | B | G | B |
| R | G | R | G |
| Y | B | Y | B |
| G | R | G | R |
| B | G | B | G |
| R | B | R | B |

IMAGE DEVICE WITH IMPROVED CHROMINANCE QUALITY

This application is a Continuation-in-Part of co-pending application Ser. No. 14/465,496 filed on Aug. 21, 2014. The entire contents of the above application are hereby incorporated by reference.

BACKGROUND OF THE INVENTION

1. Field of the Invention

The invention relates to an image device with improved chrominance quality by the utilization of RGBW pixels, RGBY pixels, and RBGB pixels.

2. Description of the Related Art

Referring to FIG. 61, it shows a conventional RGBW display. The conventional RGBW display 10 includes a plurality of RGBW pixels 11. Each RGBW pixel 11 includes a green sub-pixel 111, a red sub-pixel 112, a blue sub-pixel 113 and a white sub-pixel 114 arranged in a 2×2 matrix. The conventional RGBW display 10 has the merit of enhanced color space and improved brightness and contrast, compared with traditional RGB display. U.S. Pat. No. 4,892,391, U.S. Pat. No. 5,757,452, U.S. Pat. Nos. 7,286,136, 7,742,205, and U.S. Pat. No. 7,583,279 teach RGBW displays. However, the conventional RGBW display 10 has the deficiency of dark yellow. U.S. Pat. No. 4,800,375, U.S. Pat. No. 7,864,271, and U.S. Pat. No. 8,749,727 teach RGBY displays which claim to have better yellow color. However, RGBY display lacks the merits of RGBW displays. U.S. Pat. No. 7,248,314, U.S. Pat. No. 7,995,019, U.S. Pat. No. 8,248,440, U.S. Pat. No. 8,441,601 and U.S. Pat. No. 8,558,857 teach displays with five color sub-pixels. However five color displays have the deficiency of high display manufacturing complexity and cost. Moreover, the color conversion from RGB to five colors is also more difficult.

SUMMARY OF THE INVENTION

The present invention provides an image device. The image device includes a plurality of RGBW pixels, a plurality of RGBY pixels, and a plurality of RBGB pixels. Each RGBW pixel includes a red sub-pixel, a green sub-pixel, a blue sub-pixel and a white sub-pixel. Each RGBY pixel includes a red sub-pixel, a green sub-pixel, a blue sub-pixel and a yellow sub-pixel. Each RBGB pixel includes a red sub-pixel, a green sub-pixel, and two blue sub-pixels. The RGBW pixels, RGBY pixels, and RBGB pixels are mixed in the image device.

By the addition of RGBY pixels, the problem of dark yellow in the conventional RGBW display can be solved and chrominance quality can be improved. The present invention adds both RGBY pixels and RBGB pixels. The RBGB pixels are used to offset the chrominance change caused by the addition of RGBY pixels. The present invention thus can solve the dark yellow problem of conventional RGBW display and at the same time achieve a white balance status.

BRIEF DESCRIPTION OF THE DRAWING

Further advantageous measures are described in the dependent claims. The invention is shown in the attached drawing and is described hereinafter in greater detail.

FIG. 1 shows an image device according to an embodiment of the invention;

FIG. 4 shows an image device according to an embodiment of the invention;

FIG. 14 shows an image device according to an embodiment of the invention;

FIG. 18 shows an image device according to an embodiment of the invention;

FIG. 33 shows an image device according to an embodiment of the invention;

FIG. 34 shows an image device according to an embodiment of the invention;

FIG. 40 shows an image device according to an embodiment of the invention;

FIG. 45 shows an image device according to an embodiment of the invention;

DETAILED DESCRIPTION OF THE INVENTION

Figure 1:
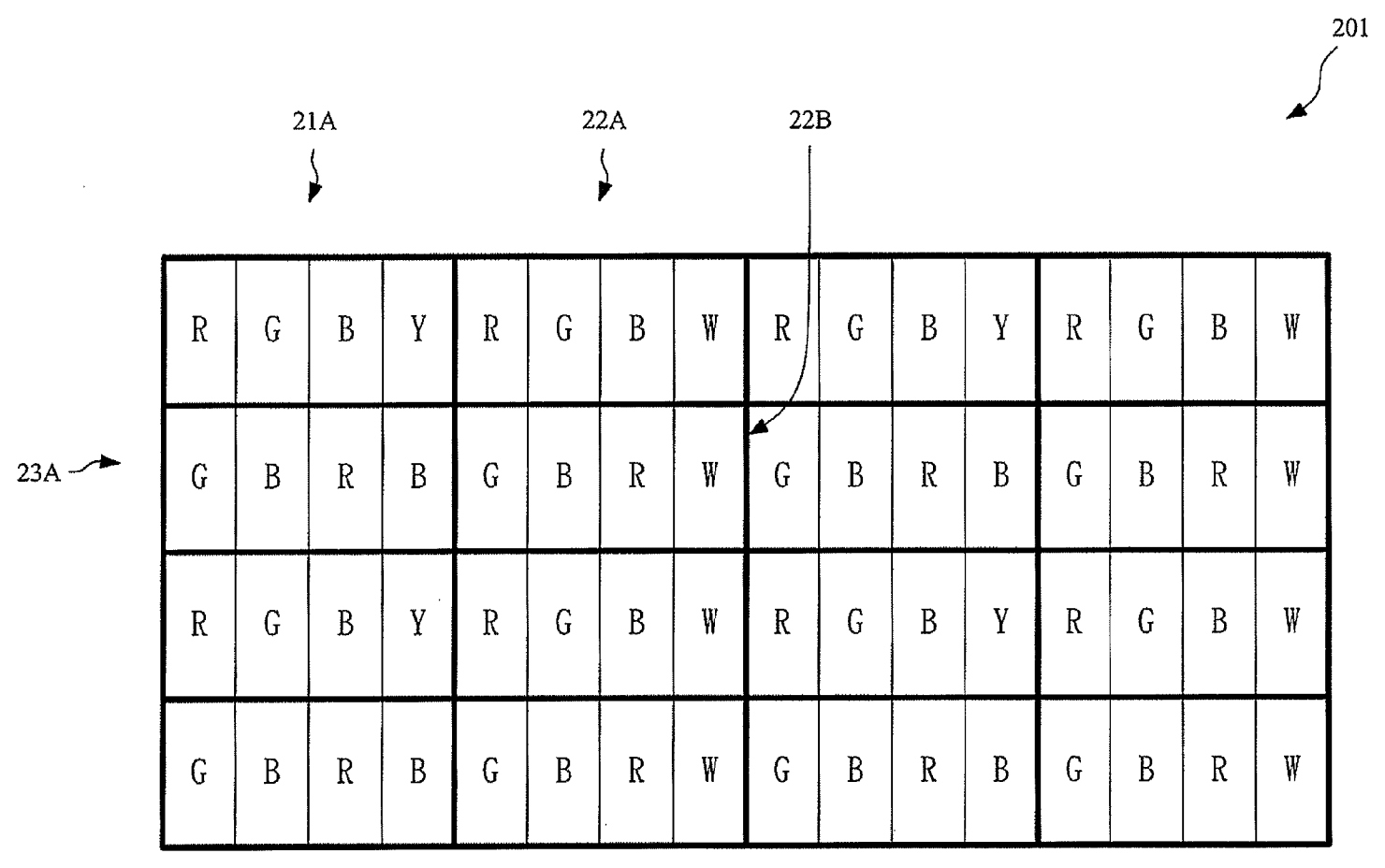
Figure 2:
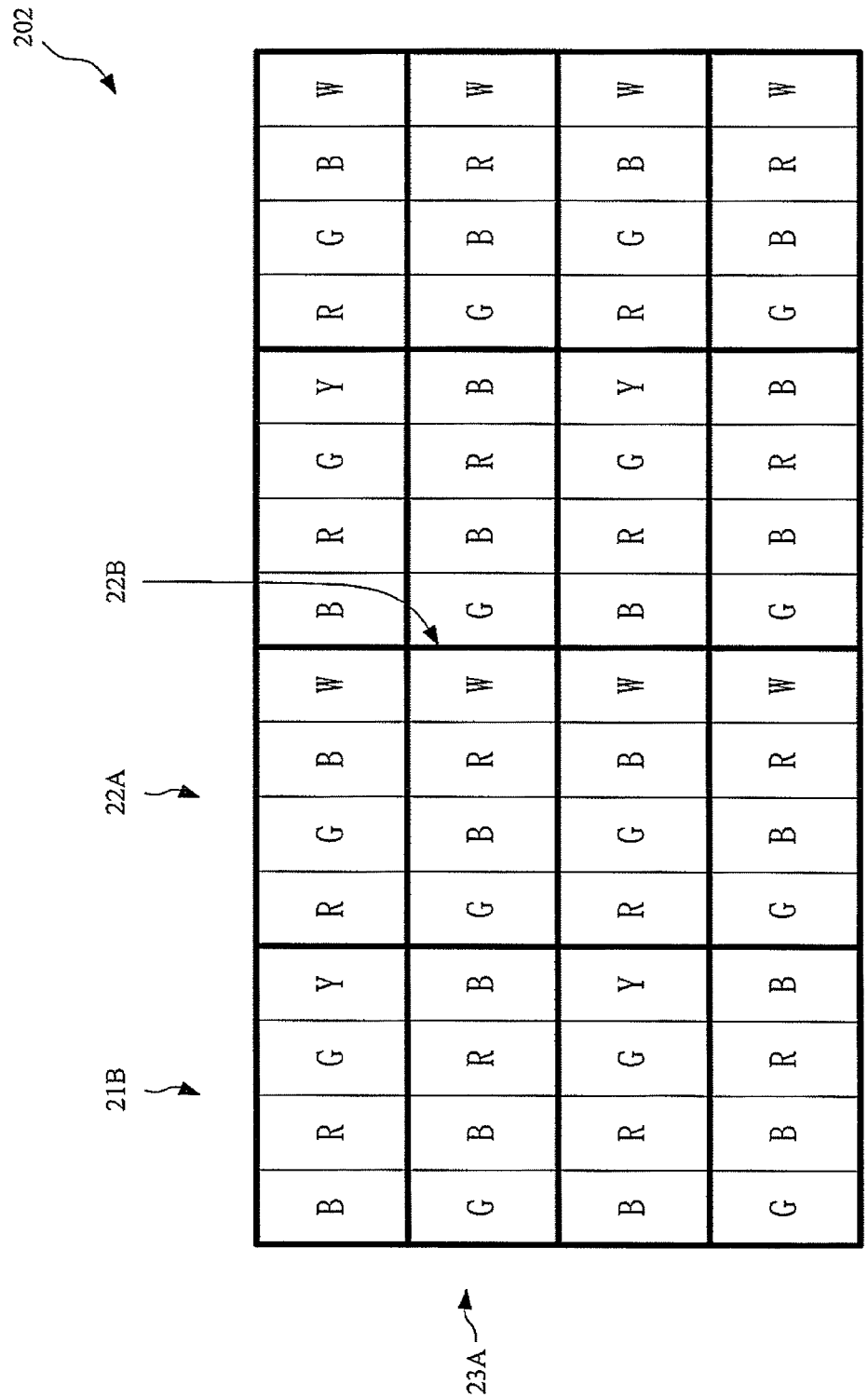
FIG. 2 shows an image device according to an embodiment of the invention.

Referring to FIG. 1, it shows an image device according to an embodiment of the invention. The image device 201 includes a plurality of RGBY pixels 21A, a plurality of RGBW pixels 22A, 22B and a plurality of RBGB pixels 23A. Each RGBY pixel includes a red sub-pixel, a green sub-pixel, a blue sub-pixel and a yellow sub-pixel. The RGBY pixel 21A includes a red sub-pixel, a green sub-pixel, a blue sub-pixel and a yellow sub-pixel. In an embodiment, the red sub-pixel, the green sub-pixel, the blue sub-pixel and the yellow sub-pixel are arranged in a 1×4 matrix. Each sub-pixel is formed as about a rectangular shape, and any two adjacent sub-pixels along a longer border are formed as about a square shape.

In the RGBY pixel 21A, the sequence of the sub-pixels in the 1×4 matrix from left to right is the red sub-pixel, the green sub-pixel, the blue sub-pixel and the yellow sub-pixel.

Each RGBW pixel includes a red sub-pixel, a green sub-pixel, a blue sub-pixel and a white sub-pixel. The RGBW pixel 22A includes a red sub-pixel, a green sub-pixel, a blue sub-pixel and a white sub-pixel. In an embodiment, the red sub-pixel, the green sub-pixel, the blue sub-pixel and the white sub-pixel are arranged in a 1×4 matrix. Each sub-pixel is formed as about a rectangular shape, and any two adjacent sub-pixels along a longer border are formed as about a square shape. In the RGBW pixel 22A, the sequence of the sub-pixels in the 1×4 matrix from left to right is the red sub-pixel, the green sub-pixel, the blue sub-pixel and the white sub-pixel. In the RGBW pixel 22B, the sequence of the sub-pixels in the 1×4 matrix from left to right is the green sub-pixel, the blue sub-pixel, the red sub-pixel and the white sub-pixel.

Each RBGB pixel includes a red sub-pixel, a green sub-pixel, and two blue sub-pixels. The RBGB pixel 23A includes a red sub-pixel, a green sub-pixel, and two blue sub-pixels. In an embodiment, the red sub-pixel, the green sub-pixel, and the two blue sub-pixels are arranged in a 1×4 matrix. Each sub-pixel is formed as about a rectangular shape, and any two adjacent sub-pixels along a longer border are formed as about a square shape. In the RBGB pixel 23A, the sequence of the sub-pixels in the 1×4 matrix from left to right is the green sub-pixel, the blue sub-pixel, the red sub-pixel and the blue sub-pixel.

In an embodiment, in the image device 201, the ratio of the number of red sub-pixels to the number of green sub-pixels to the number of blue sub-pixels to the number of white sub-pixels and to the number of yellow sub-pixels is about 4:4:5:2:1. The ratio of the total area of red sub-pixels to the total area of green sub-pixels to the total area of blue sub-pixels to the total area of white sub-pixels and to the total area of yellow sub-pixels is about 4:4:5:2:1.

In an embodiment, the RGBY pixel 21A is disposed on a first column and first row position of the image device 201, the RGBW pixel 22A is disposed on a second column and first row position of image device 201, the RBGB pixel 23A is disposed on a first column and second row position of the image device 201, and the RGBW pixel 22B is disposed on a second column and second row position of the image device 201. The RGBY pixel 21A and the RGBW pixel 22A are arranged and repeated on the first row of the image device 201. The RBGB pixel 23A and the RGBW pixel 22B are arranged and repeated on the second row of the image device 201. The RGBY pixel 21A and the RBGB pixel 23A are arranged and repeated on the first column of the image device 201. The RGBW pixel 22A and the RGBW pixel 22B are arranged and repeated on the second column of the image device 201.

In an embodiment, each row or each column comprises at least one RGBW pixel. In the image device 201, each row comprises at least one RGBW pixel. In an embodiment, at least one row or at least one column comprises at least one RGBW pixel and at least one RGBY pixel. In the image device 201, at least one row comprises at least one RGBW pixel and at least one RGBY pixel. In an embodiment, at least one row or at least one column comprises at least one RGBW pixel and at least one RBGB pixel. In the image device 201, at least one row comprises at least one RGBW pixel and at least one RBGB pixel.

In an embodiment, every two consecutive rows or every two consecutive columns comprise at least one RGBY pixel. In an embodiment, every two consecutive rows or every two consecutive columns comprise at least one RGBW pixel. In an embodiment, every two consecutive rows or every two consecutive columns comprise at least one RBGB pixel.

In an embodiment, each sub-pixel has a plurality of sides adjacent to the other sub-pixels with different color. In an embodiment, each sub-pixel other than white sub-pixels has a plurality of sides adjacent to the other sub-pixels with different color.

In an embodiment, at least one row or one column comprises a plurality of yellow sub-pixels and blue sub-pixels. In an embodiment, at least two consecutive rows or two consecutive columns comprise a plurality of yellow sub-pixels and blue sub-pixels. In an embodiment, at least one row or one column comprises a plurality of white sub-pixels. In an embodiment, at least two consecutive rows or two consecutive columns comprise at least a plurality of white sub-pixels.

Referring to FIG. 2, it shows an image device according to an embodiment of the invention. The image device 202 includes a plurality of RGBY pixels 21B, a plurality of RGBW pixels 22A, 22B and a plurality of RBGB pixels 23A. In the RGBY pixel 21B, the sequence of the sub-pixels in the 1×4 matrix from left to right is the blue sub-pixel, the red sub-pixel, the green sub-pixel and the yellow sub-pixel. In an embodiment, the RGBY pixel 21B is disposed on a first column and first row position of the image device 202, the RGBW pixel 22A is disposed on a second column and first row position of image device 202, the RBGB pixel 23A is disposed on a first column and second row position of the image device 202, and the RGBW pixel 22B is disposed on a second column and second row position of the image device 202.

Figure 3:
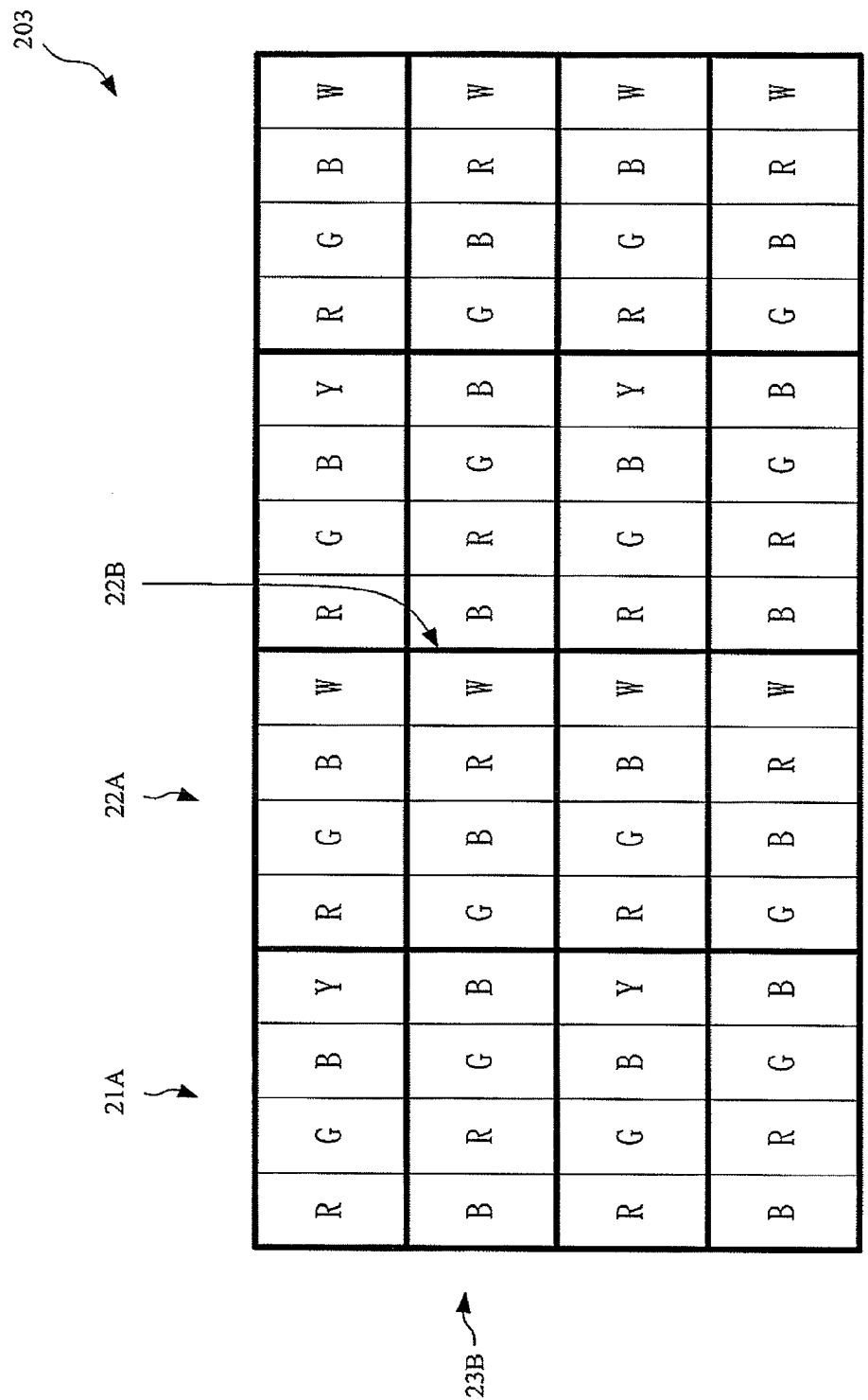
FIG. 3 shows an image device according to an embodiment of the invention.

Referring to FIG. 3, it shows an image device according to an embodiment of the invention. The image device 203 includes a plurality of RGBY pixels 21A, a plurality of RGBW pixels 22A, 22B and a plurality of RBGB pixels 23B. In the RBGB pixel 23B, the sequence of the sub-pixels in the 1×4 matrix from left to right is the blue sub-pixel, the red sub-pixel, the green sub-pixel and the blue sub-pixel. In an embodiment, the RGBY pixel 21A is disposed on a first column and first row position of the image device 203, the RGBW pixel 22A is disposed on a second column and first row position of image device 203, the RBGB pixel 23B is disposed on a first column and second row position of the image device 203, and the RGBW pixel 22B is disposed on a second column and second row position of the image device 203.

Figure 4:
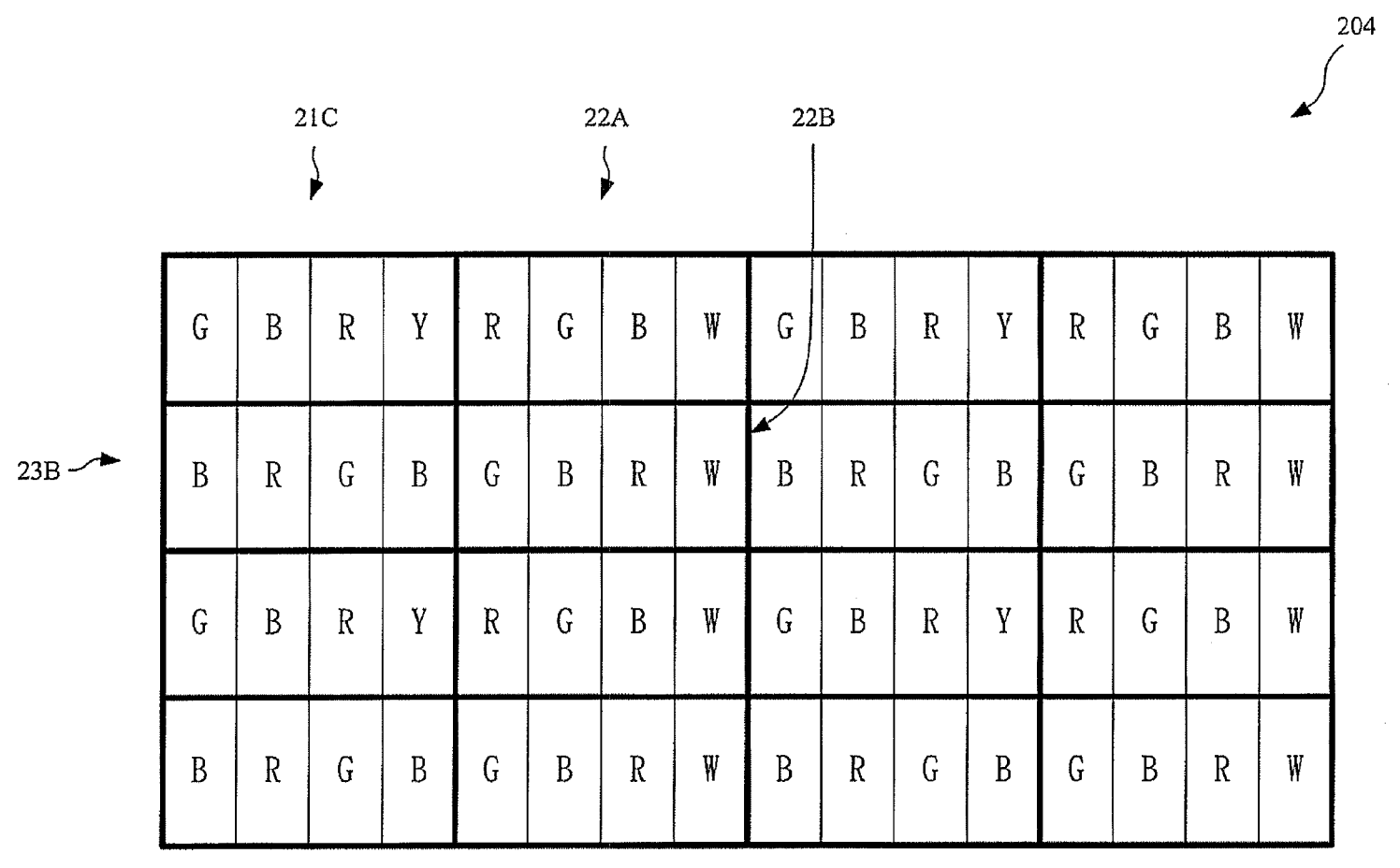

Referring to FIG. 4, it shows an image device according to an embodiment of the invention. The image device 204 includes a plurality of RGBY pixels 21C, a plurality of RGBW pixels 22A, 22B and a plurality of RBGB pixels 23B. In the RGBY pixel 21C, the sequence of the sub-pixels in the 1×4 matrix from left to right is the green sub-pixel, the blue sub-pixel, the red sub-pixel and the yellow sub-pixel. In an embodiment, the RGBY pixel 21C is disposed on a first column and first row position of the image device 204, the RGBW pixel 22A is disposed on a second column and first row position of image device 204, the RBGB pixel 23B is disposed on a first column and second row position of the image device 204, and the RGBW pixel 22B is disposed on a second column and second row position of the image device 204.

Figure 5:
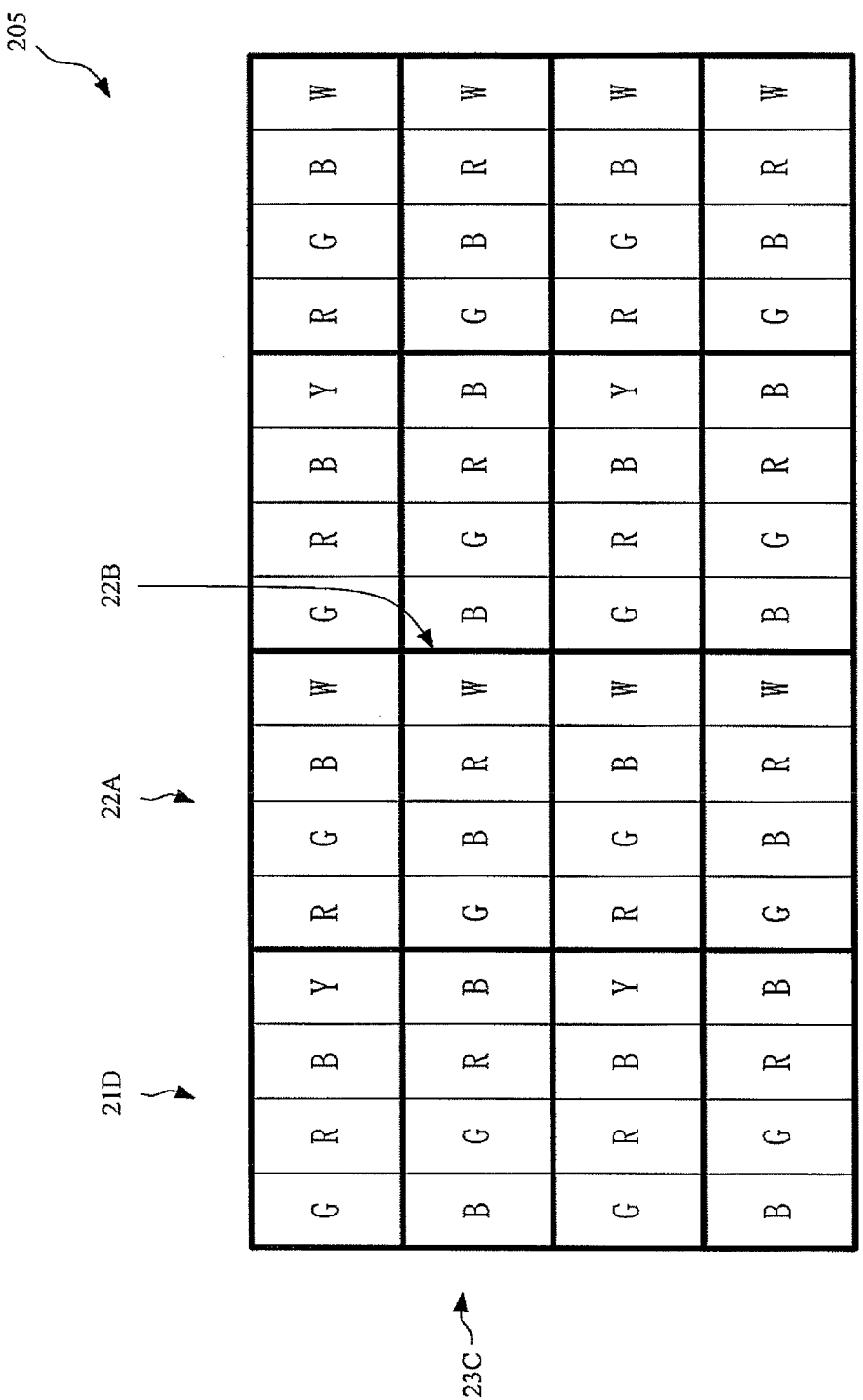
FIG. 5 shows an image device according to an embodiment of the invention.

Referring to FIG. 5, it shows an image device according to an embodiment of the invention. The image device 205 includes a plurality of RGBY pixels 21D, a plurality of RGBW pixels 22A, 22B and a plurality of RBGB pixels 23C. In the RGBY pixel 21D, the sequence of the sub-pixels in the 1×4 matrix from left to right is the green sub-pixel, the red sub-pixel, the blue sub-pixel and the yellow sub-pixel. In the RBGB pixel 23C, the sequence of the sub-pixels in the 1×4 matrix from left to right is the blue sub-pixel, the green sub-pixel, the red sub-pixel and the blue sub-pixel. In an embodiment, the RGBY pixel 21D is disposed on a first column and first row position of the image device 205, the RGBW pixel 22A is disposed on a second column and first row position of image device 205, the RBGB pixel 23C is disposed on a first column and second row position of the image device 205, and the RGBW pixel 22B is disposed on a second column and second row position of the image device 205.

Figure 6:
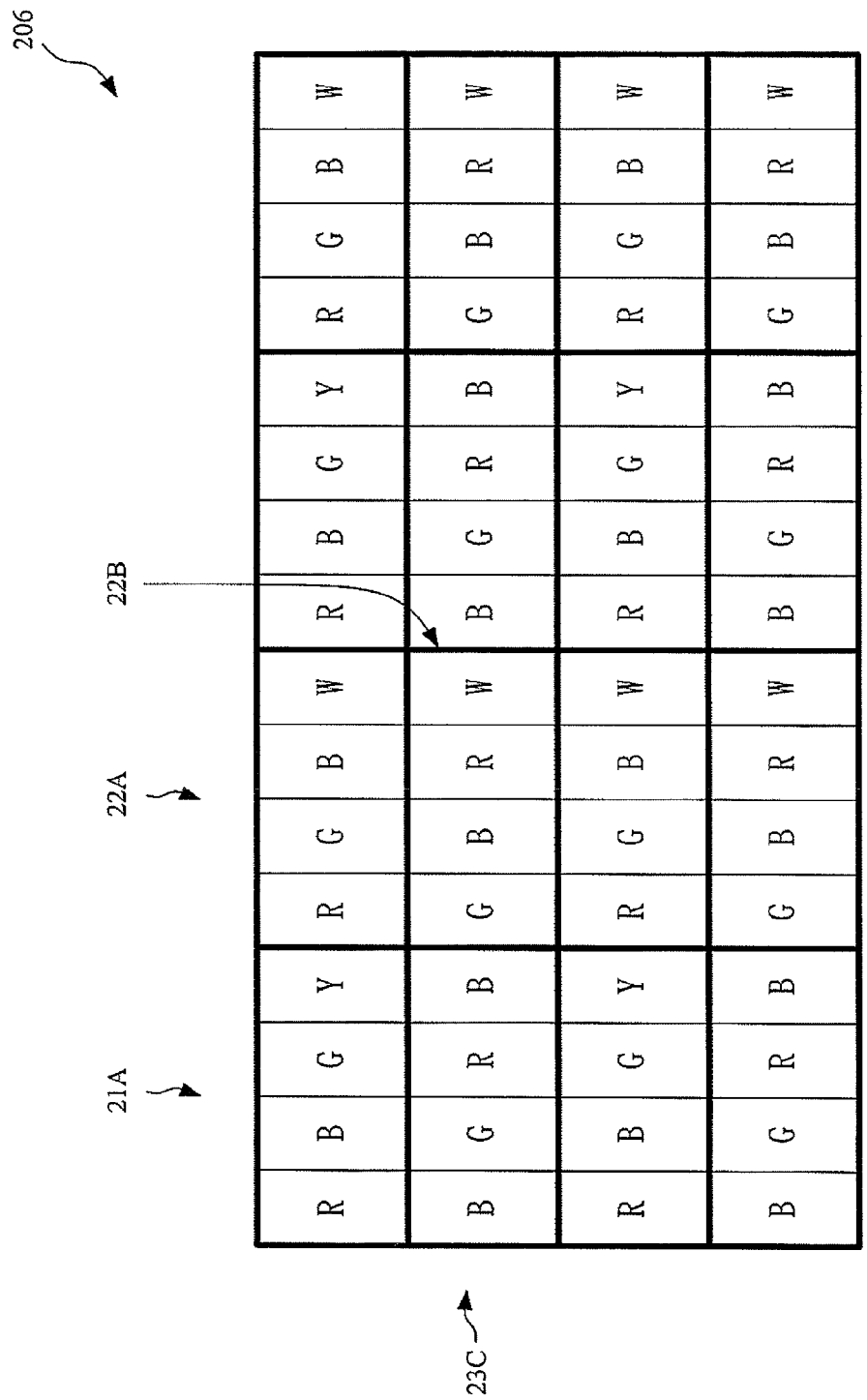
FIG. 6 shows an image device according to an embodiment of the invention.

Referring to FIG. 6, it shows an image device according to an embodiment of the invention. The image device 206 includes a plurality of RGBY pixels 21A, a plurality of RGBW pixels 22A, 22B and a plurality of RBGB pixels 23C. In an embodiment, the RGBY pixel 21A is disposed on a first column and first row position of the image device 206, the RGBW pixel 22A is disposed on a second column and first row position of image device 206, the RBGB pixel 23C is disposed on a first column and second row position of the image device 206, and the RGBW pixel 22B is disposed on a second column and second row position of the image device 206.

Figure 7:
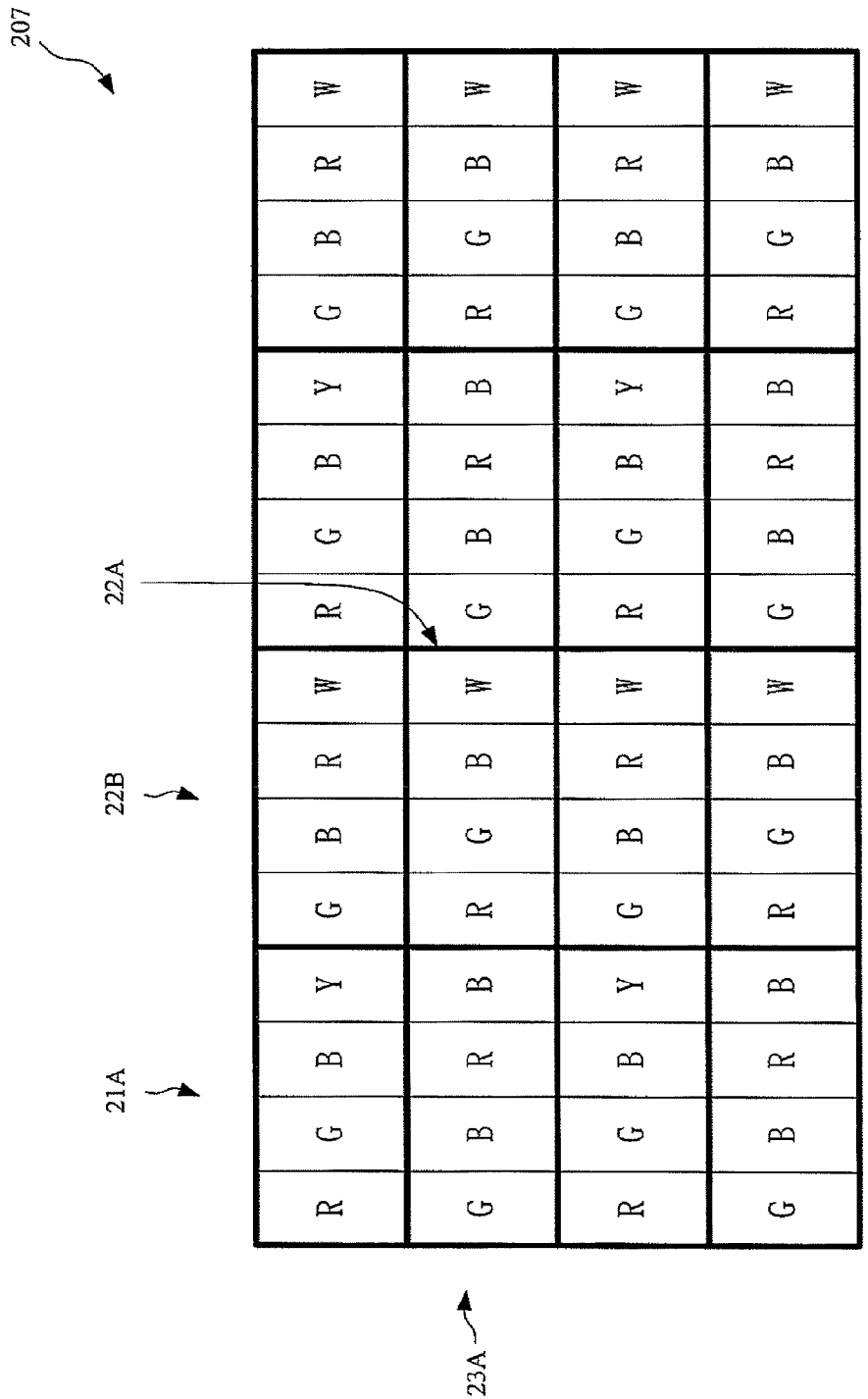
FIG. 7 shows an image device according to an embodiment of the invention.

Referring to FIG. 7, it shows an image device according to an embodiment of the invention. The image device 207 includes a plurality of RGBY pixels 21A, a plurality of RGBW pixels 22A, 22B and a plurality of RBGB pixels 23A. In an embodiment, the RGBY pixel 21A is disposed on a first column and first row position of the image device 207, the RGBW pixel 22B is disposed on a second column and first row position of image device 207, the RBGB pixel 23A is disposed on a first column and second row position of the image device 207, and the RGBW pixel 22A is disposed on a second column and second row position of the image device 207.

Figure 8:
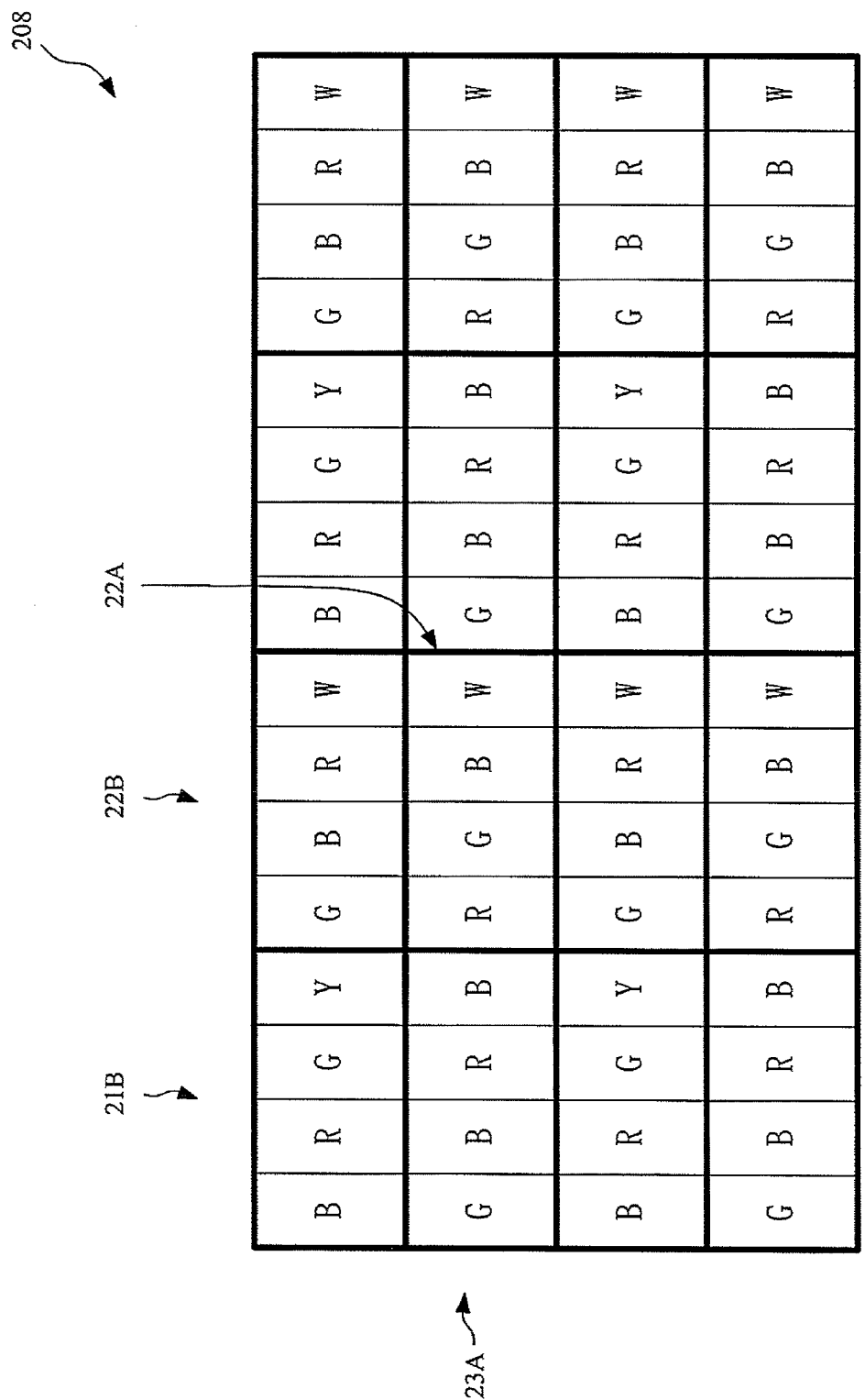
FIG. 8 shows an image device according to an embodiment of the invention.

Referring to FIG. 8, it shows an image device according to an embodiment of the invention. The image device 208 includes a plurality of RGBY pixels 21B, a plurality of RGBW pixels 22A, 22B and a plurality of RBGB pixels 23A. In an embodiment, the RGBY pixel 21B is disposed on a first column and first row position of the image device 208, the RGBW pixel 22B is disposed on a second column and first row position of image device 208, the RBGB pixel 23A is disposed on a first column and second row position of the image device 208, and the RGBW pixel 22A is disposed on a second column and second row position of the image device 208.

Figure 9:
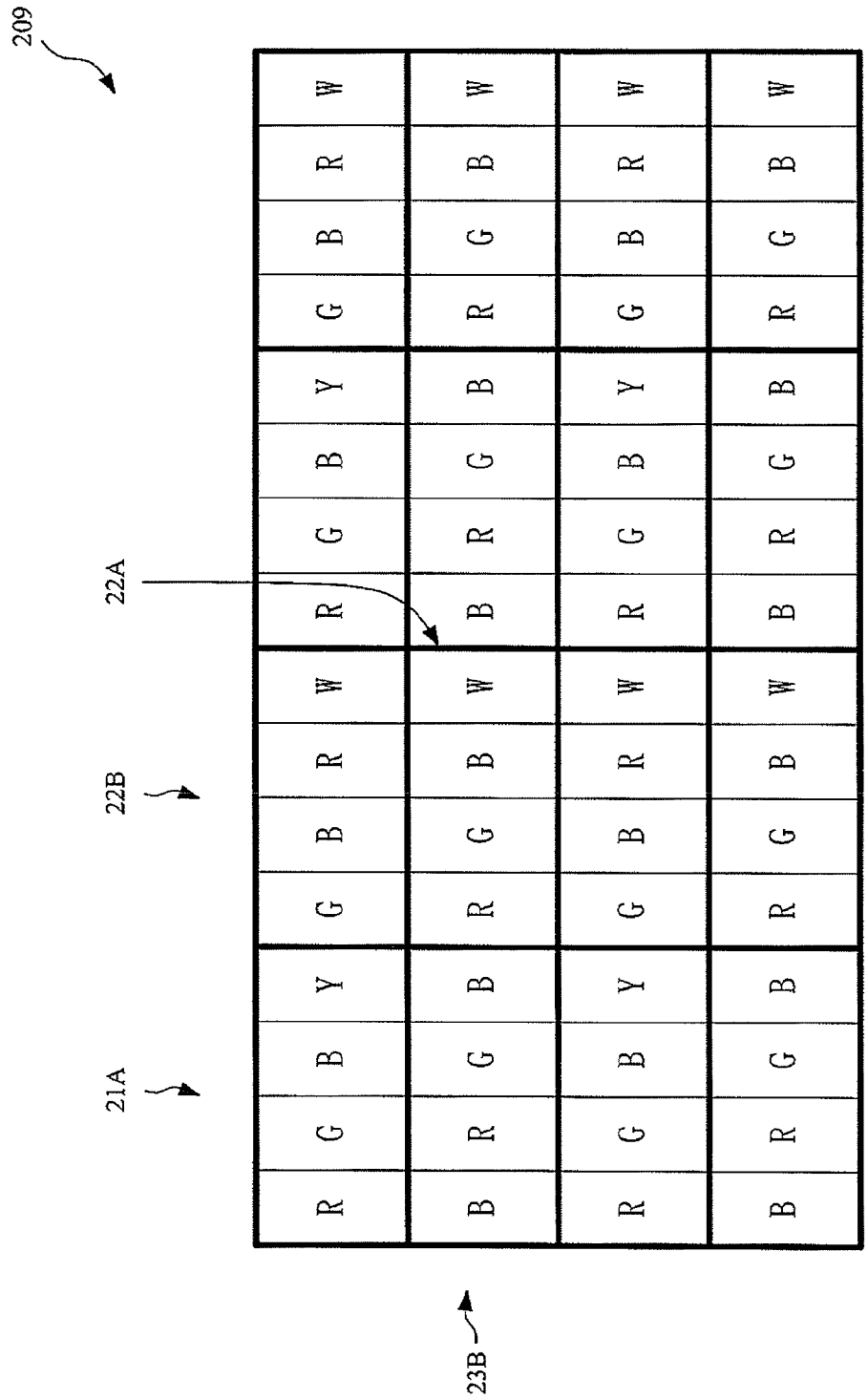
FIG. 9 shows an image device according to an embodiment of the invention.

Referring to FIG. 9, it shows an image device according to an embodiment of the invention. The image device 209 includes a plurality of RGBY pixels 21A, a plurality of RGBW pixels 22A, 22B and a plurality of RBGB pixels 23B. In an embodiment, the RGBY pixel 21A is disposed on a first column and first row position of the image device 209, the RGBW pixel 22B is disposed on a second column and first row position of image device 209, the RBGB pixel 23B is disposed on a first column and second row position of the image device 209, and the RGBW pixel 22A is disposed on a second column and second row position of the image device 209.

Figure 10:
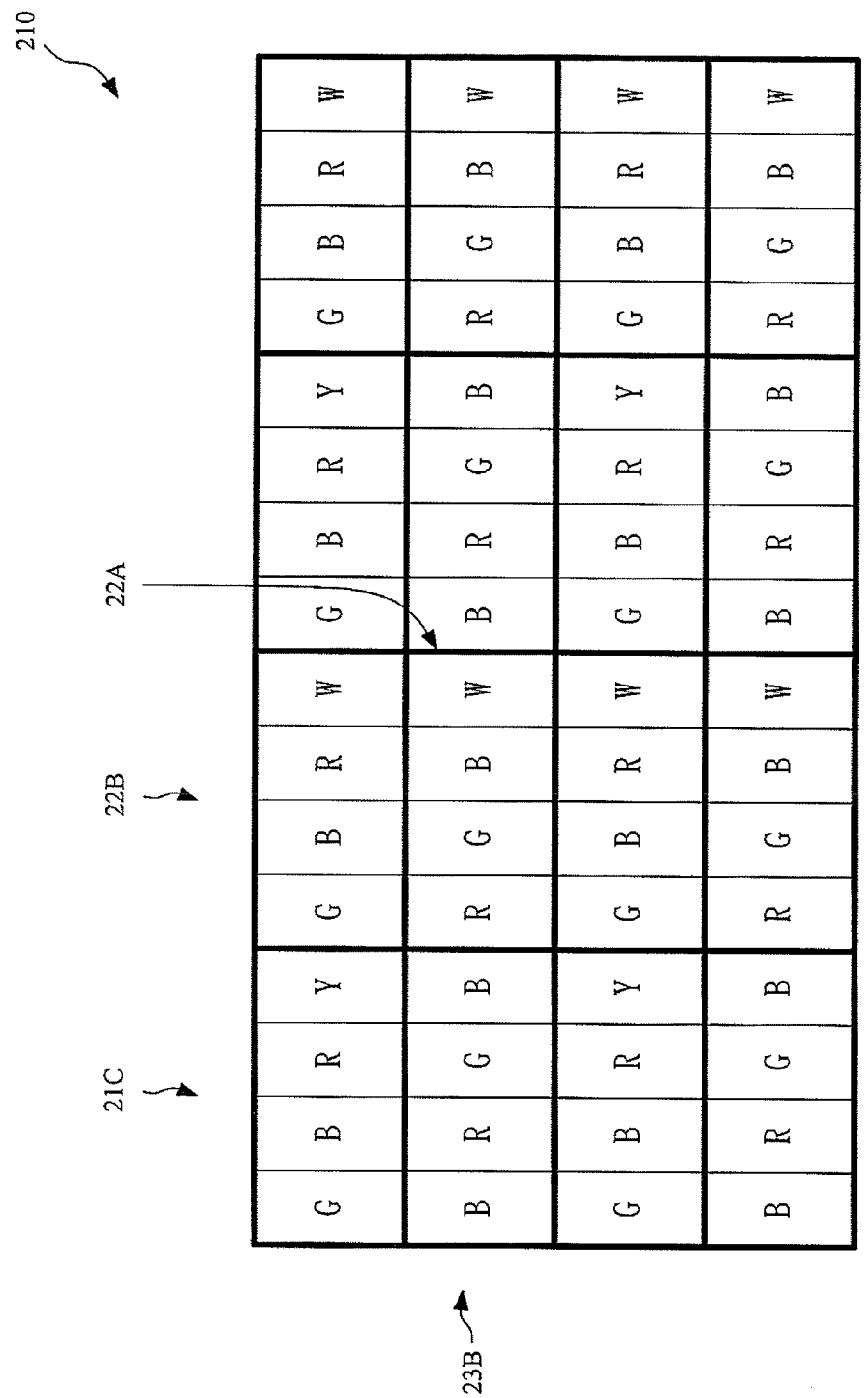
FIG. 10 shows an image device according to an embodiment of the invention.

Referring to FIG. 10, it shows an image device according to an embodiment of the invention. The image device 210 includes a plurality of RGBY pixels 21C, a plurality of RGBW pixels 22A, 22B and a plurality of RBGB pixels 23B. In an embodiment, the RGBY pixel 21C is disposed on a first column and first row position of the image device 210, the RGBW pixel 22B is disposed on a second column and first row position of image device 210, the RBGB pixel 23B is disposed on a first column and second row position of the image device 210, and the RGBW pixel 22A is disposed on a second column and second row position of the image device 210.

Figure 11:
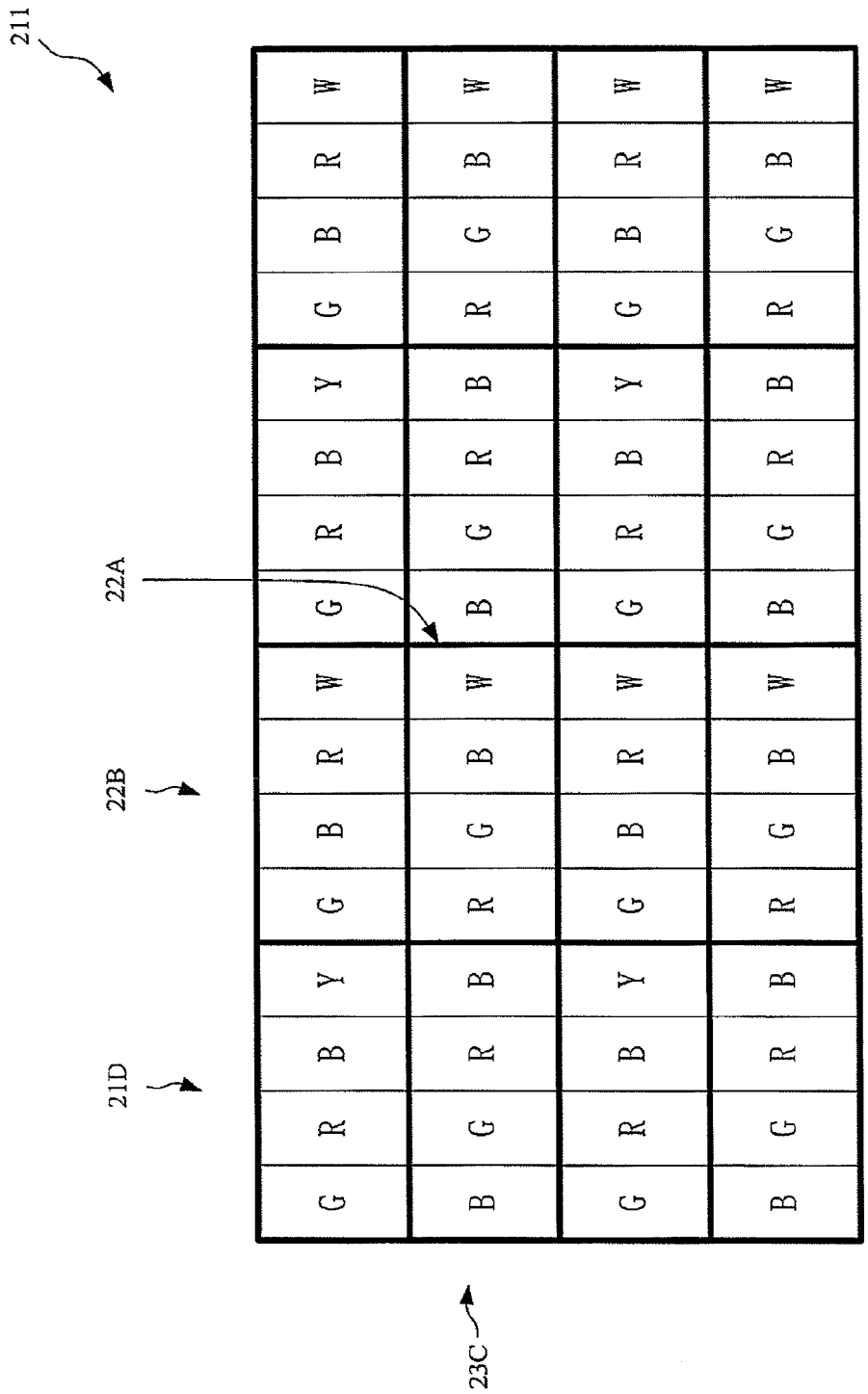
FIG. 11 shows an image device according to an embodiment of the invention.

Referring to FIG. 11, it shows an image device according to an embodiment of the invention. The image device 211 includes a plurality of RGBY pixels 21D, a plurality of RGBW pixels 22A, 22B and a plurality of RBGB pixels 23C. In an embodiment, the RGBY pixel 21D is disposed on a first column and first row position of the image device 211, the RGBW pixel 22B is disposed on a second column and first row position of image device 211, the RBGB pixel 23C is disposed on a first column and second row position of the image device 211, and the RGBW pixel 22A is disposed on a second column and second row position of the image device 211.

Figure 12:
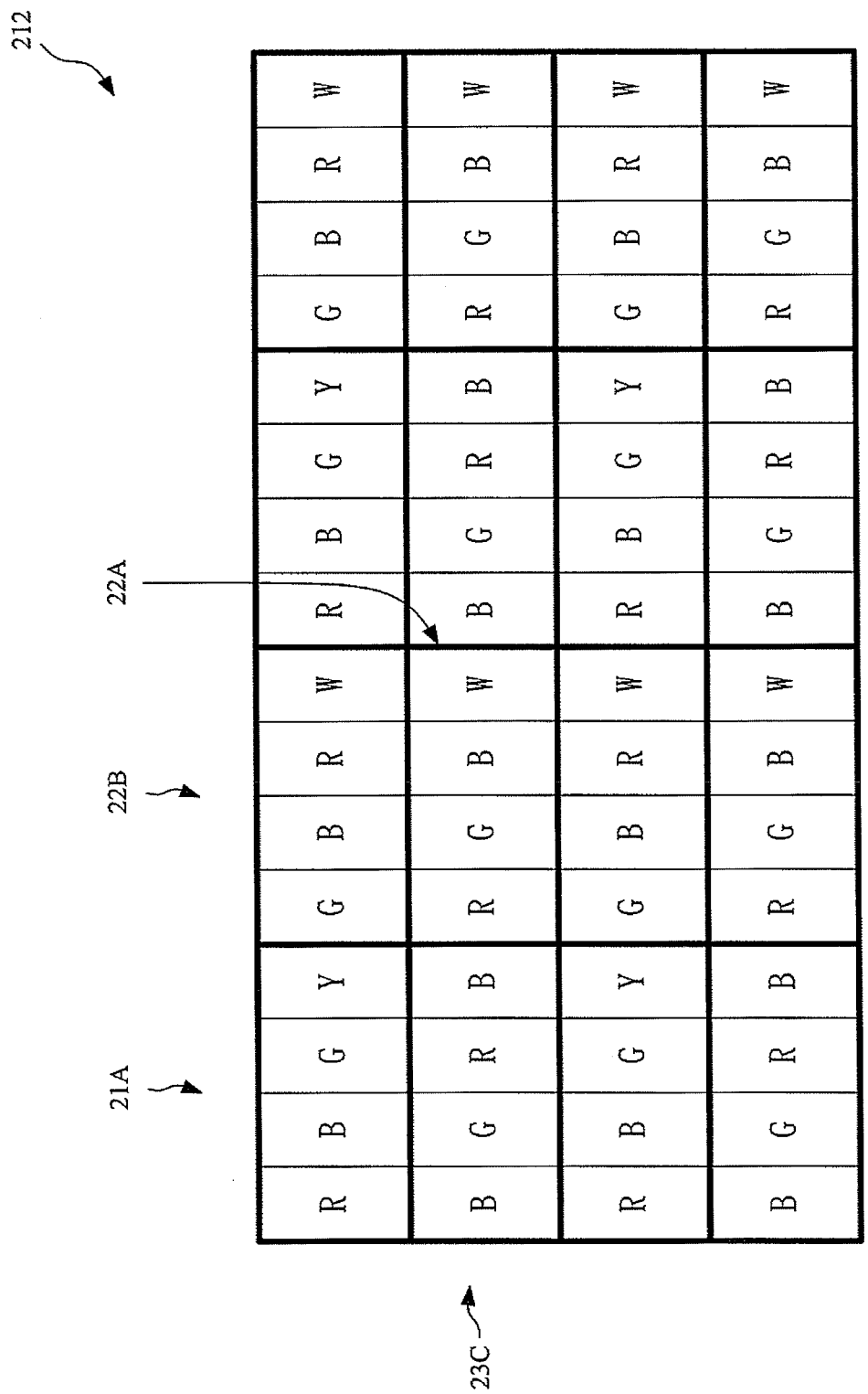
FIG. 12 shows an image device according to an embodiment of the invention.

Referring to FIG. 12, it shows an image device according to an embodiment of the invention. The image device 212 includes a plurality of RGBY pixels 21A, a plurality of RGBW pixels 22A, 22B and a plurality of RBGB pixels 23C. In an embodiment, the RGBY pixel 21A is disposed on a first column and first row position of the image device 212, the RGBW pixel 22B is disposed on a second column and first row position of image device 212, the RBGB pixel 23C is disposed on a first column and second row position of the image device 212, and the RGBW pixel 22A is disposed on a second column and second row position of the image device 212.

Figure 13:
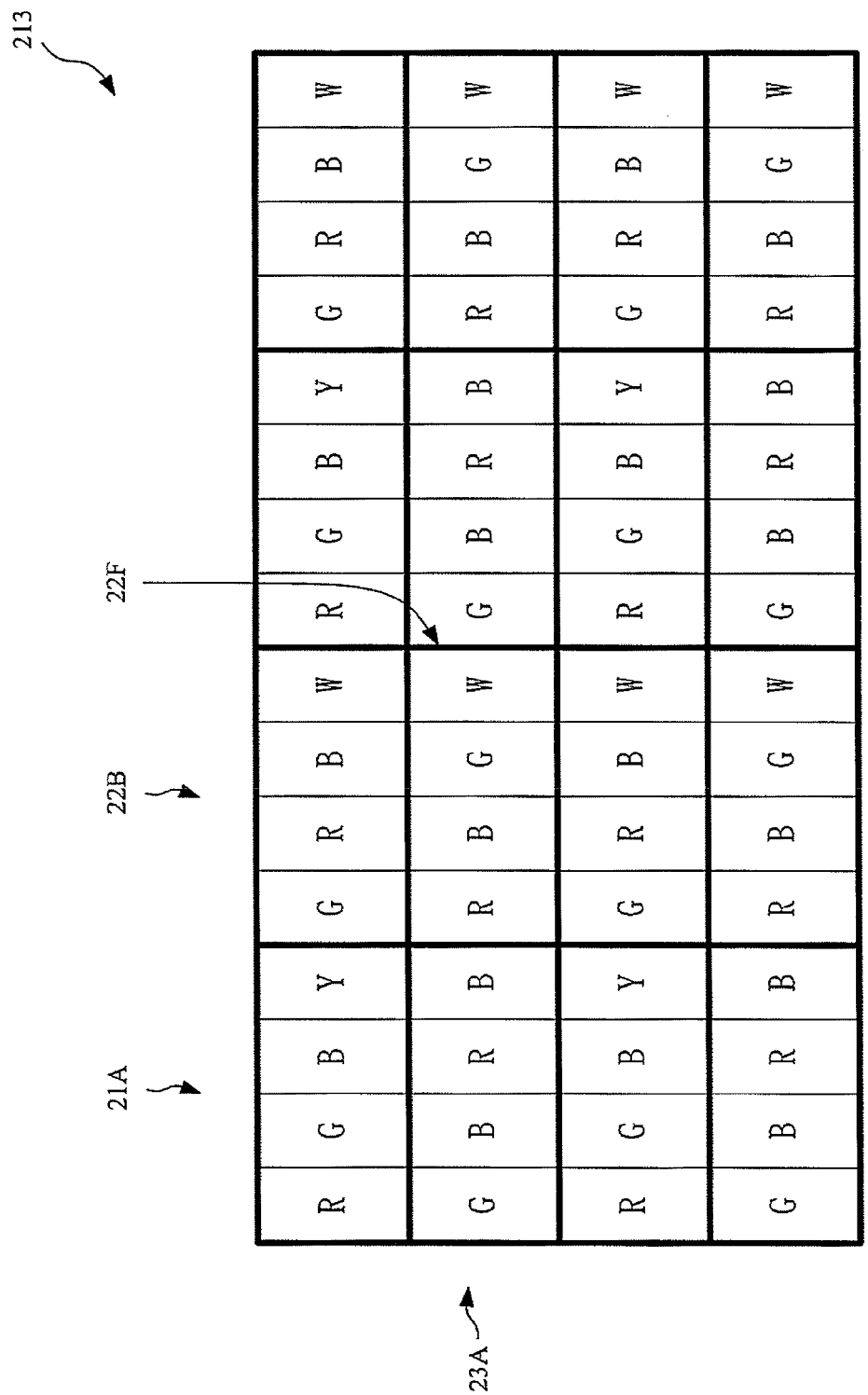
FIG. 13 shows an image device according to an embodiment of the invention.

Referring to FIG. 13, it shows an image device according to an embodiment of the invention. The image device 213 includes a plurality of RGBY pixels 21A, a plurality of RGBW pixels 22B, 22F and a plurality of RBGB pixels 23A. In the RGBW pixel 22F, the sequence of the sub-pixels in the 1×4 matrix from left to right is the red sub-pixel, the blue sub-pixel, the green sub-pixel and the white sub-pixel. In an embodiment, the RGBY pixel 21A is disposed on a first column and first row position of the image device 213, the RGBW pixel 22B is disposed on a second column and first row position of image device 213, the RBGB pixel 23A is disposed on a first column and second row position of the image device 213, and the RGBW pixel 22F is disposed on a second column and second row position of the image device 213.

Figure 14:
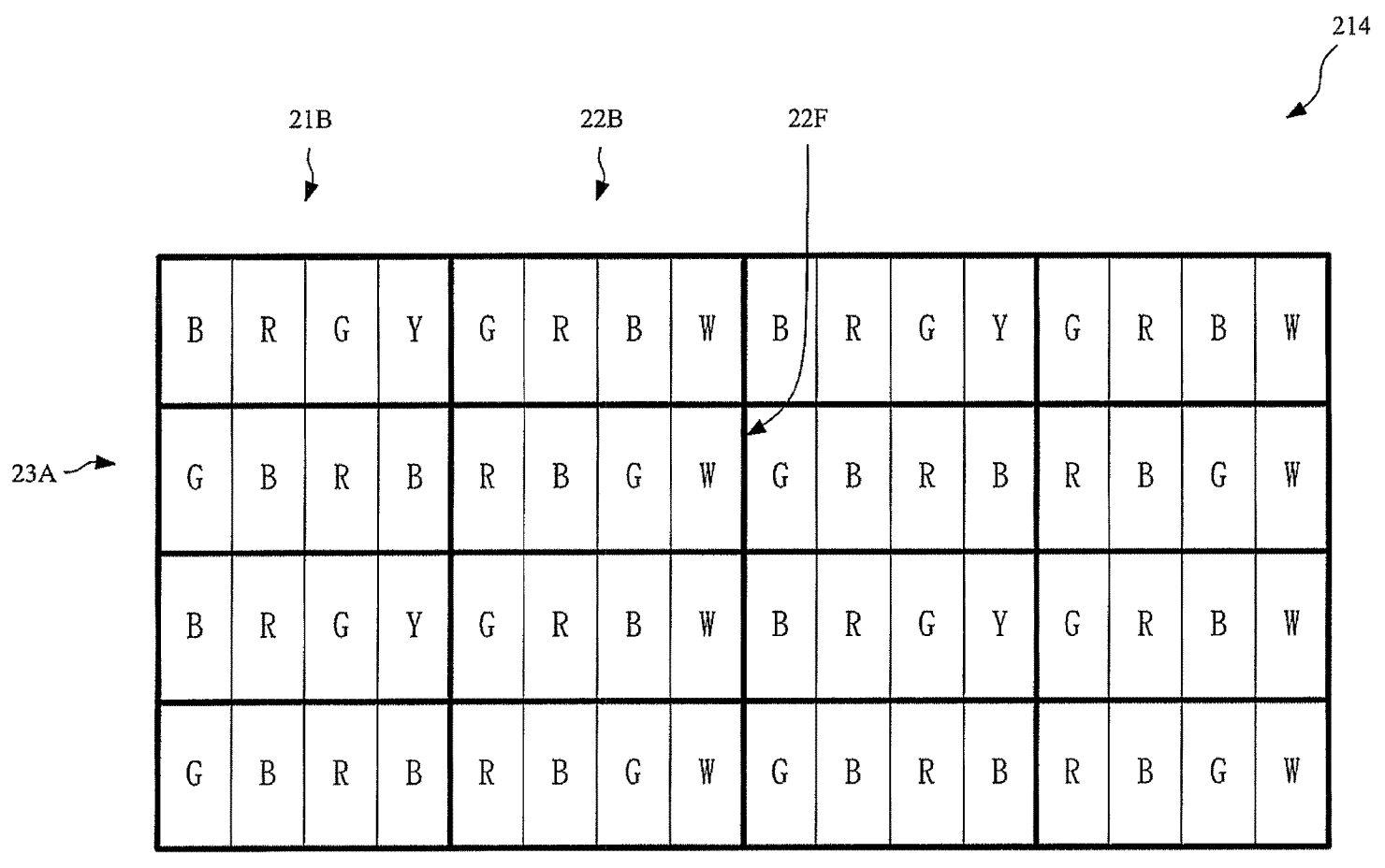

Referring to FIG. 14, it shows an image device according to an embodiment of the invention. The image device 214 includes a plurality of RGBY pixels 21B, a plurality of RGBW pixels 22B, 22F and a plurality of RBGB pixels 23A. In an embodiment, the RGBY pixel 21B is disposed on a first column and first row position of the image device 214, the RGBW pixel 22B is disposed on a second column and first row position of image device 214, the RBGB pixel 23A is disposed on a first column and second row position of the image device 214, and the RGBW pixel 22F is disposed on a second column and second row position of the image device 214.

Figure 15:
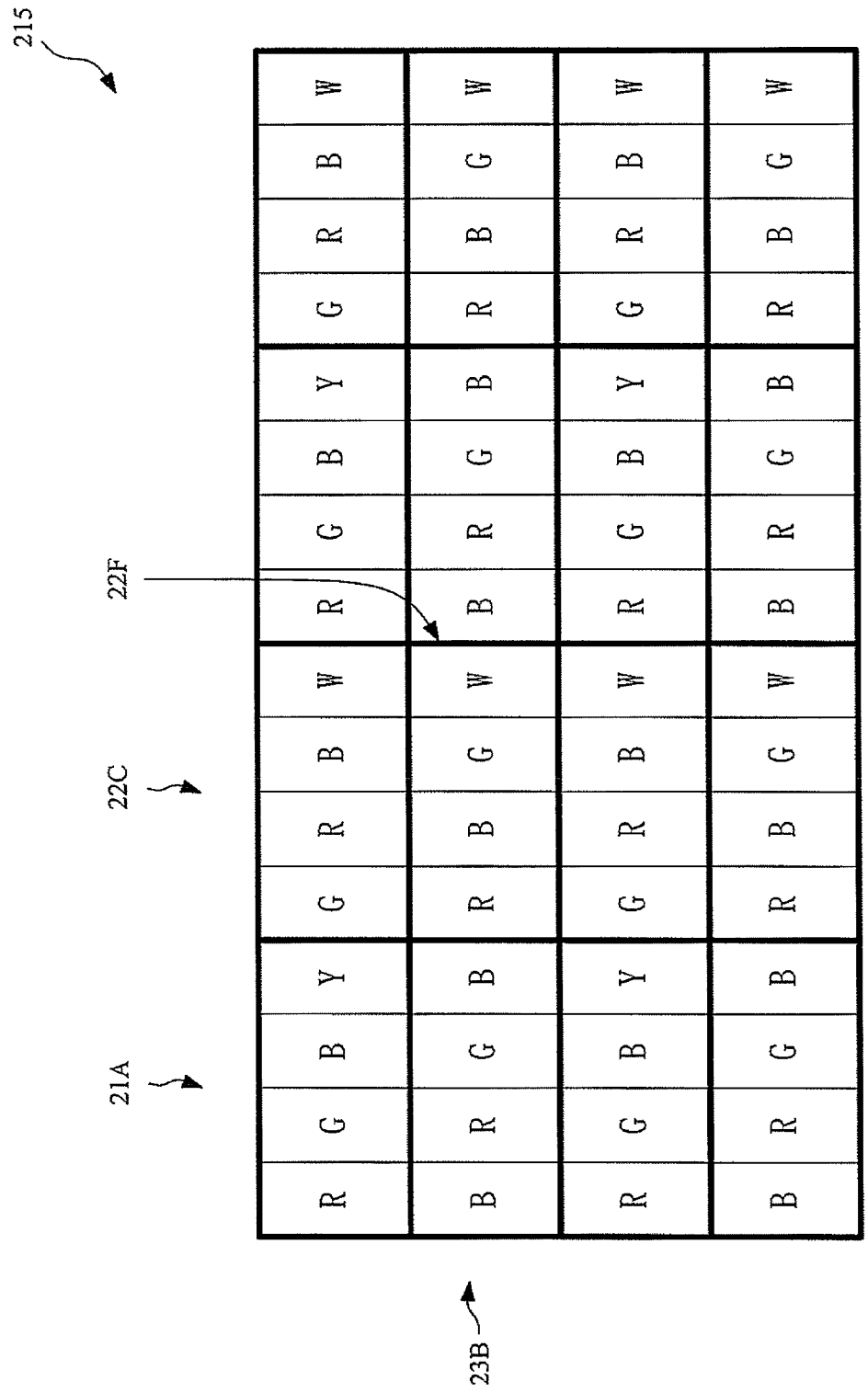
FIG. 15 shows an image device according to an embodiment of the invention.

Referring to FIG. 15, it shows an image device according to an embodiment of the invention. The image device 215 includes a plurality of RGBY pixels 21A, a plurality of RGBW pixels 22C, 22F and a plurality of RBGB pixels 23B. In the RGBW pixel 22C, the sequence of the sub-pixels in the 1×4 matrix from left to right is the green sub-pixel, the red sub-pixel, the blue sub-pixel and the white sub-pixel. In an embodiment, the RGBY pixel 21A is disposed on a first column and first row position of the image device 215, the RGBW pixel 22C is disposed on a second column and first row position of image device 215, the RBGB pixel 23B is disposed on a first column and second row position of the image device 215, and the RGBW pixel 22F is disposed on a second column and second row position of the image device 215.

Figure 16:
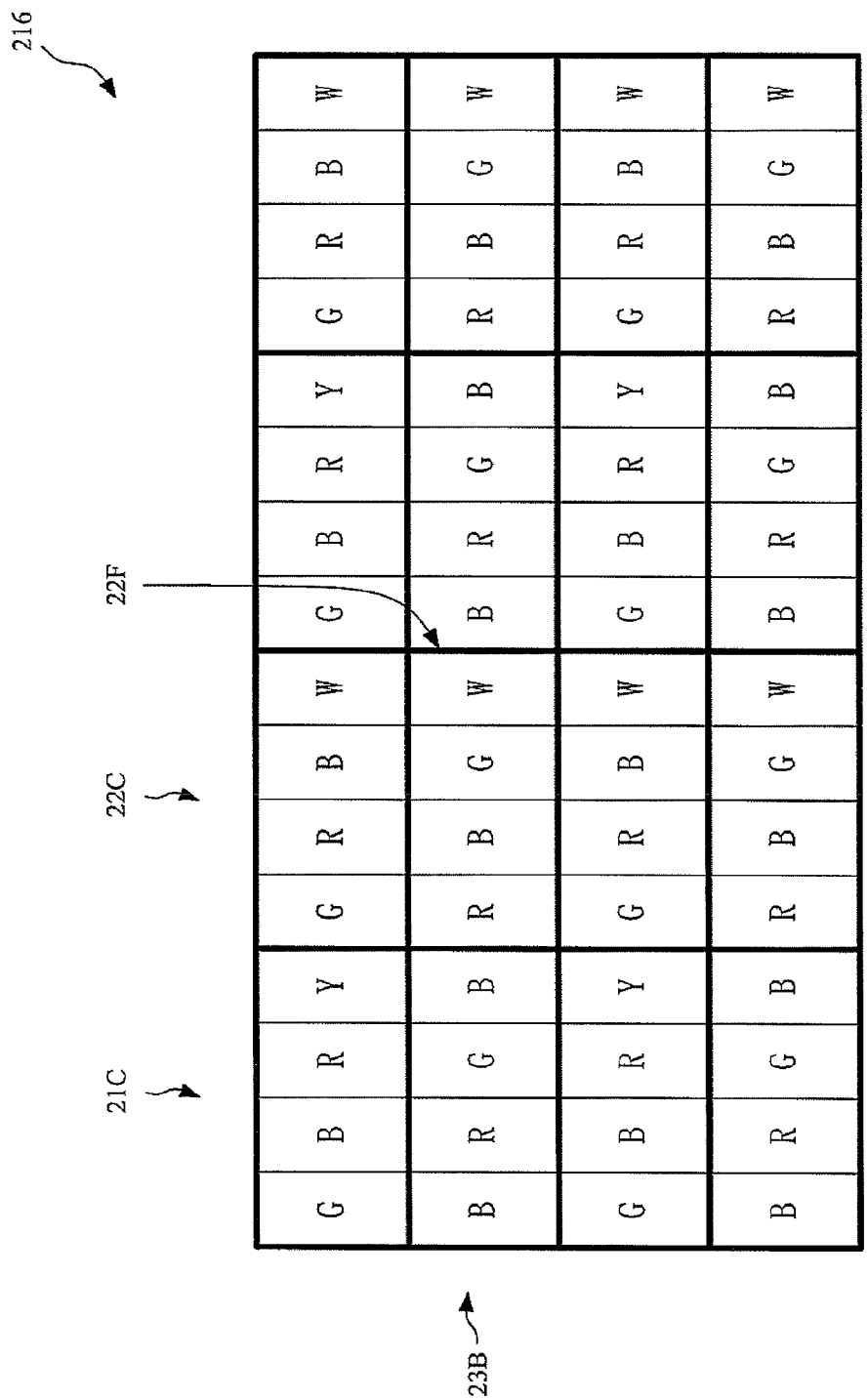
FIG. 16 shows an image device according to an embodiment of the invention.

Referring to FIG. 16, it shows an image device according to an embodiment of the invention. The image device 216 includes a plurality of RGBY pixels 21C, a plurality of RGBW pixels 22C, 22F and a plurality of RBGB pixels 23B. In an embodiment, the RGBY pixel 21C is disposed on a first column and first row position of the image device 216, the RGBW pixel 22C is disposed on a second column and first row position of image device 216, the RBGB pixel 23B is disposed on a first column and second row position of the image device 216, and the RGBW pixel 22F is disposed on a second column and second row position of the image device 216.

Figure 17:
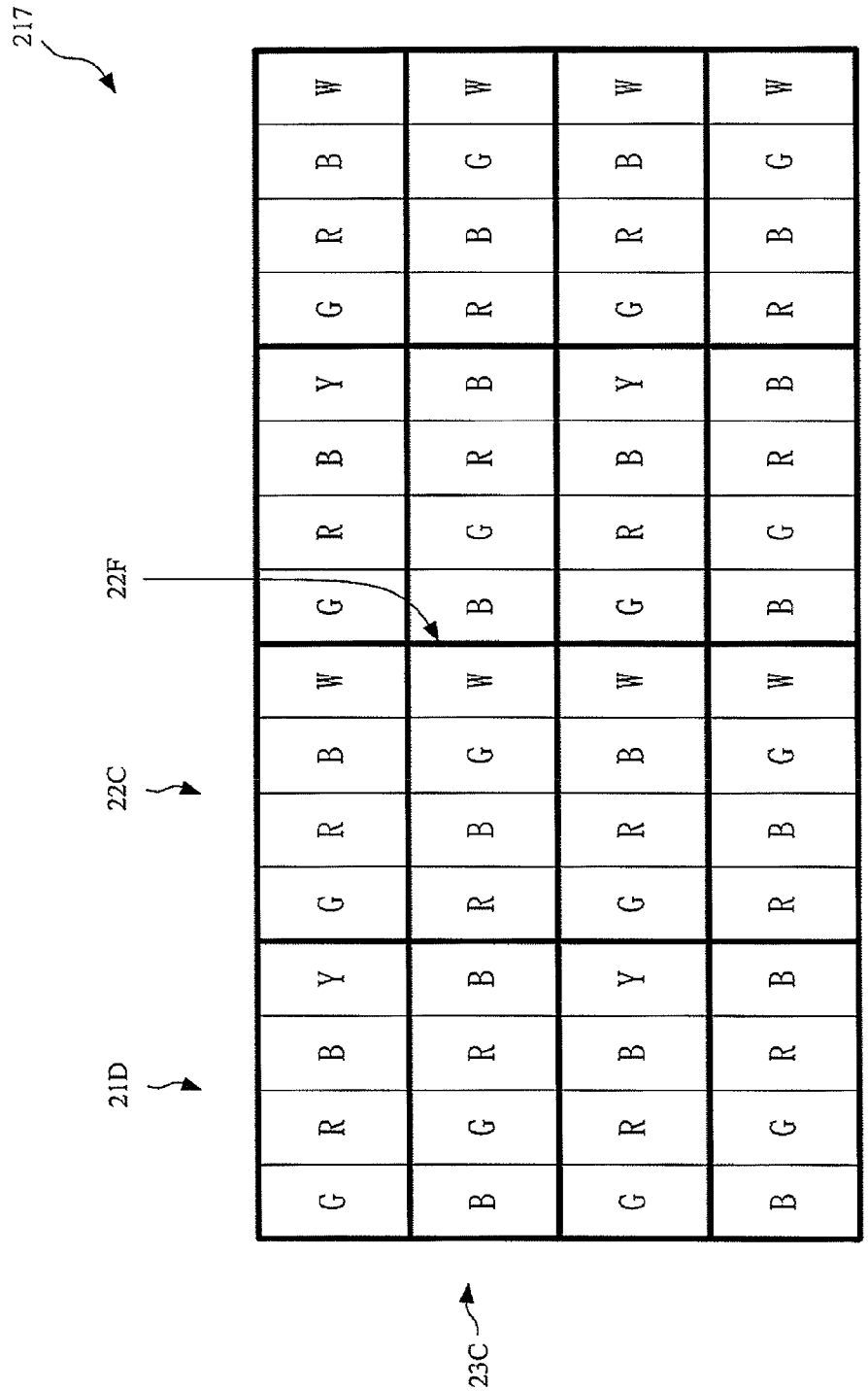
FIG. 17 shows an image device according to an embodiment of the invention.

Referring to FIG. 17, it shows an image device according to an embodiment of the invention. The image device 217 includes a plurality of RGBY pixels 21D, a plurality of RGBW pixels 22C, 22F and a plurality of RBGB pixels 23C. In an embodiment, the RGBY pixel 21D is disposed on a first column and first row position of the image device 217, the RGBW pixel 22C is disposed on a second column and first row position of image device 217, the RBGB pixel 23C is disposed on a first column and second row position of the image device 217, and the RGBW pixel 22F is disposed on a second column and second row position of the image device 217.

Figure 18:
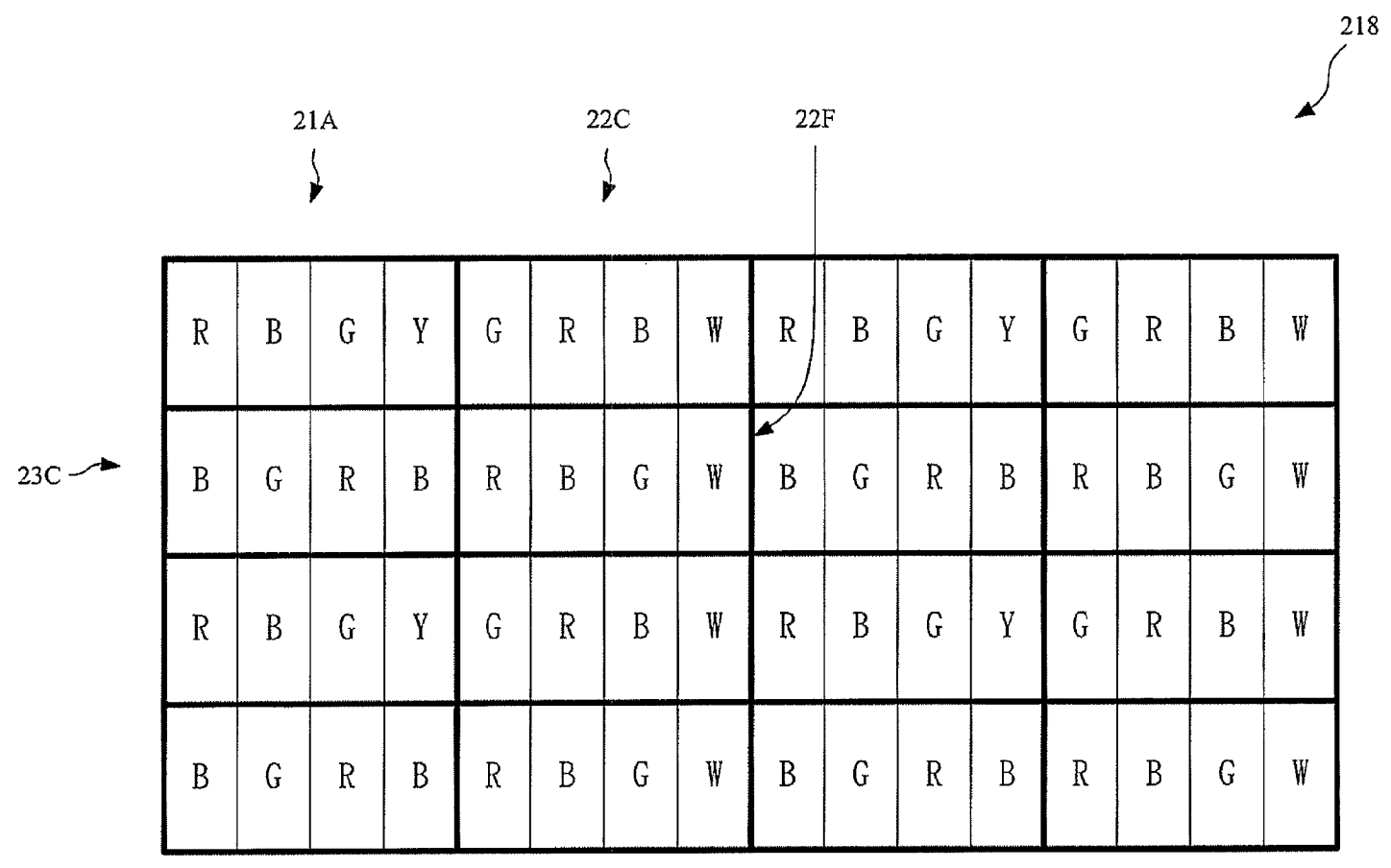

Referring to FIG. 18, it shows an image device according to an embodiment of the invention. The image device 218 includes a plurality of RGBY pixels 21A, a plurality of RGBW pixels 22C, 22F and a plurality of RBGB pixels 23C. In an embodiment, the RGBY pixel 21A is disposed on a first column and first row position of the image device 218, the RGBW pixel 22C is disposed on a second column and first row position of image device 218, the RBGB pixel 23C is disposed on a first column and second row position of the image device 218, and the RGBW pixel 22F is disposed on a second column and second row position of the image device 218.

Figure 19:
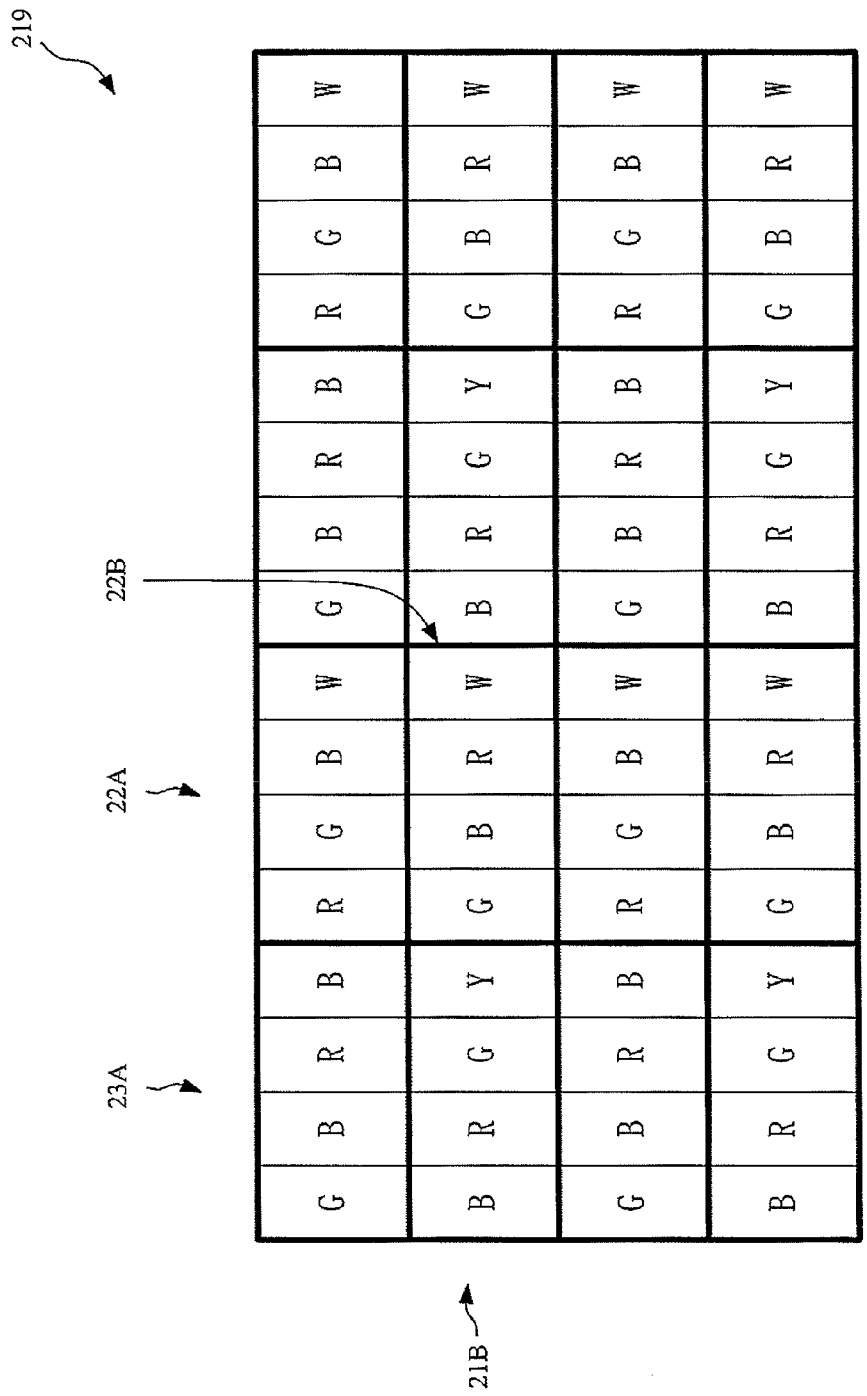
FIG. 19 shows an image device according to an embodiment of the invention.

Referring to FIG. 19, it shows an image device according to an embodiment of the invention. The image device 219 includes a plurality of RGBY pixels 21B, a plurality of RGBW pixels 22A, 22B and a plurality of RBGB pixels 23A. In an embodiment, the RBGB pixel 23A is disposed on a first column and first row position of the image device 219, the RGBW pixel 22A is disposed on a second column and first row position of image device 219, the RGBY pixel 21B is disposed on a first column and second row position of the image device 219, and the RGBW pixel 22B is disposed on a second column and second row position of the image device 219.

Figure 20:
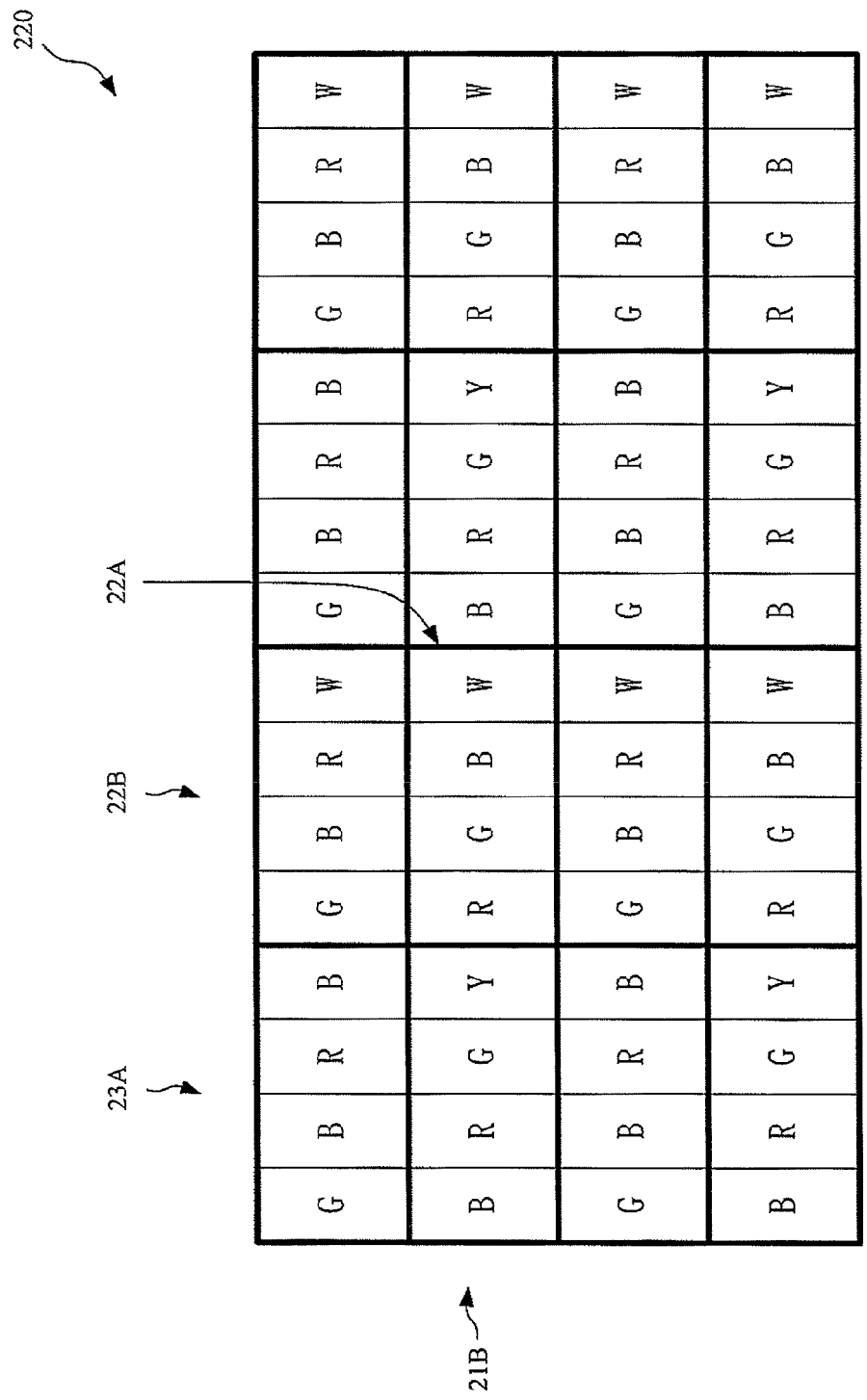
FIG. 20 shows an image device according to an embodiment of the invention.

Referring to FIG. 20, it shows an image device according to an embodiment of the invention. The image device 220 includes a plurality of RGBY pixels 21B, a plurality of RGBW pixels 22A, 22B and a plurality of RBGB pixels 23A. In an embodiment, the RBGB pixel 23A is disposed on a first column and first row position of the image device 220, the RGBW pixel 22B is disposed on a second column and first row position of image device 220, the RGBY pixel 21B is disposed on a first column and second row position of the image device 220, and the RGBW pixel 22A is disposed on a second column and second row position of the image device 220.

Figure 21:
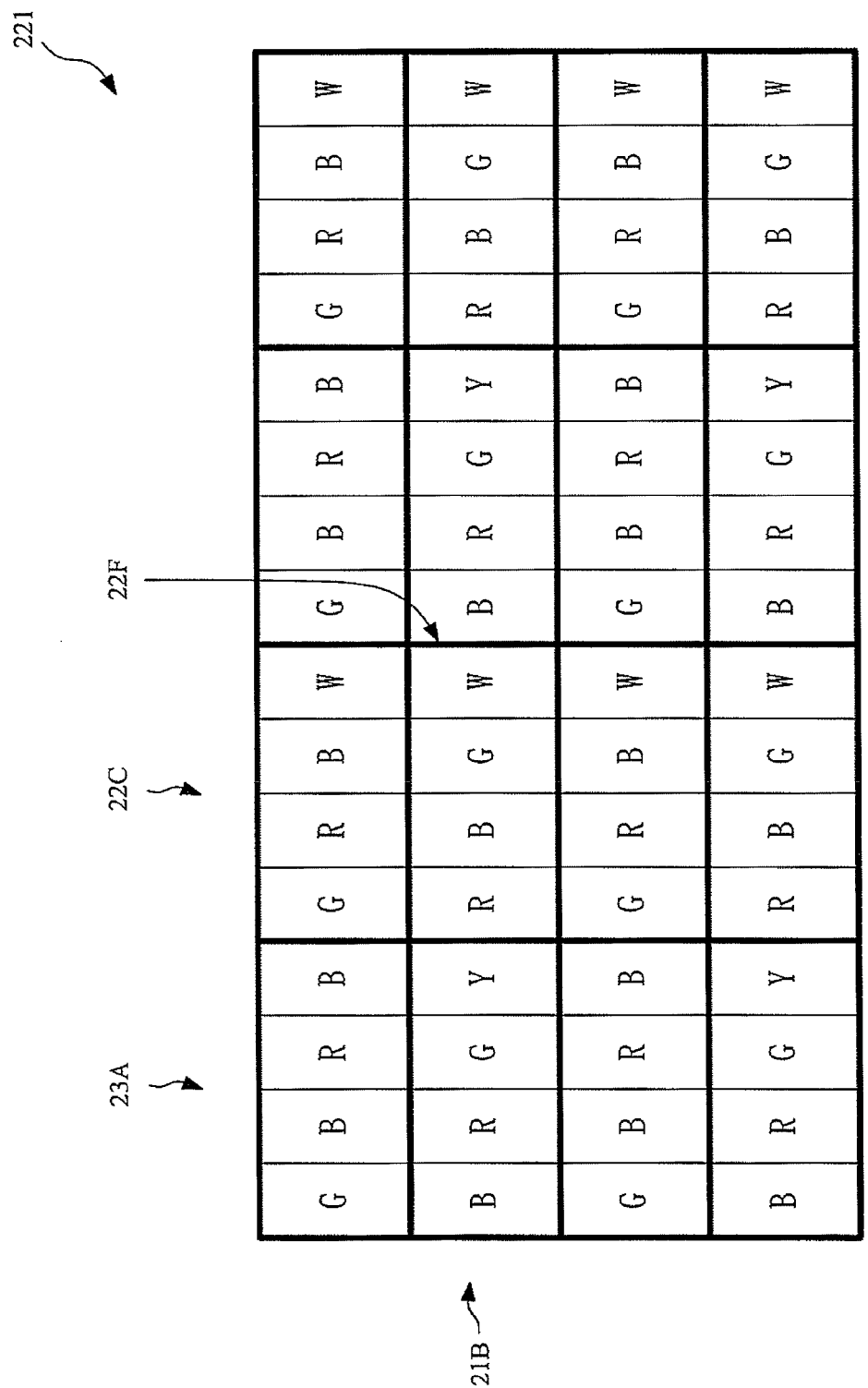
FIG. 21 shows an image device according to an embodiment of the invention.

Referring to FIG. 21, it shows an image device according to an embodiment of the invention. The image device 221 includes a plurality of RGBY pixels 21B, a plurality of RGBW pixels 22C, 22F and a plurality of RBGB pixels 23A. In an embodiment, the RBGB pixel 23A is disposed on a first column and first row position of the image device 221, the RGBW pixel 22C is disposed on a second column and first row position of image device 221, the RGBY pixel 21B is disposed on a first column and second row position of the image device 221, and the RGBW pixel 22F is disposed on a second column and second row position of the image device 221.

Figure 22:
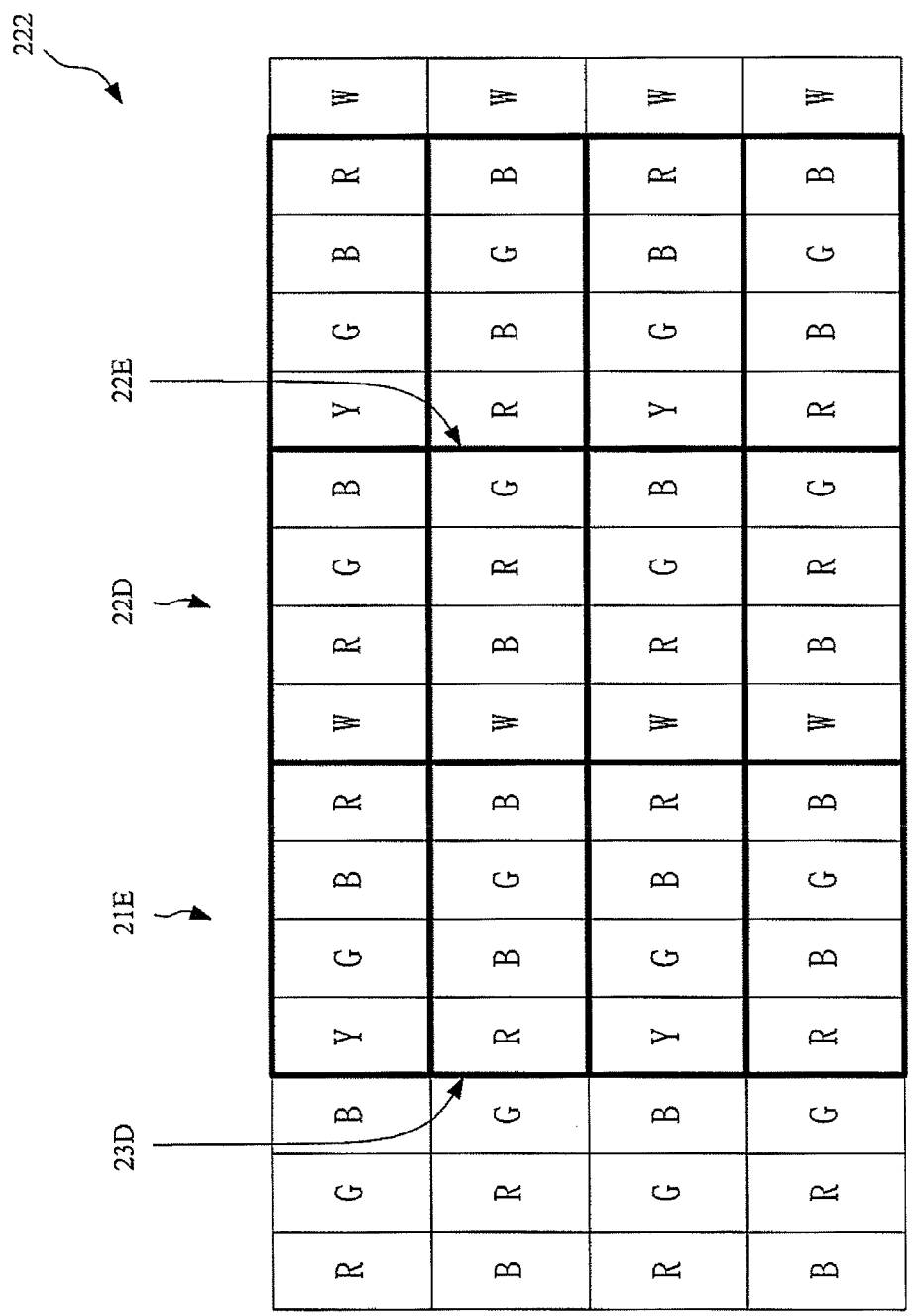
FIG. 22 shows an image device according to an embodiment of the invention.

Referring to FIG. 22, it shows an image device according to an embodiment of the invention. The image device 222 includes a plurality of RGBY pixels 21E, a plurality of RGBW pixels 22D, 22E and a plurality of RBGB pixels 23D. In the RGBY pixel 21E, the sequence of the sub-pixels in the 1×4 matrix from left to right is the yellow sub-pixel, the green sub-pixel, the blue sub-pixel and the red sub-pixel. In the RGBW pixel 22D, the sequence of the sub-pixels in the 1×4 matrix from left to right is the white sub-pixel, the red sub-pixel, the green sub-pixel and the blue sub-pixel. In the RGBW pixel 22E, the sequence of the sub-pixels in the 1×4 matrix from left to right is the white sub-pixel, the blue sub-pixel, the red sub-pixel and the green sub-pixel. In the RBGB pixel 23D, the sequence of the sub-pixels in the 1×4 matrix from left to right is the red sub-pixel, the blue sub-pixel, the green sub-pixel and the blue sub-pixel. In an embodiment, the RGBY pixel 21E is disposed on a first column and first row position of the image device 222, the RGBW pixel 22D is disposed on a second column and first row position of image device 222, the RBGB pixel 23D is disposed on a first column and second row position of the image device 222, and the RGBW pixel 22E is disposed on a second column and second row position of the image device 222. Further, on the first row, three sub-pixels (the red sub-pixel, the green sub-pixel and the blue sub-pixel) are added to the left of the RGBY pixel 21E. On the second row, three sub-pixels (the blue sub-pixel, the red sub-pixel and the green sub-pixel) are added to the left of the RBGB pixel 23D.

Figure 23:
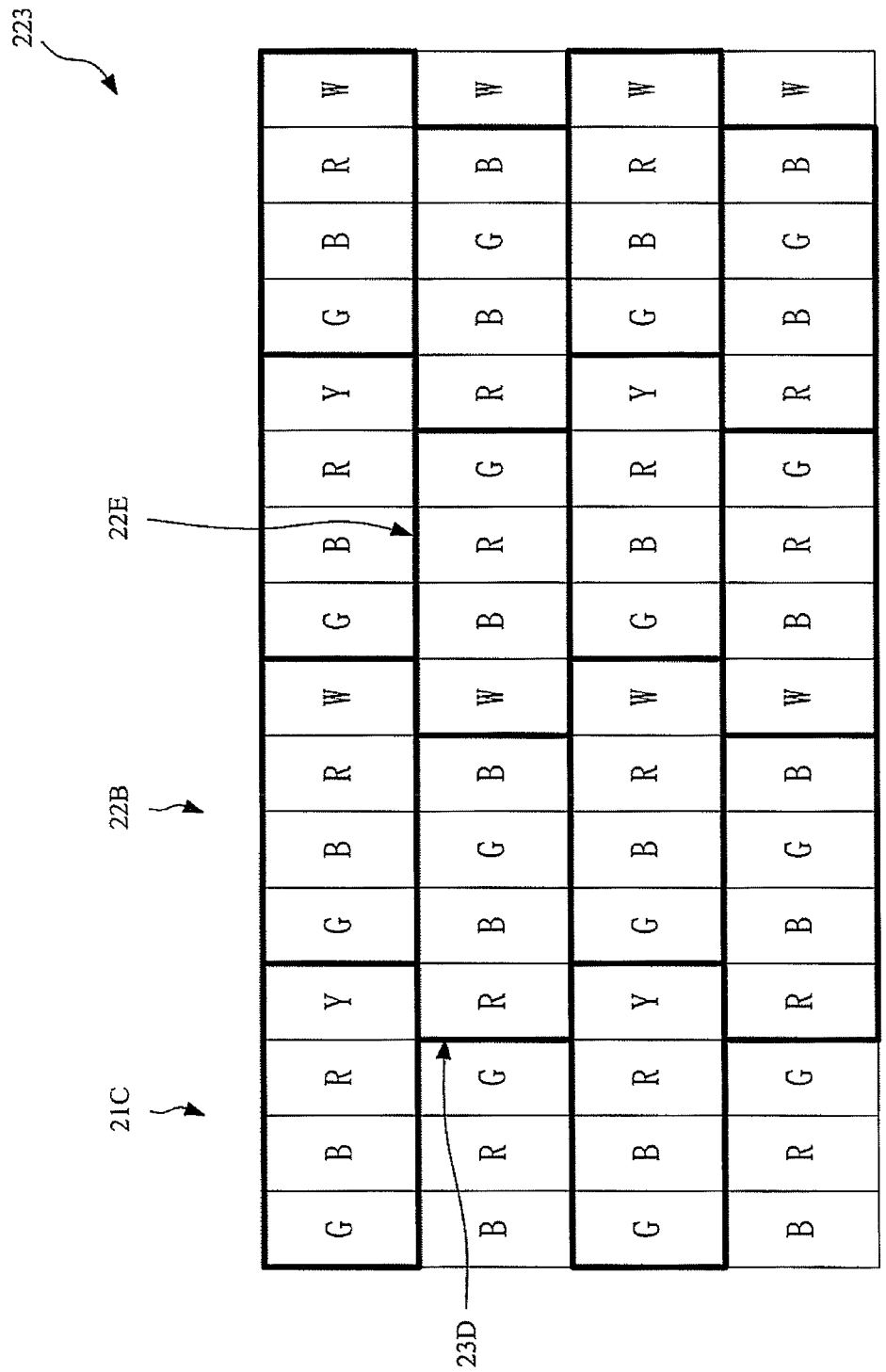
FIG. 23 shows an image device according to an embodiment of the invention.

Referring to FIG. 23, it shows an image device according to an embodiment of the invention. The image device 223 includes a plurality of RGBY pixels 21C, a plurality of RGBW pixels 22B, 22E and a plurality of RBGB pixels 23D. In an embodiment, the RGBY pixel 21C is disposed on a first column and first row position of the image device 223, the RGBW pixel 22B is disposed on a second column and first row position of image device 223, the RBGB pixel 23D is disposed on a first column and second row position of the image device 223, and the RGBW pixel 22E is disposed on a second column and second row position of the image device 223. On the second row, three sub-pixels (the blue sub-pixel, the red sub-pixel and the green sub-pixel) are added to the left of the RBGB pixel 23D.

Figure 24:
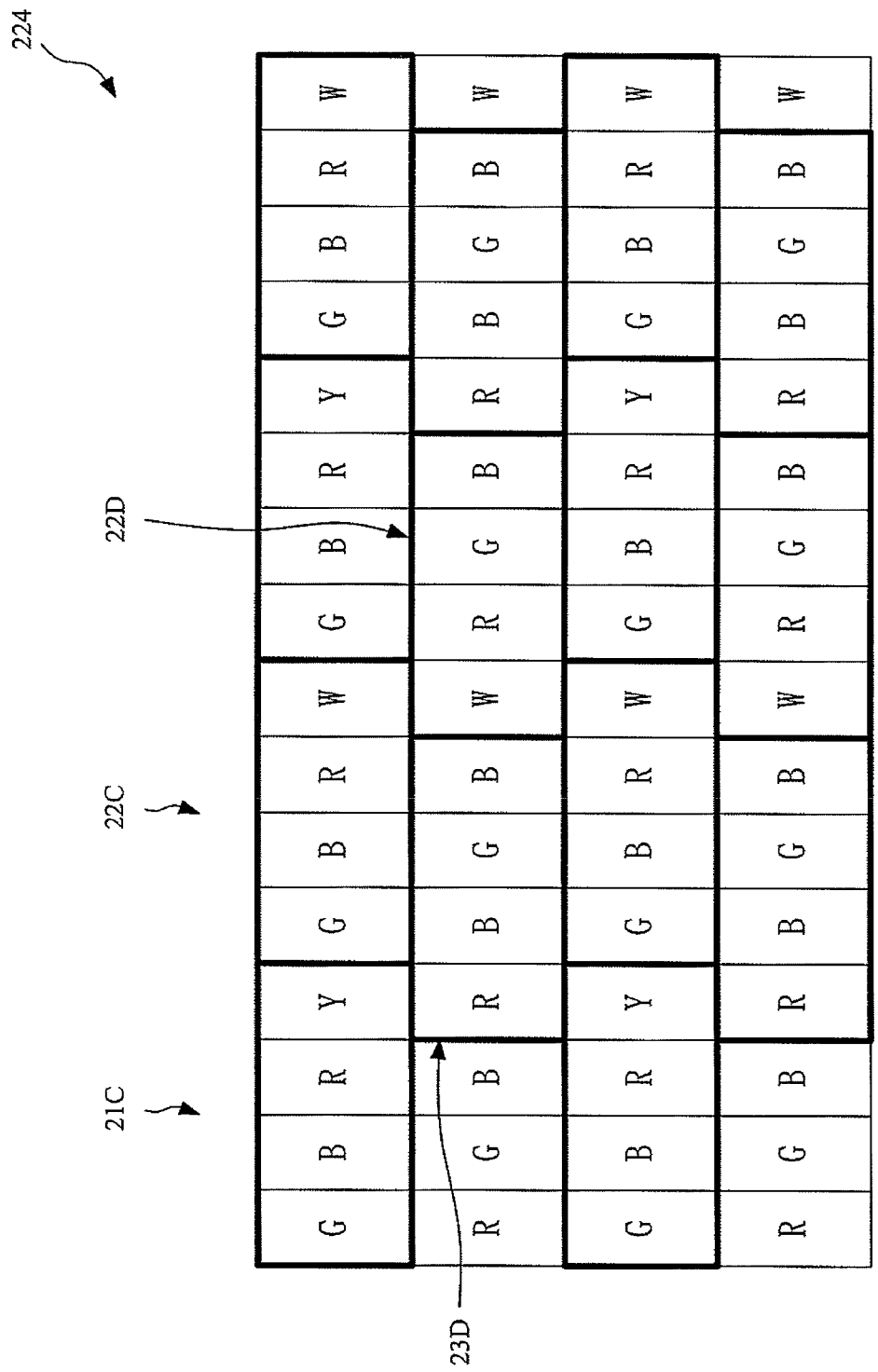
FIG. 24 shows an image device according to an embodiment of the invention.

Referring to FIG. 24, it shows an image device according to an embodiment of the invention. The image device 224 includes a plurality of RGBY pixels 21C, a plurality of RGBW pixels 22C, 22D and a plurality of RBGB pixels 23D. In an embodiment, the RGBY pixel 21C is disposed on a first column and first row position of the image device 224, the RGBW pixel 22C is disposed on a second column and first row position of image device 224, the RBGB pixel 23D is disposed on a first column and second row position of the image device 224, and the RGBW pixel 22D is disposed on a second column and second row position of the image device 224. On the second row, three sub-pixels (the red sub-pixel, the green sub-pixel and the blue sub-pixel) are added to the left of the RBGB pixel 23D.

Figure 25:
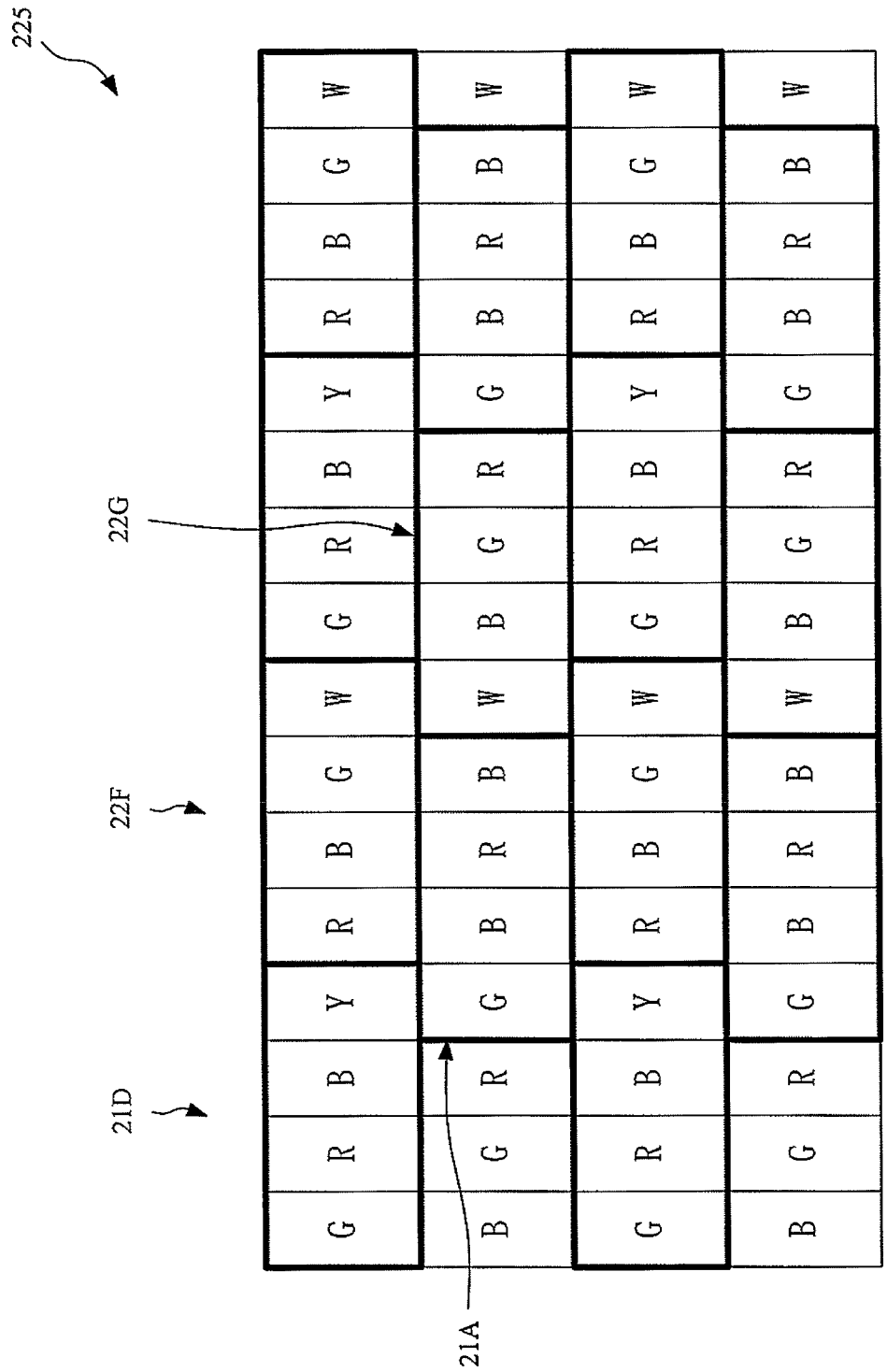
FIG. 25 shows an image device according to an embodiment of the invention.

Referring to FIG. 25, it shows an image device according to an embodiment of the invention. The image device 225 includes a plurality of RGBY pixels 21D, a plurality of RGBW pixels 22F, 22G and a plurality of RBGB pixels 23A. In the RGBW pixel 22G, the sequence of the sub-pixels in the 1×4 matrix from left to right is the white sub-pixel, the blue sub-pixel, the green sub-pixel and the red sub-pixel. In an embodiment, the RGBY pixel 21D is disposed on a first column and first row position of the image device 225, the RGBW pixel 22F is disposed on a second column and first row position of image device 225, the RBGB pixel 23A is disposed on a first column and second row position of the image device 225, and the RGBW pixel 22G is disposed on a second column and second row position of the image device 225. On the second row, three sub-pixels (the blue sub-pixel, the green sub-pixel and the red sub-pixel) are added to the left of the RBGB pixel 23A.

Figure 26:
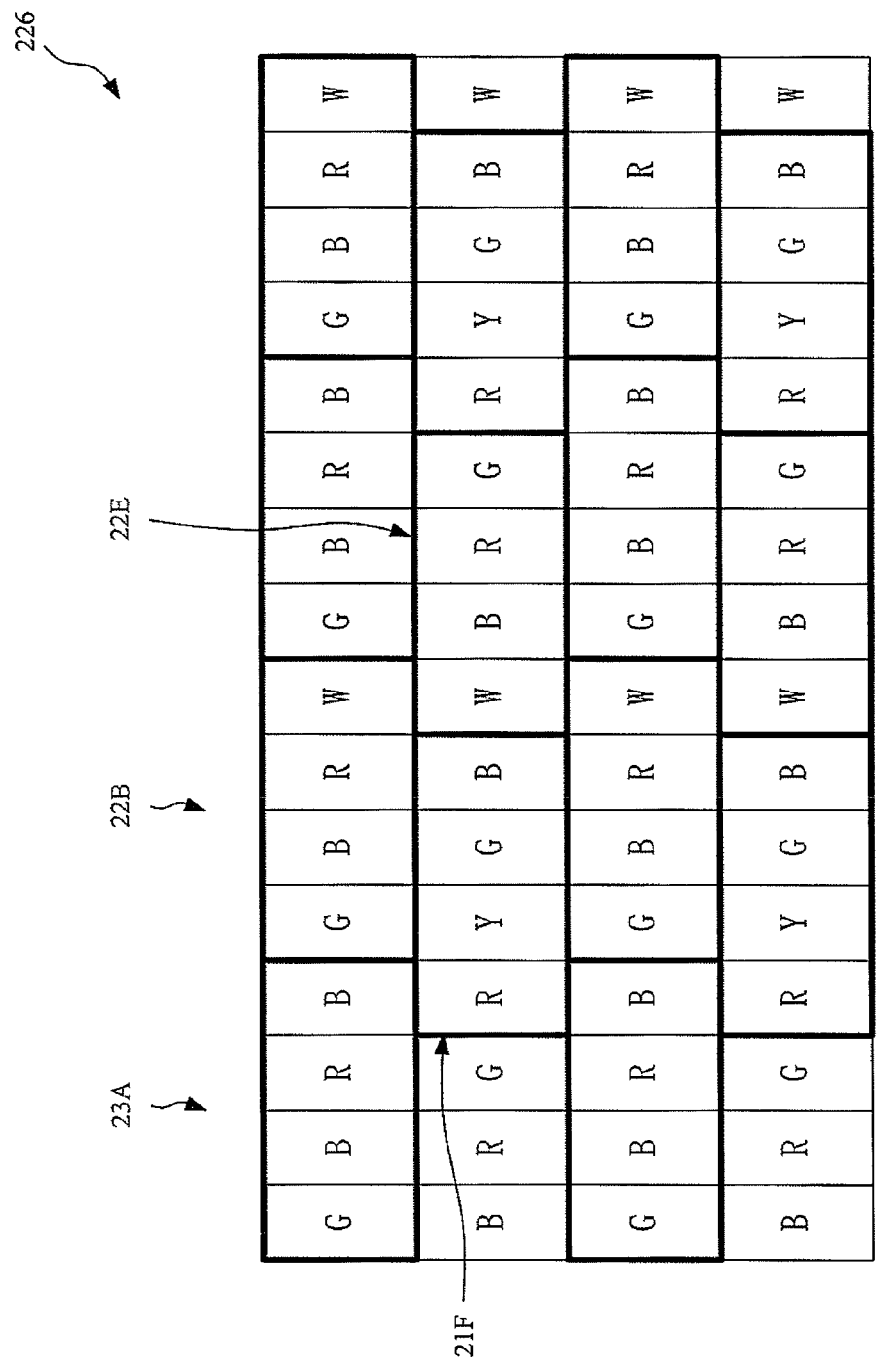
FIG. 26 shows an image device according to an embodiment of the invention.

Referring to FIG. 26, it shows an image device according to an embodiment of the invention. The image device 226 includes a plurality of RGBY pixels 21F, a plurality of RGBW pixels 22B, 22E and a plurality of RBGB pixels 23A. In the RGBY pixel 21F, the sequence of the sub-pixels in the 1×4 matrix from left to right is the red sub-pixel, the yellow sub-pixel, the green sub-pixel and the blue sub-pixel. In an embodiment, the RBGB pixel 23A is disposed on a first column and first row position of the image device 226, the RGBW pixel 22B is disposed on a second column and first row position of image device 226, the RGBY pixel 21F is disposed on a first column and second row position of the image device 226, and the RGBW pixel 22E is disposed on a second column and second row position of the image device 226. On the second row, three sub-pixels (the blue sub-pixel, the red sub-pixel and the green sub-pixel) are added to the left of the RGBY pixel 21F.

Figure 27:
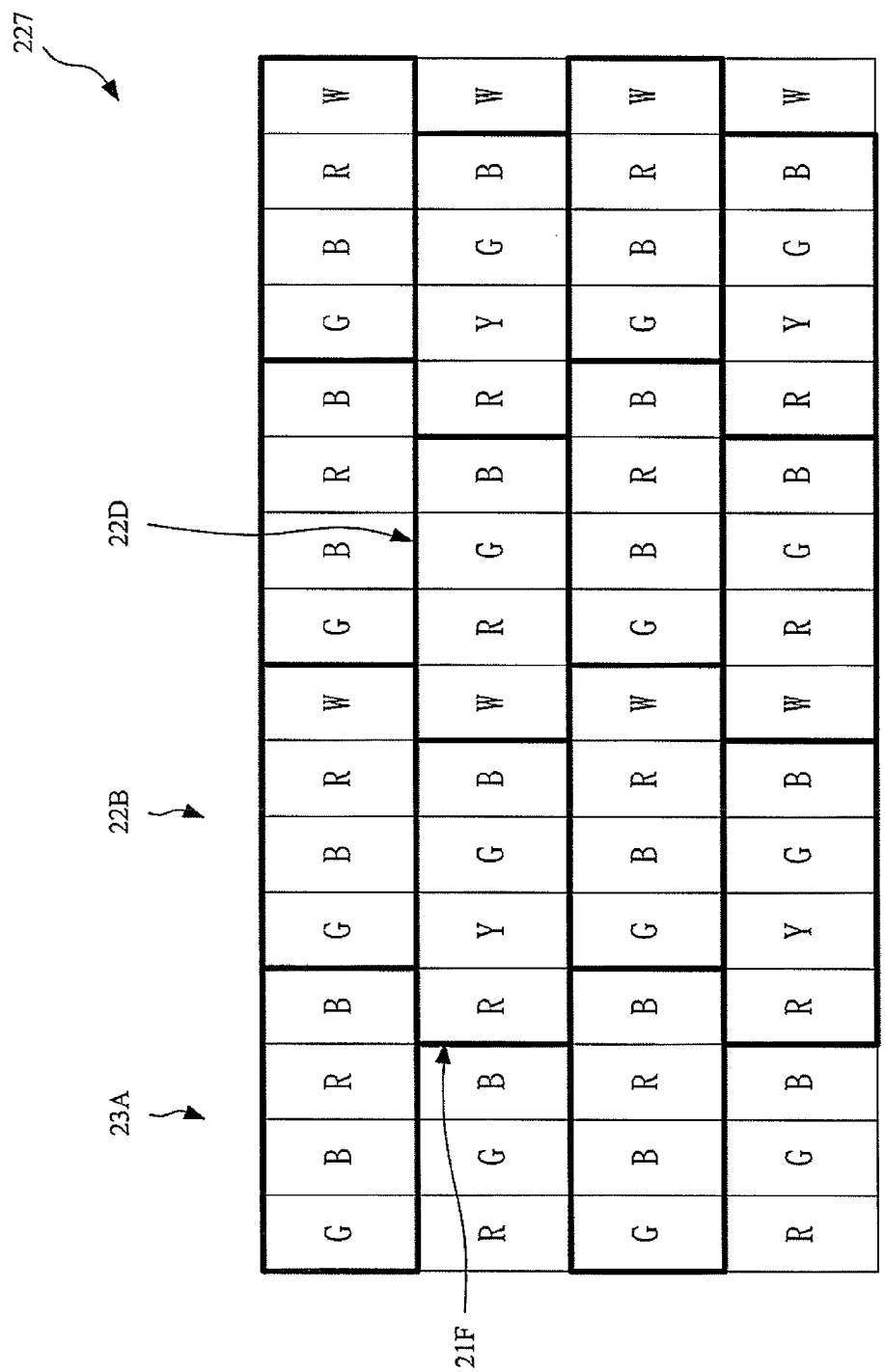
FIG. 27 shows an image device according to an embodiment of the invention.

Referring to FIG. 27, it shows an image device according to an embodiment of the invention. The image device 227 includes a plurality of RGBY pixels 21F, a plurality of RGBW pixels 22B, 22D and a plurality of RBGB pixels 23A. In an embodiment, the RBGB pixel 23A is disposed on a first column and first row position of the image device 227, the RGBW pixel 22B is disposed on a second column and first row position of image device 227, the RGBY pixel 21F is disposed on a first column and second row position of the image device 227, and the RGBW pixel 22D is disposed on a second column and second row position of the image device 227. On the second row, three sub-pixels (the red sub-pixel, the green sub-pixel and the blue sub-pixel) are added to the left of the RGBY pixel 21F.

Figure 28:
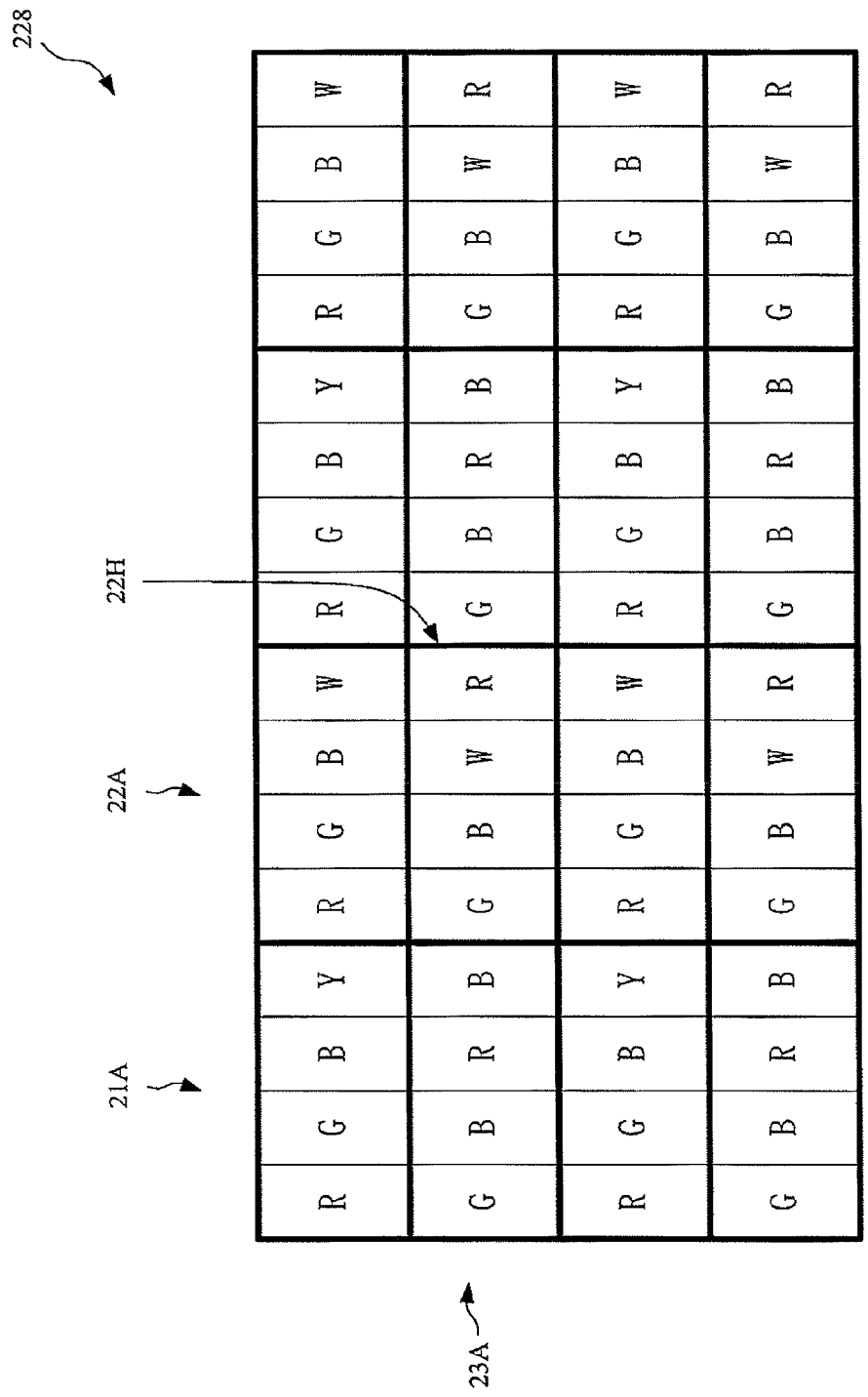
FIG. 28 shows an image device according to an embodiment of the invention.

Referring to FIG. 28, it shows an image device according to an embodiment of the invention. The image device 228 includes a plurality of RGBY pixels 21A, a plurality of RGBW pixels 22A, 22H and a plurality of RBGB pixels 23A. In the RGBW pixel 22H, the sequence of the sub-pixels in the 1×4 matrix from left to right is the green sub-pixel, the blue sub-pixel, the white sub-pixel and the red sub-pixel. In an embodiment, the RGBY pixel 21A is disposed on a first column and first row position of the image device 228, the RGBW pixel 22A is disposed on a second column and first row position of image device 228, the RBGB pixel 23A is disposed on a first column and second row position of the image device 228, and the RGBW pixel 22H is disposed on a second column and second row position of the image device 228.

Figure 29:
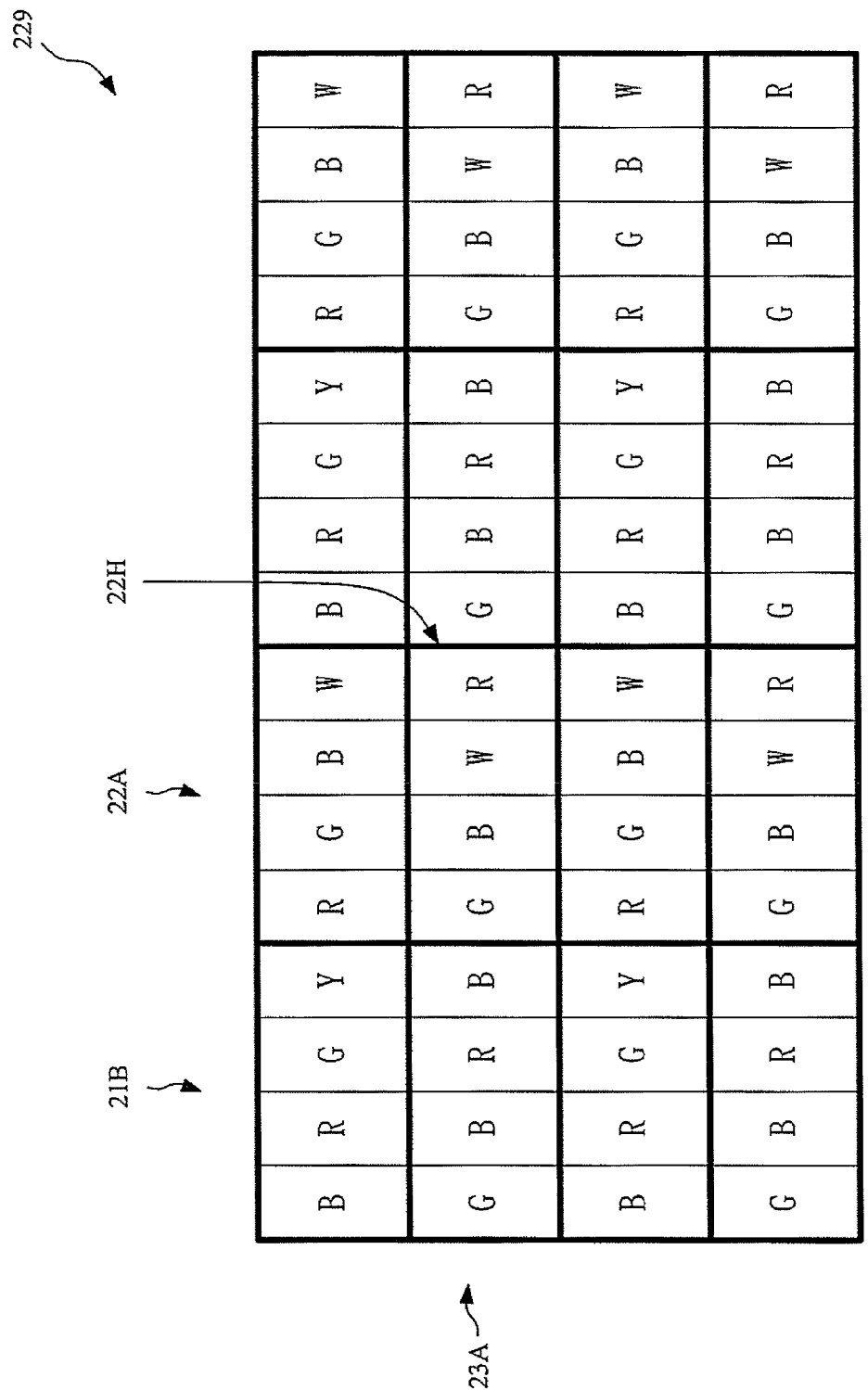
FIG. 29 shows an image device according to an embodiment of the invention.

Referring to FIG. 29, it shows an image device according to an embodiment of the invention. The image device 229 includes a plurality of RGBY pixels 21B, a plurality of RGBW pixels 22A, 22H and a plurality of RBGB pixels 23A. In an embodiment, the RGBY pixel 21B is disposed on a first column and first row position of the image device 229, the RGBW pixel 22A is disposed on a second column and first row position of image device 229, the RBGB pixel 23A is disposed on a first column and second row position of the image device 229, and the RGBW pixel 22H is disposed on a second column and second row position of the image device 229.

Figure 30:
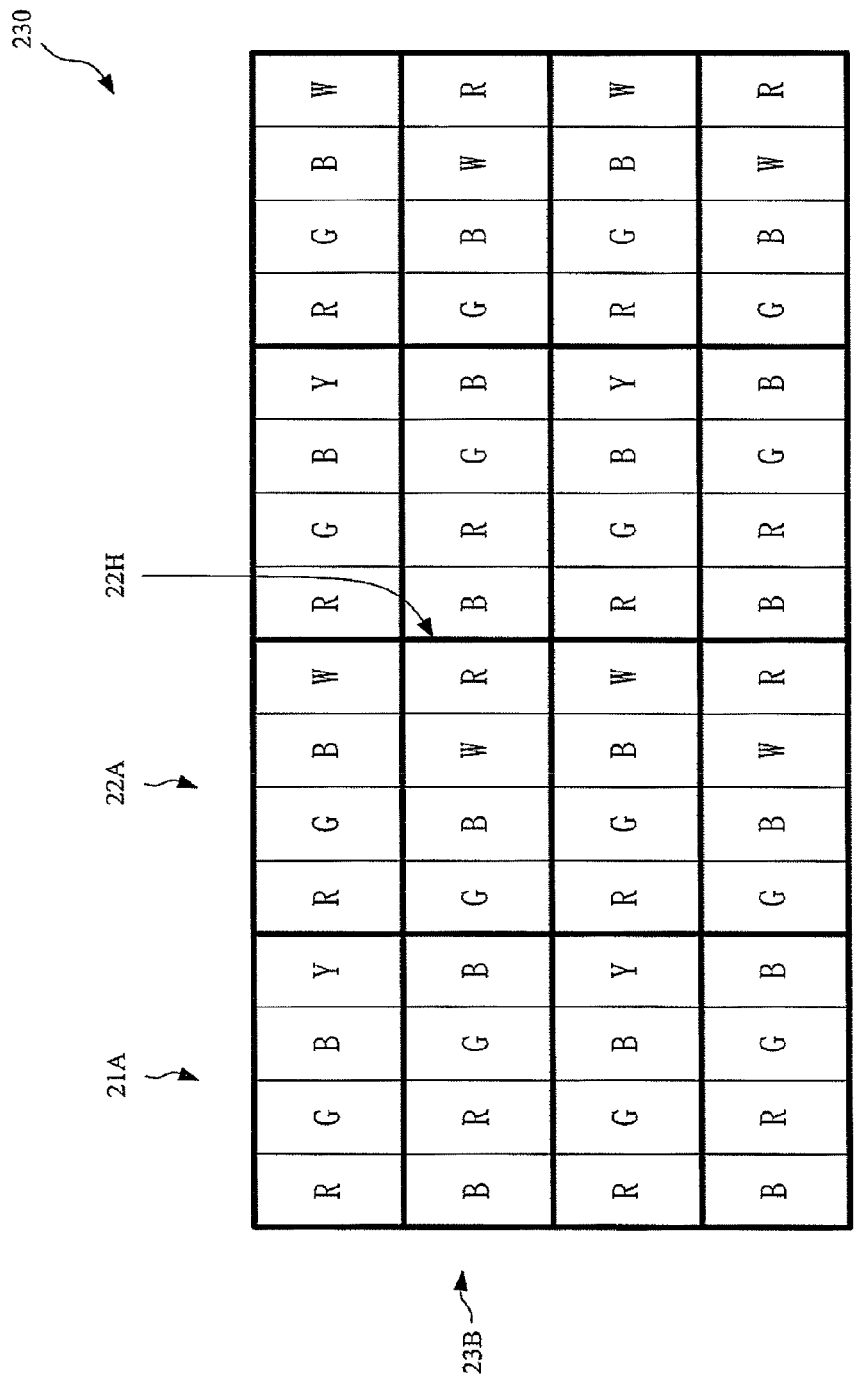
FIG. 30 shows an image device according to an embodiment of the invention.

Referring to FIG. 30, it shows an image device according to an embodiment of the invention. The image device 230 includes a plurality of RGBY pixels 21A, a plurality of RGBW pixels 22A, 22H and a plurality of RBGB pixels 23B. In an embodiment, the RGBY pixel 21A is disposed on a first column and first row position of the image device 230, the RGBW pixel 22A is disposed on a second column and first row position of image device 230, the RBGB pixel 23B is disposed on a first column and second row position of the image device 230, and the RGBW pixel 2214 is disposed on a second column and second row position of the image device 230.

Figure 31:
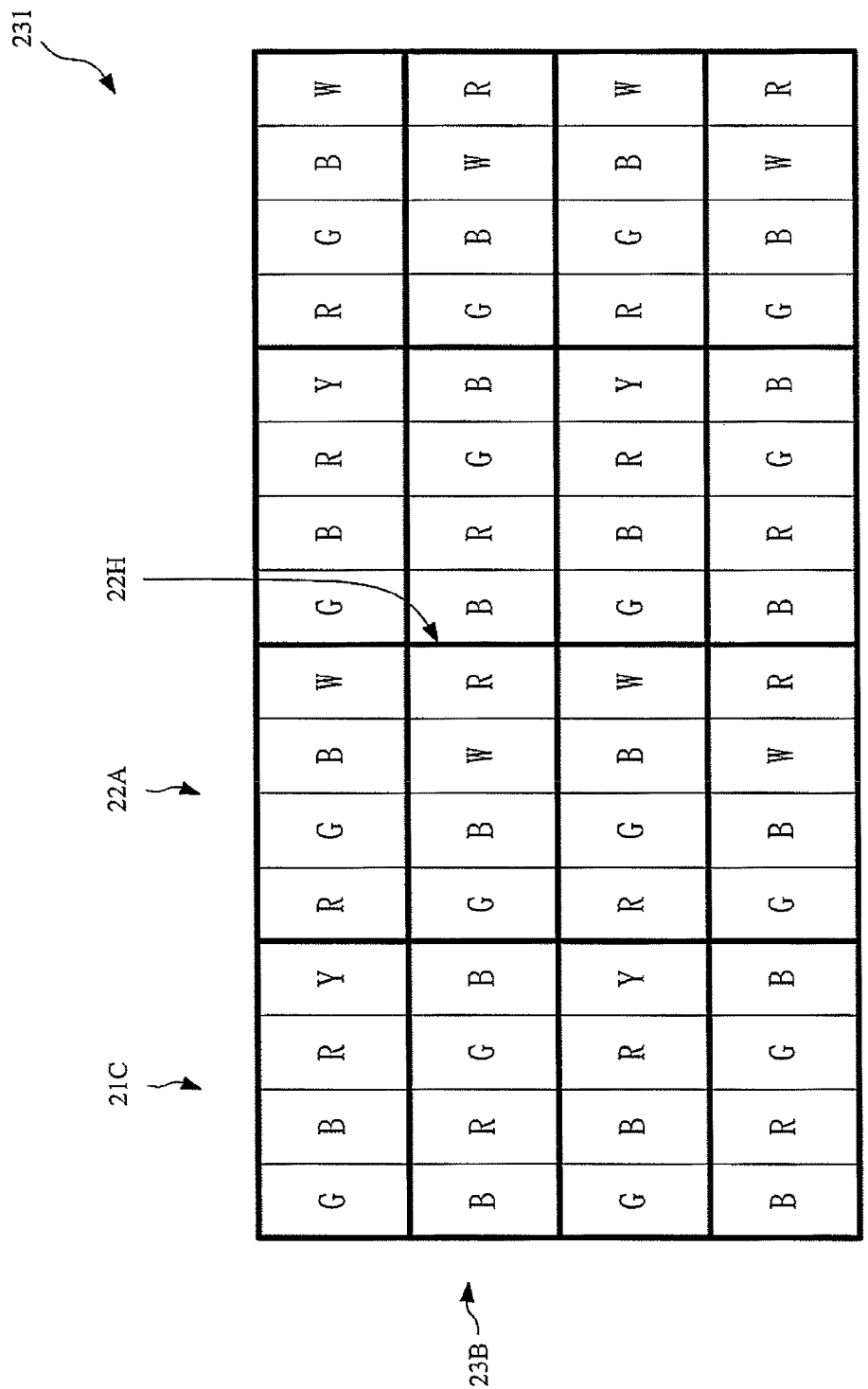
FIG. 31 shows an image device according to an embodiment of the invention.

Referring to FIG. 31, it shows an image device according to an embodiment of the invention. The image device 231 includes a plurality of RGBY pixels 21C, a plurality of RGBW pixels 22A, 22H and a plurality of RBGB pixels 23B. In an embodiment, the RGBY pixel 21C is disposed on a first column and first row position of the image device 231, the RGBW pixel 22A is disposed on a second column and first row position of image device 231, the RBGB pixel 23B is disposed on a first column and second row position of the image device 231, and the RGBW pixel 22H is disposed on a second column and second row position of the image device 231.

Figure 32:
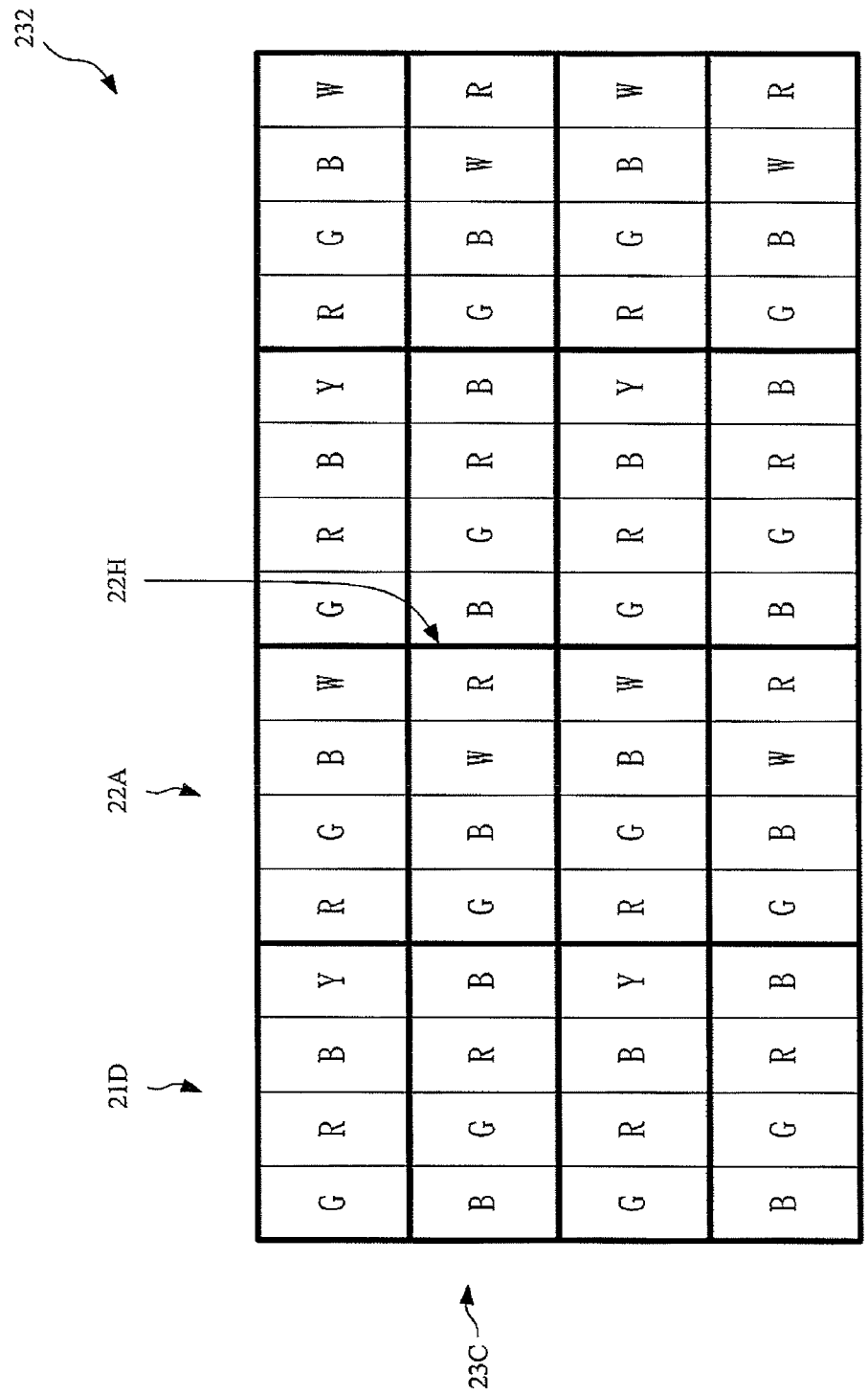
FIG. 32 shows an image device according to an embodiment of the invention.

Referring to FIG. 32, it shows an image device according to an embodiment of the invention. The image device 232 includes a plurality of RGBY pixels 21D, a plurality of RGBW pixels 22A, 22H and a plurality of RBGB pixels 23C. In an embodiment, the RGBY pixel 21D is disposed on a first column and first row position of the image device 232, the RGBW pixel 22A is disposed on a second column and first row position of image device 232, the RBGB pixel 23C is disposed on a first column and second row position of the image device 232, and the RGBW pixel 22H is disposed on a second column and second row position of the image device 232.

Figure 33:
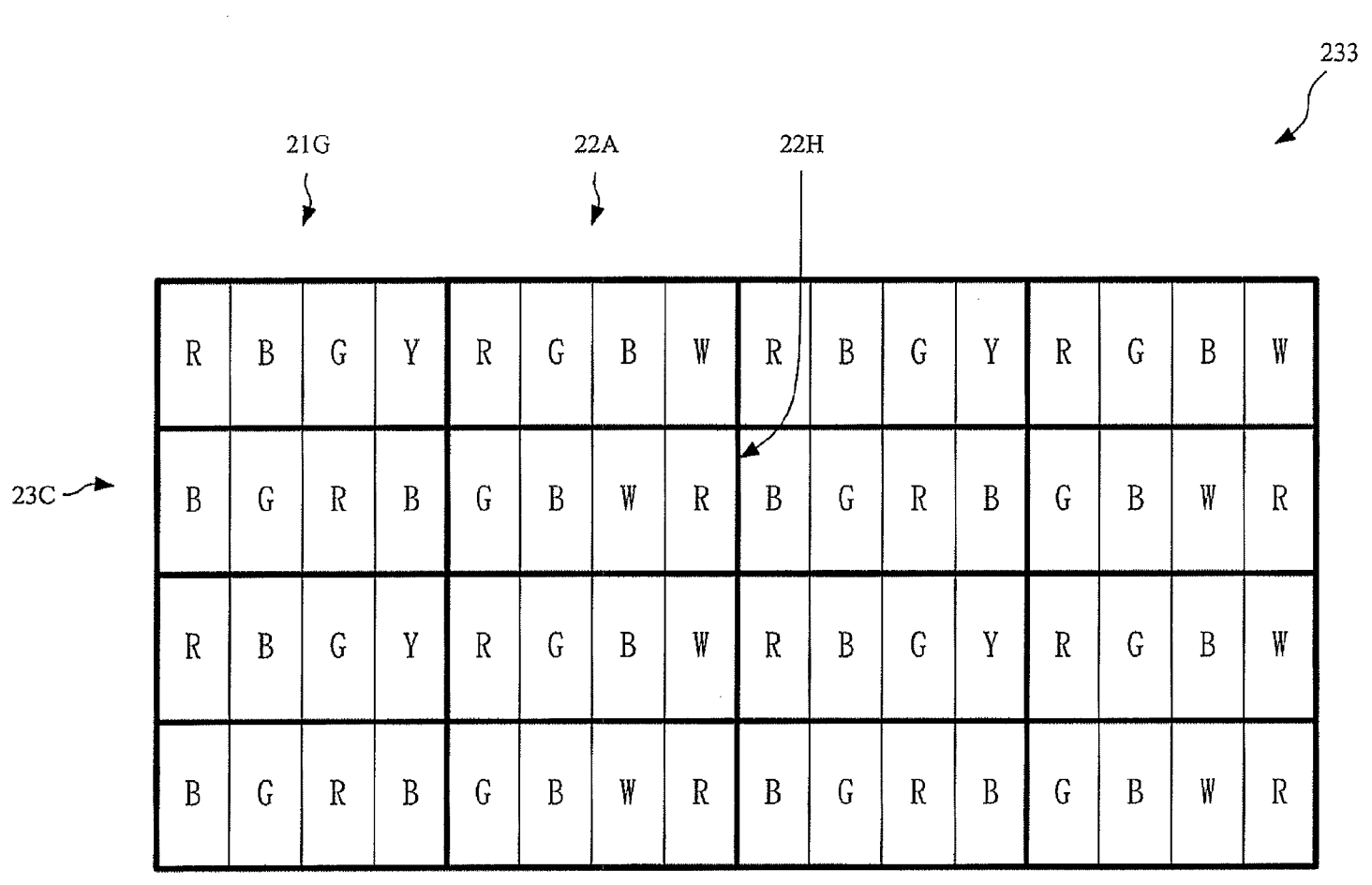

Referring to FIG. 33, it shows an image device according to an embodiment of the invention. The image device 233 includes a plurality of RGBY pixels 21G, a plurality of RGBW pixels 22A, 22H and a plurality of RBGB pixels 23C. In the RGBY pixel 21G, the sequence of the sub-pixels in the 1×4 matrix from left to right is the red sub-pixel, the blue sub-pixel, the green sub-pixel and the yellow sub-pixel. In an embodiment, the RGBY pixel 21G is disposed on a first column and first row position of the image device 233, the RGBW pixel 22A is disposed on a second column and first row position of image device 233, the RBGB pixel 23C is disposed on a first column and second row position of the image device 233, and the RGBW pixel 22H is disposed on a second column and second row position of the image device 233.

Figure 34:
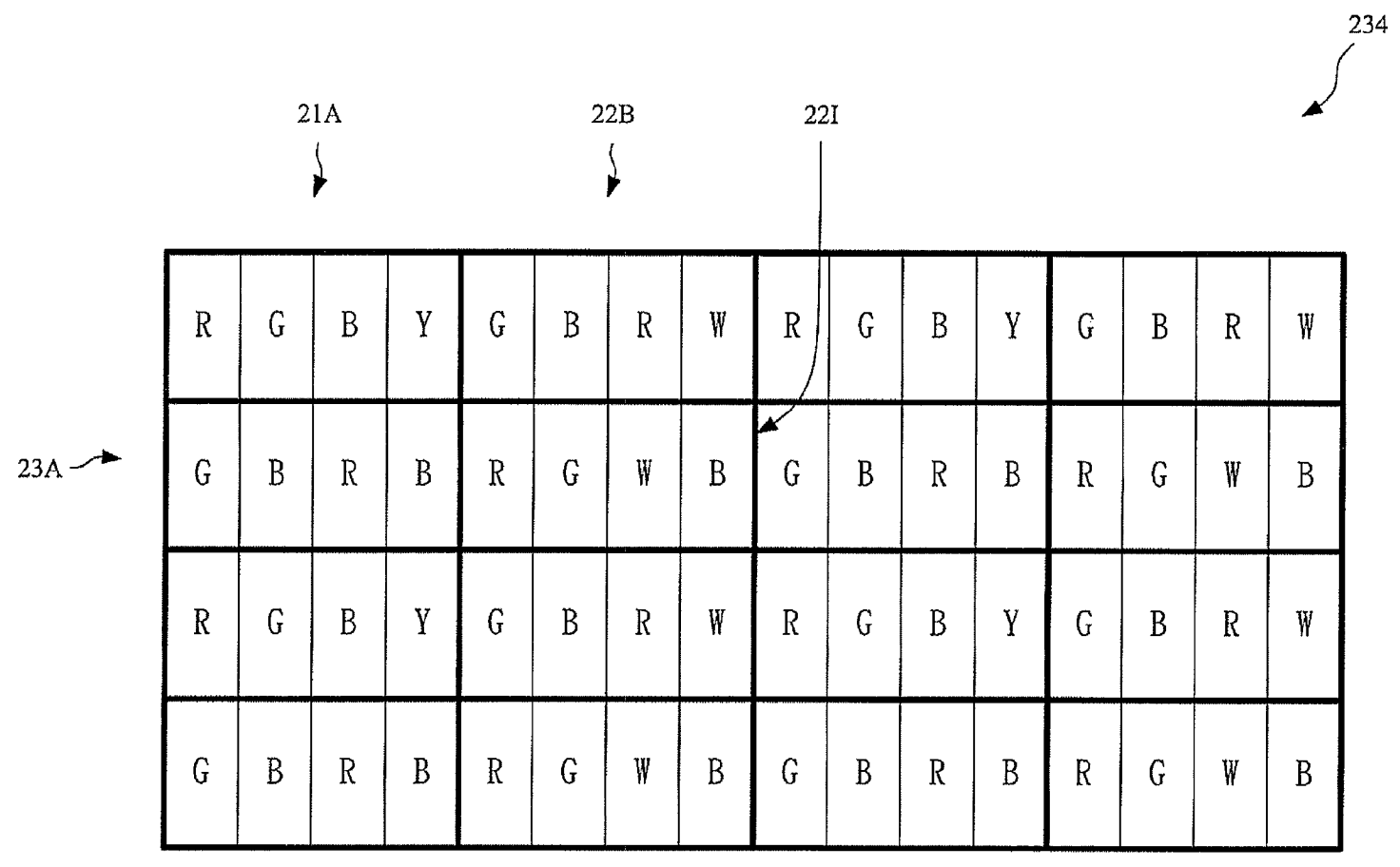

Referring to FIG. 34, it shows an image device according to an embodiment of the invention. The image device 234 includes a plurality of RGBY pixels 21A, a plurality of RGBW pixels 22B, 22I and a plurality of RBGB pixels 23A. In the RGBW pixel 22I, the sequence of the sub-pixels in the 1×4 matrix from left to right is the red sub-pixel, the green sub-pixel, the white sub-pixel and the blue sub-pixel. In an embodiment, the RGBY pixel 21A is disposed on a first column and first row position of the image device 234, the RGBW pixel 22B is disposed on a second column and first row position of image device 234, the RBGB pixel 23A is disposed on a first column and second row position of the image device 234, and the RGBW pixel 22I is disposed on a second column and second row position of the image device 234.

Figure 35:
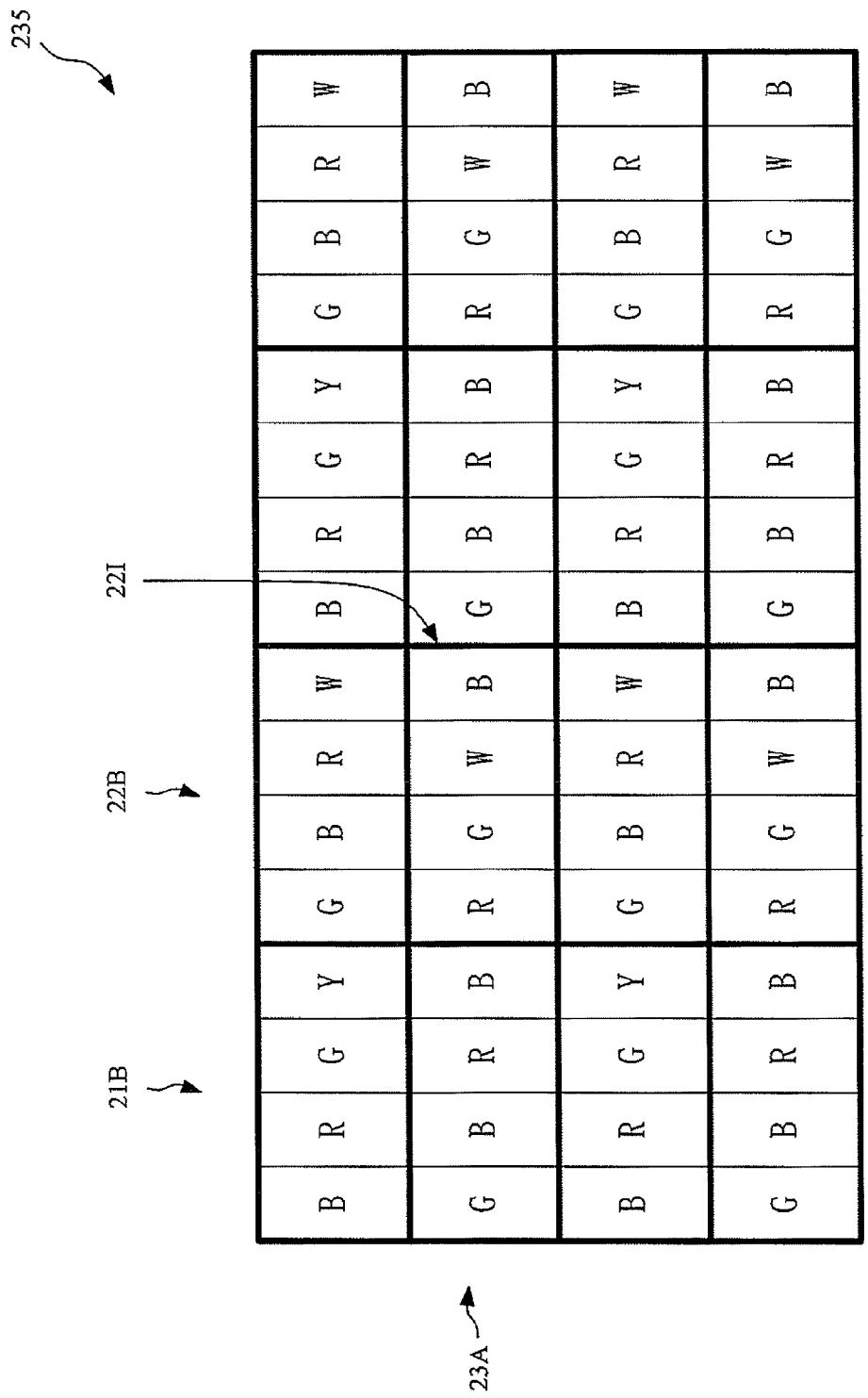
FIG. 35 shows an image device according to an embodiment of the invention.

Referring to FIG. 35, it shows an image device according to an embodiment of the invention. The image device 235 includes a plurality of RGBY pixels 21B, a plurality of RGBW pixels 22B, 22I and a plurality of RBGB pixels 23A. In an embodiment, the RGBY pixel 21B is disposed on a first column and first row position of the image device 235, the RGBW pixel 22B is disposed on a second column and first row position of image device 235, the RBGB pixel 23A is disposed on a first column and second row position of the image device 235, and the RGBW pixel 22I is disposed on a second column and second row position of the image device 235.

Figure 36:
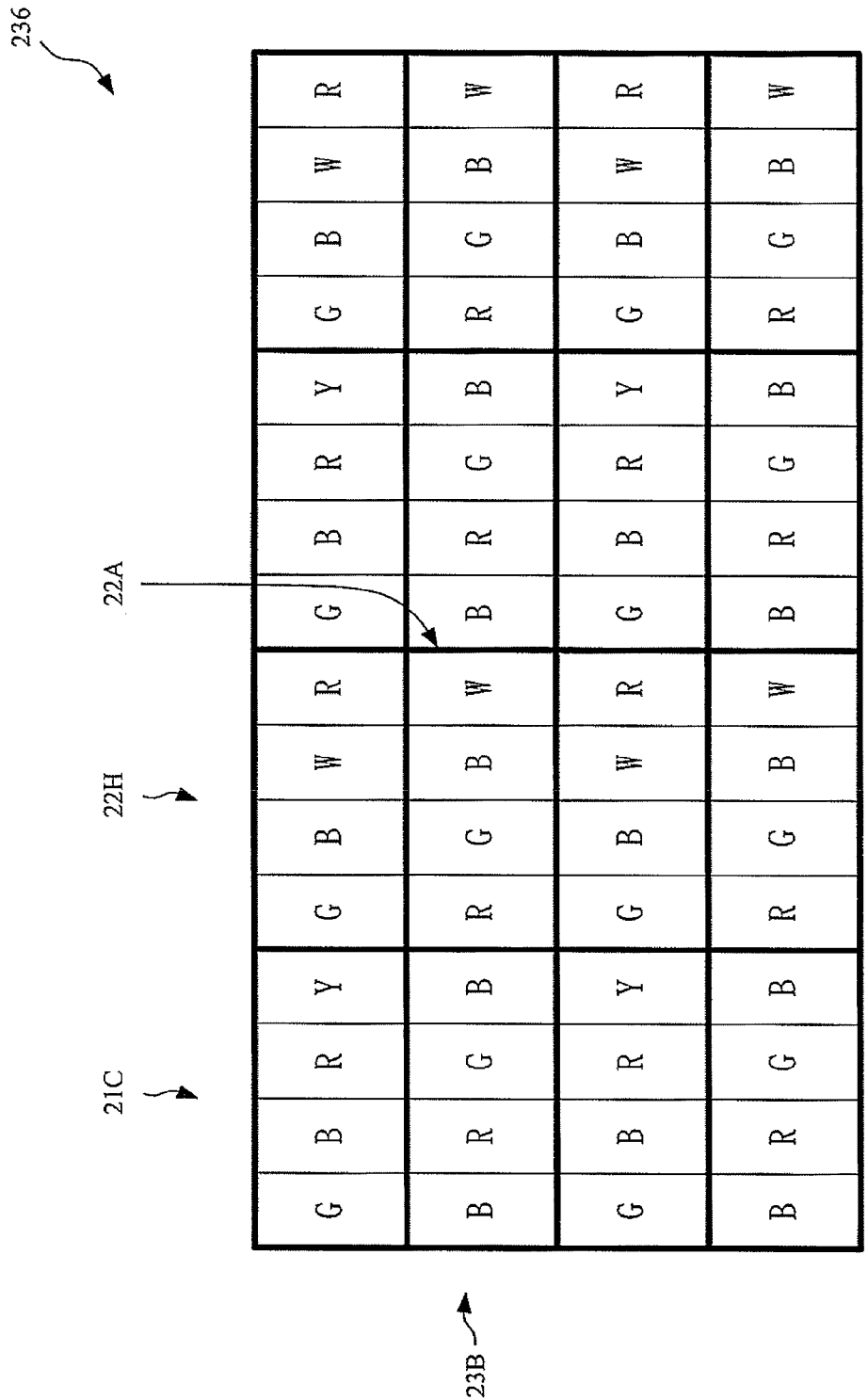
FIG. 36 shows an image device according to an embodiment of the invention.

Referring to FIG. 36, it shows an image device according to an embodiment of the invention. The image device 236 includes a plurality of RGBY pixels 21C, a plurality of RGBW pixels 22A, 22H and a plurality of RBGB pixels 23B. In an embodiment, the RGBY pixel 21C is disposed on a first column and first row position of the image device 236, the RGBW pixel 22H is disposed on a second column and first row position of image device 236, the RBGB pixel 23B is disposed on a first column and second row position of the image device 236, and the RGBW pixel 22A is disposed on a second column and second row position of the image device 236.

Figure 37:
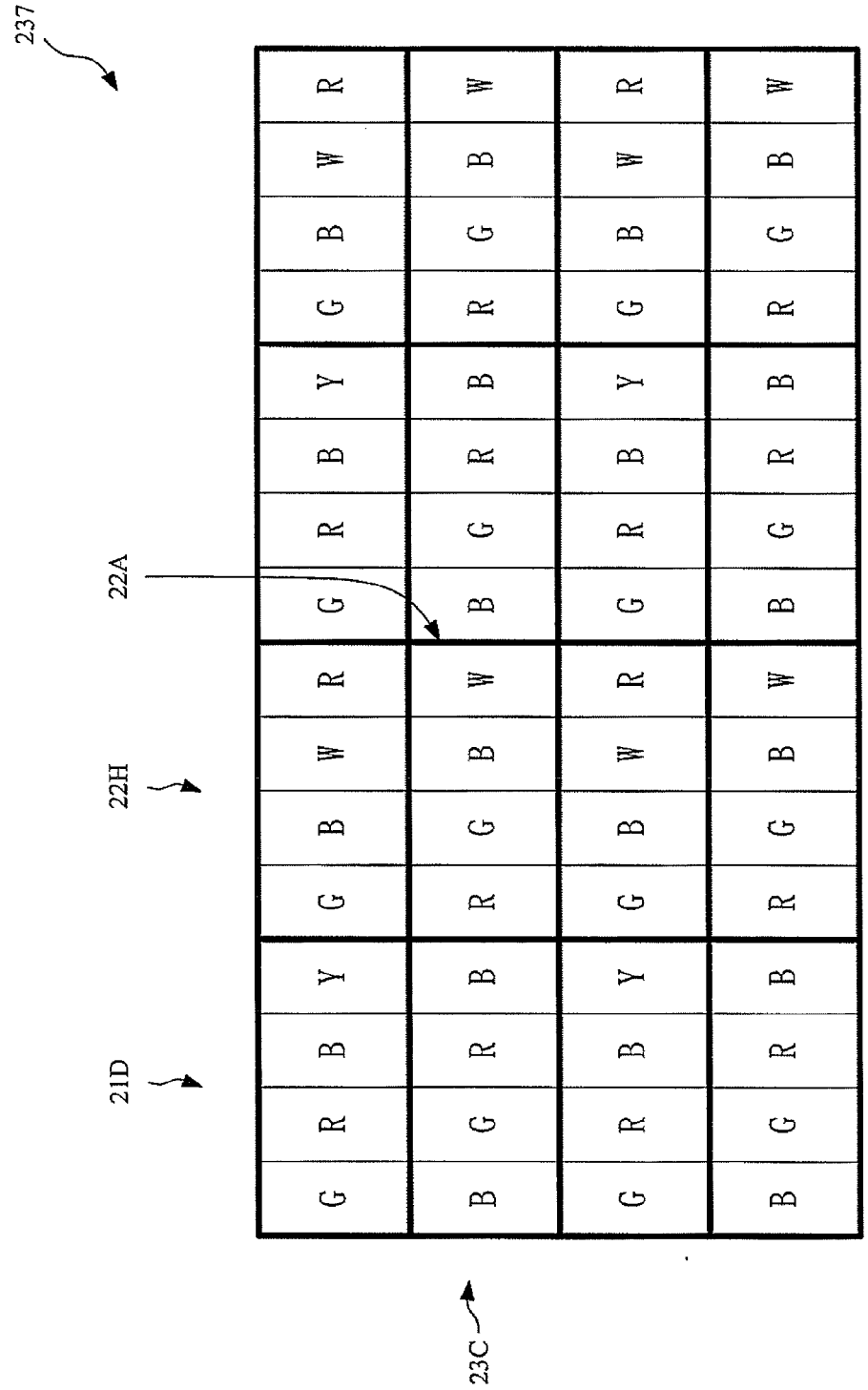
FIG. 37 shows an image device according to an embodiment of the invention.

Referring to FIG. 37, it shows an image device according to an embodiment of the invention. The image device 237 includes a plurality of RGBY pixels 21D, a plurality of RGBW pixels 22A, 22H and a plurality of RBGB pixels 23C. In an embodiment, the RGBY pixel 21D is disposed on a first column and first row position of the image device 237, the RGBW pixel 22H is disposed on a second column and first row position of image device 237, the RBGB pixel 23C is disposed on a first column and second row position of the image device 237, and the RGBW pixel 22A is disposed on a second column and second row position of the image device 237.

Figure 38:
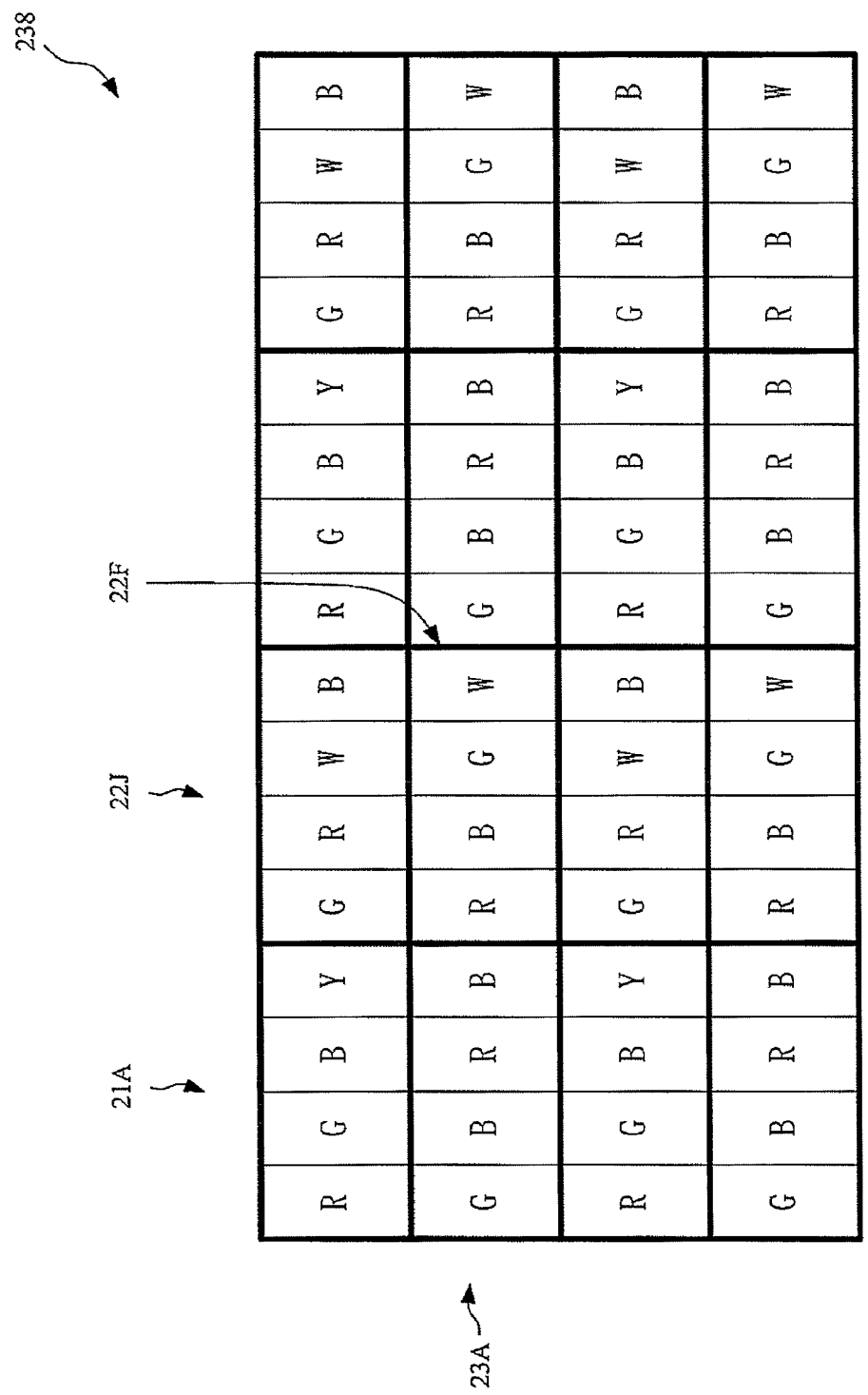
FIG. 38 shows an image device according to an embodiment of the invention.

Referring to FIG. 38, it shows an image device according to an embodiment of the invention. The image device 238 includes a plurality of RGBY pixels 21A, a plurality of RGBW pixels 22F, 22J and a plurality of RBGB pixels 23A. In the RGBW pixel 22J, the sequence of the sub-pixels in the 1×4 matrix from left to right is the green sub-pixel, the red sub-pixel, the white sub-pixel and the blue sub-pixel. In an embodiment, the RGBY pixel 21A is disposed on a first column and first row position of the image device 238, the RGBW pixel 22J is disposed on a second column and first row position of image device 238, the RBGB pixel 23A is disposed on a first column and second row position of the image device 238, and the RGBW pixel 22F is disposed on a second column and second row position of the image device 238.

Figure 39:
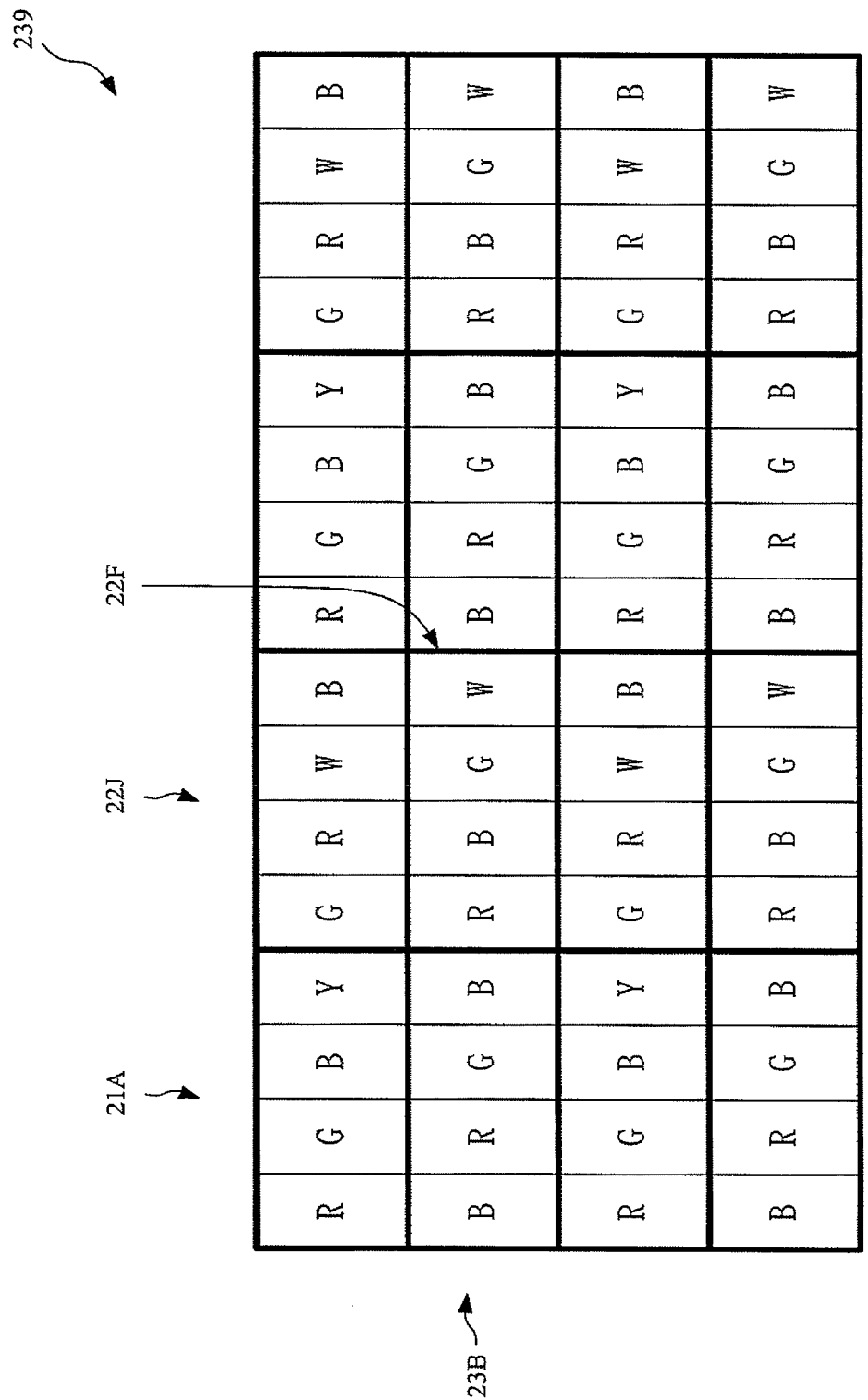
FIG. 39 shows an image device according to an embodiment of the invention.

Referring to FIG. 39, it shows an image device according to an embodiment of the invention. The image device 239 includes a plurality of RGBY pixels 21A, a plurality of RGBW pixels 22F, 22J and a plurality of RBGB pixels 23B. In an embodiment, the RGBY pixel 21A is disposed on a first column and first row position of the image device 239, the RGBW pixel 22J is disposed on a second column and first row position of image device 239, the RBGB pixel 23B is disposed on a first column and second row position of the image device 239, and the RGBW pixel 22F is disposed on a second column and second row position of the image device 239.

Figure 40:
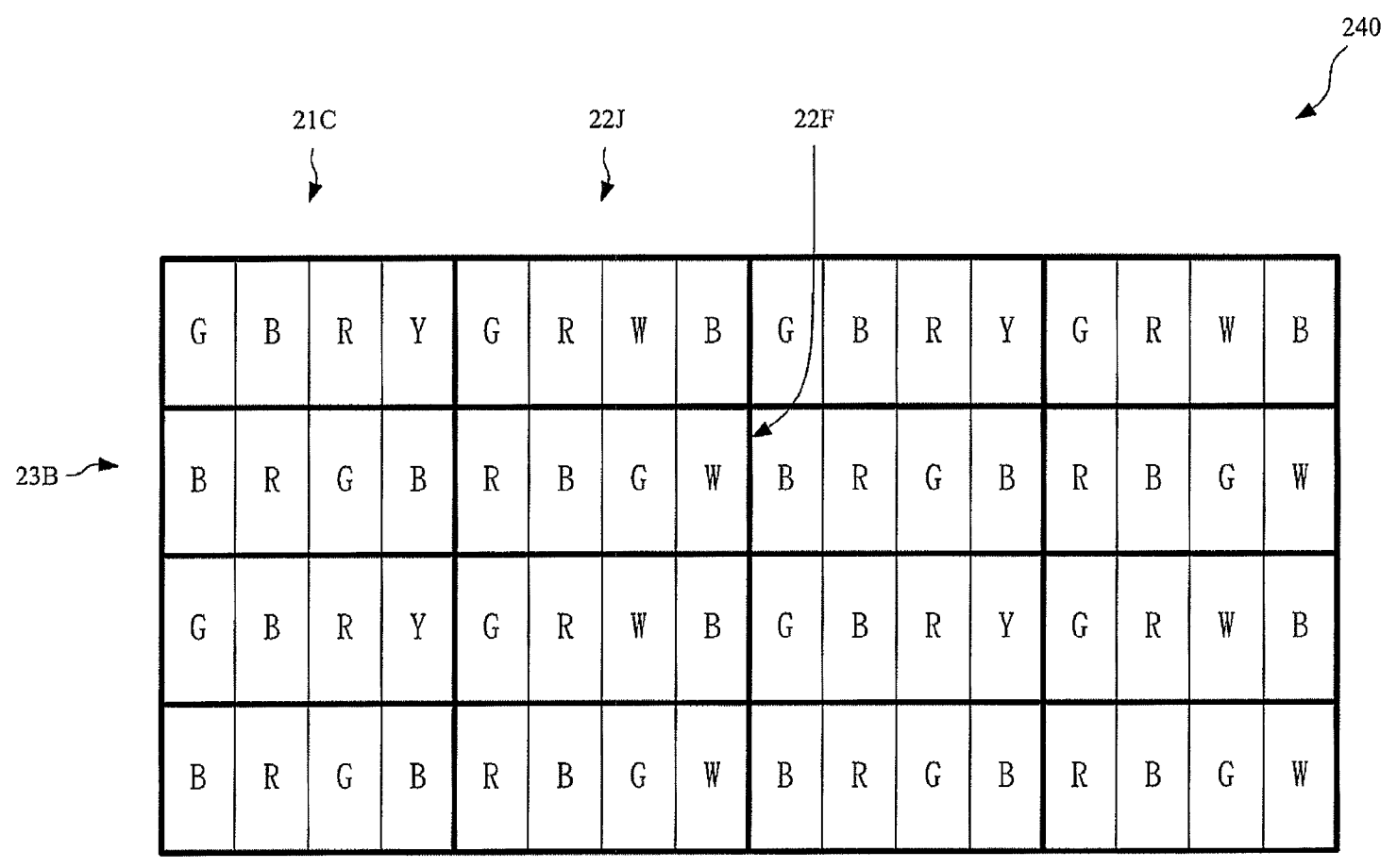

Referring to FIG. 40, it shows an image device according to an embodiment of the invention. The image device 240 includes a plurality of RGBY pixels 21C, a plurality of RGBW pixels 22F, 22J and a plurality of RBGB pixels 23B. In an embodiment, the RGBY pixel 21C is disposed on a first column and first row position of the image device 240, the RGBW pixel 22J is disposed on a second column and first row position of image device 240, the RBGB pixel 23B is disposed on a first column and second row position of the image device 240, and the RGBW pixel 22F is disposed on a second column and second row position of the image device 240.

Figure 41:
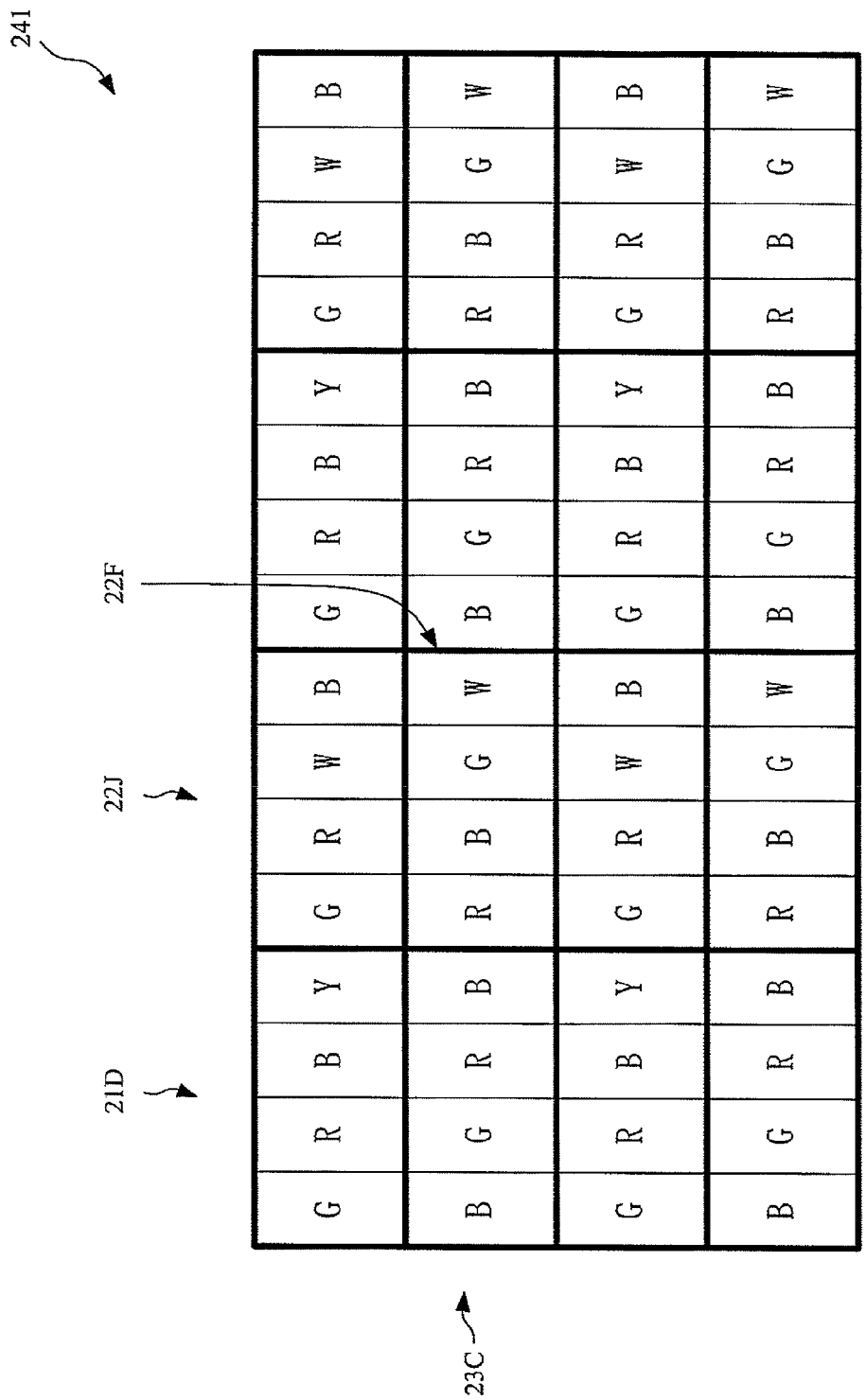
FIG. 41 shows an image device according to an embodiment of the invention.

Referring to FIG. 41, it shows an image device according to an embodiment of the invention. The image device 241 includes a plurality of RGBY pixels 21D, a plurality of RGBW pixels 22F, 22J and a plurality of RBGB pixels 23C. In an embodiment, the RGBY pixel 21D is disposed on a first column and first row position of the image device 241, the RGBW pixel 22J is disposed on a second column and first row position of image device 241, the RBGB pixel 23C is disposed on a first column and second row position of the image device 241, and the RGBW pixel 22F is disposed on a second column and second row position of the image device 241.

Figure 42:
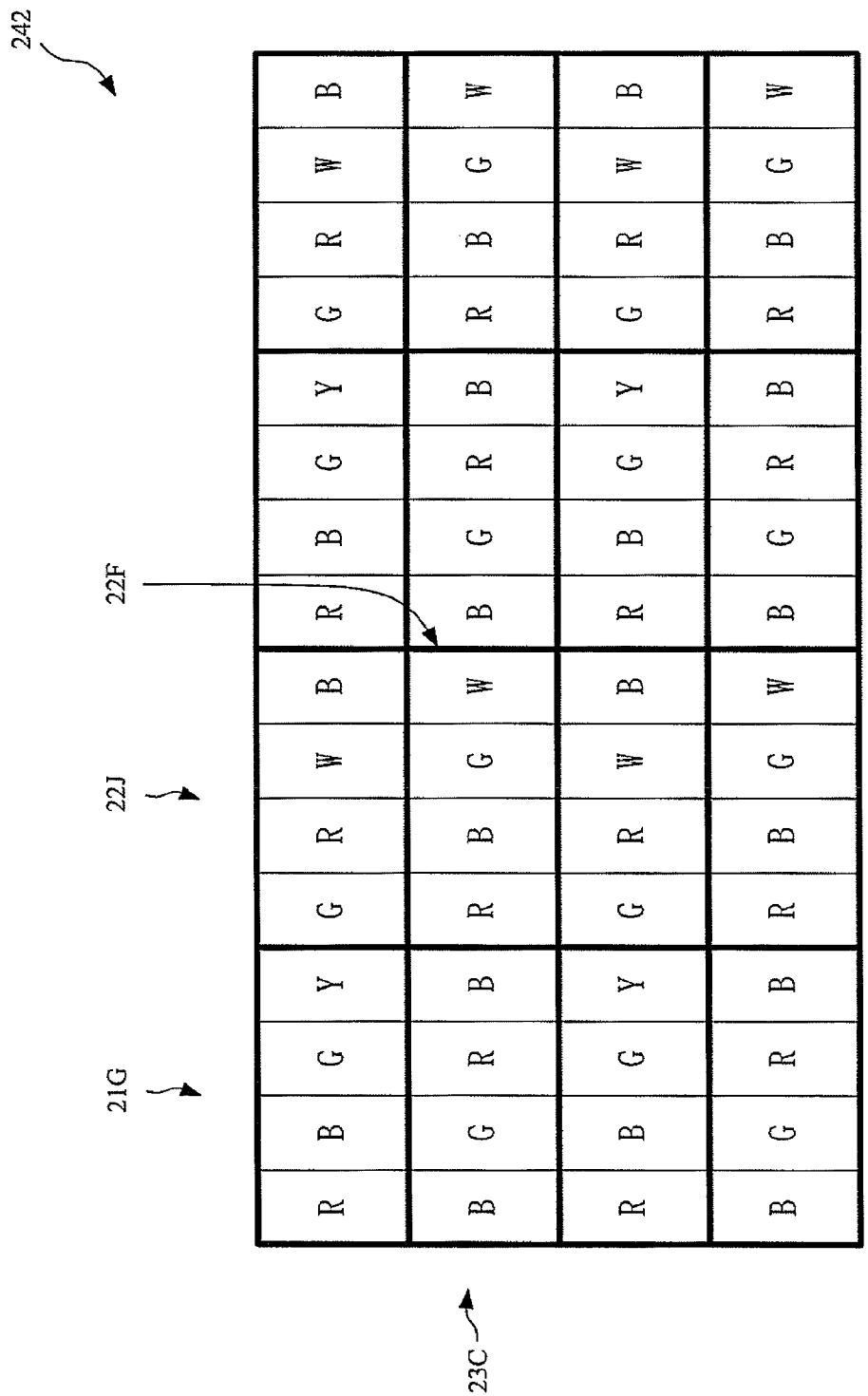
FIG. 42 shows an image device according to an embodiment of the invention.

Referring to FIG. 42, it shows an image device according to an embodiment of the invention. The image device 242 includes a plurality of RGBY pixels 21G, a plurality of RGBW pixels 22F, 22J and a plurality of RBGB pixels 23C. In an embodiment, the RGBY pixel 21G is disposed on a first column and first row position of the image device 242, the RGBW pixel 22J is disposed on a second column and first row position of image device 242, the RBGB pixel 23C is disposed on a first column and second row position of the image device 242, and the RGBW pixel 22F is disposed on a second column and second row position of the image device 242.

Figure 43:
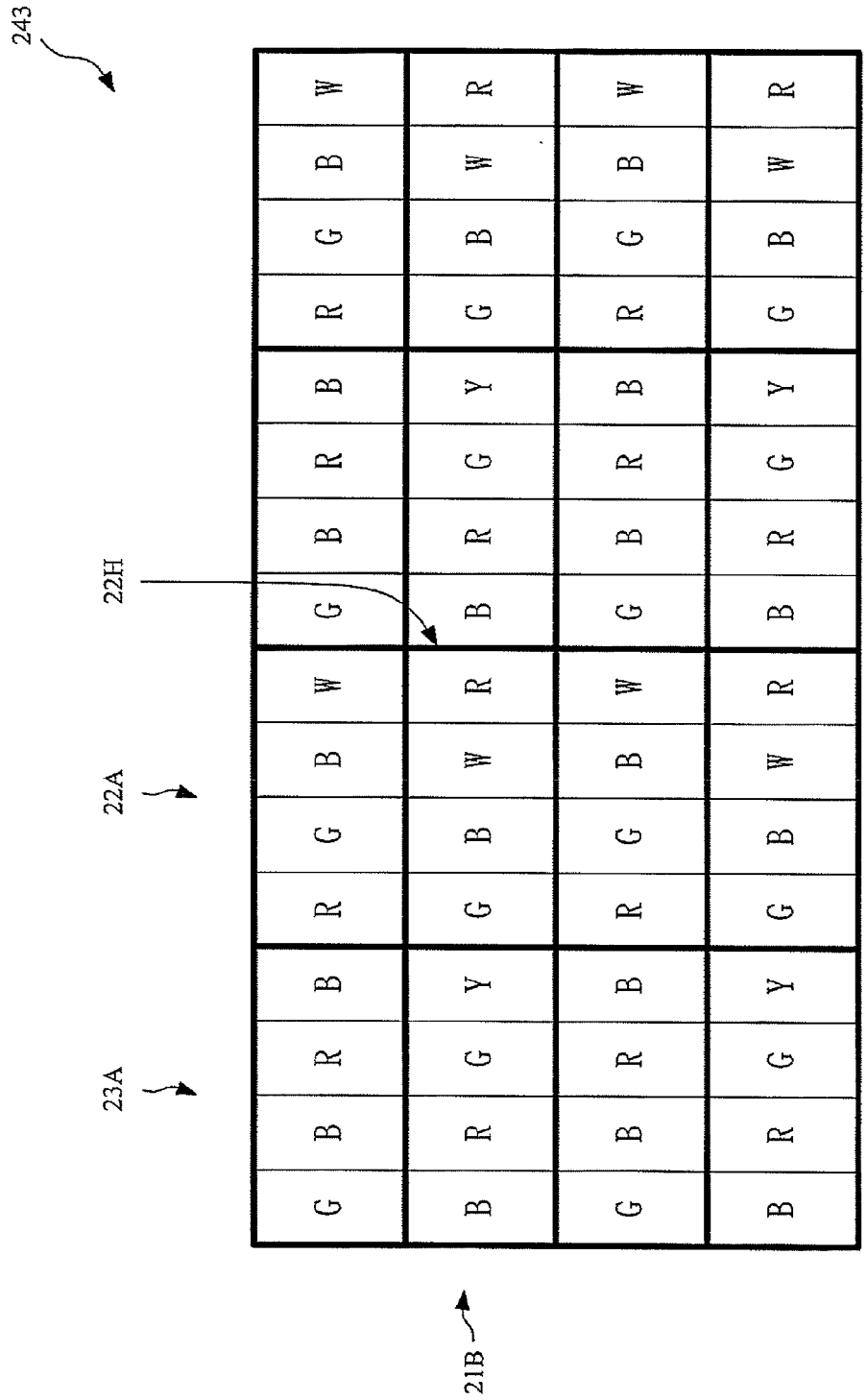
FIG. 43 shows an image device according to an embodiment of the invention.

Referring to FIG. 43, it shows an image device according to an embodiment of the invention. The image device 243 includes a plurality of RGBY pixels 21B, a plurality of RGBW pixels 22A, 22H and a plurality of RBGB pixels 23A. In an embodiment, the RBGB pixel 23A is disposed on a first column and first row position of the image device 243, the RGBW pixel 22A is disposed on a second column and first row position of image device 243, the RGBY pixel 21B is disposed on a first column and second row position of the image device 243, and the RGBW pixel 22H is disposed on a second column and second row position of the image device 243.

Figure 44:
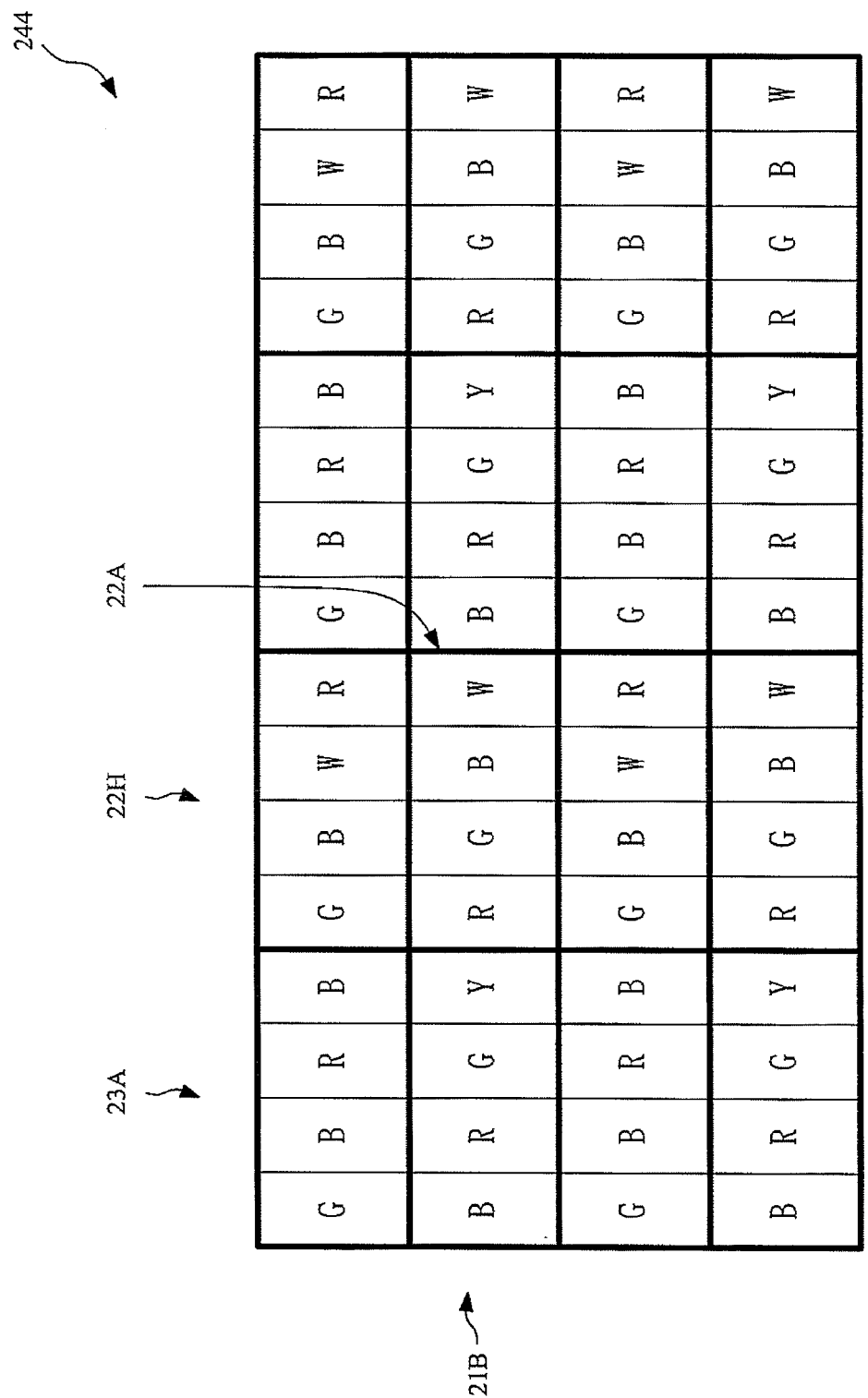
FIG. 44 shows an image device according to an embodiment of the invention.

Referring to FIG. 44, it shows an image device according to an embodiment of the invention. The image device 244 includes a plurality of RGBY pixels 21B, a plurality of RGBW pixels 22A, 22H and a plurality of RBGB pixels 23A. In an embodiment, the RBGB pixel 23A is disposed on a first column and first row position of the image device 244, the RGBW pixel 22H is disposed on a second column and first row position of image device 244, the RGBY pixel 21B is disposed on a first column and second row position of the image device 244, and the RGBW pixel 22A is disposed on a second column and second row position of the image device 244.

Figure 45:
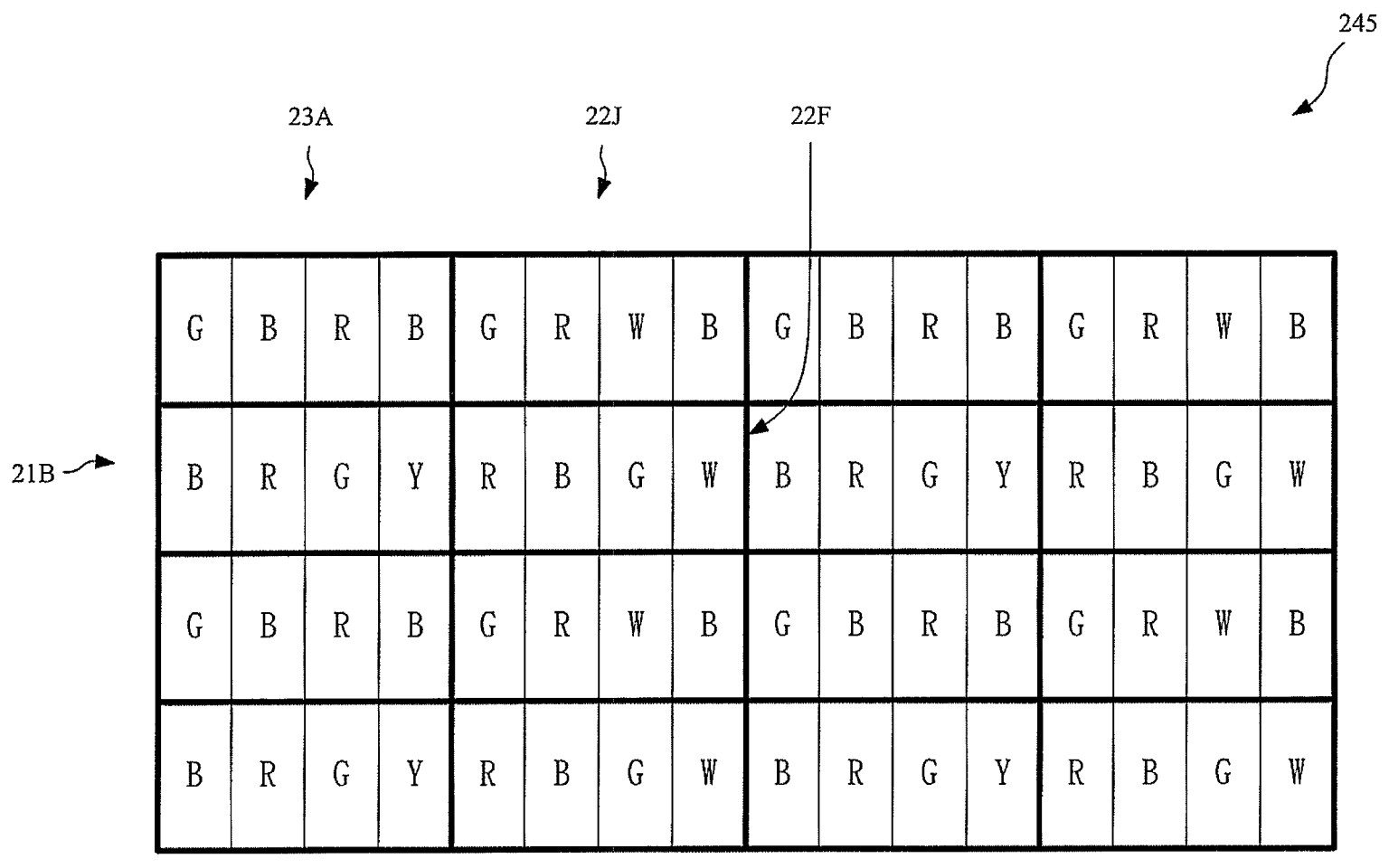

Referring to FIG. 45, it shows an image device according to an embodiment of the invention. The image device 245 includes a plurality of RGBY pixels 21B, a plurality of RGBW pixels 22F, 22J and a plurality of RBGB pixels 23A. In an embodiment, the RBGB pixel 23A is disposed on a first column and first row position of the image device 245, the RGBW pixel 22J is disposed on a second column and first row position of image device 245, the RGBY pixel 21B is disposed on a first column and second row position of the image device 245, and the RGBW pixel 22F is disposed on a second column and second row position of the image device 245.

Figure 46:
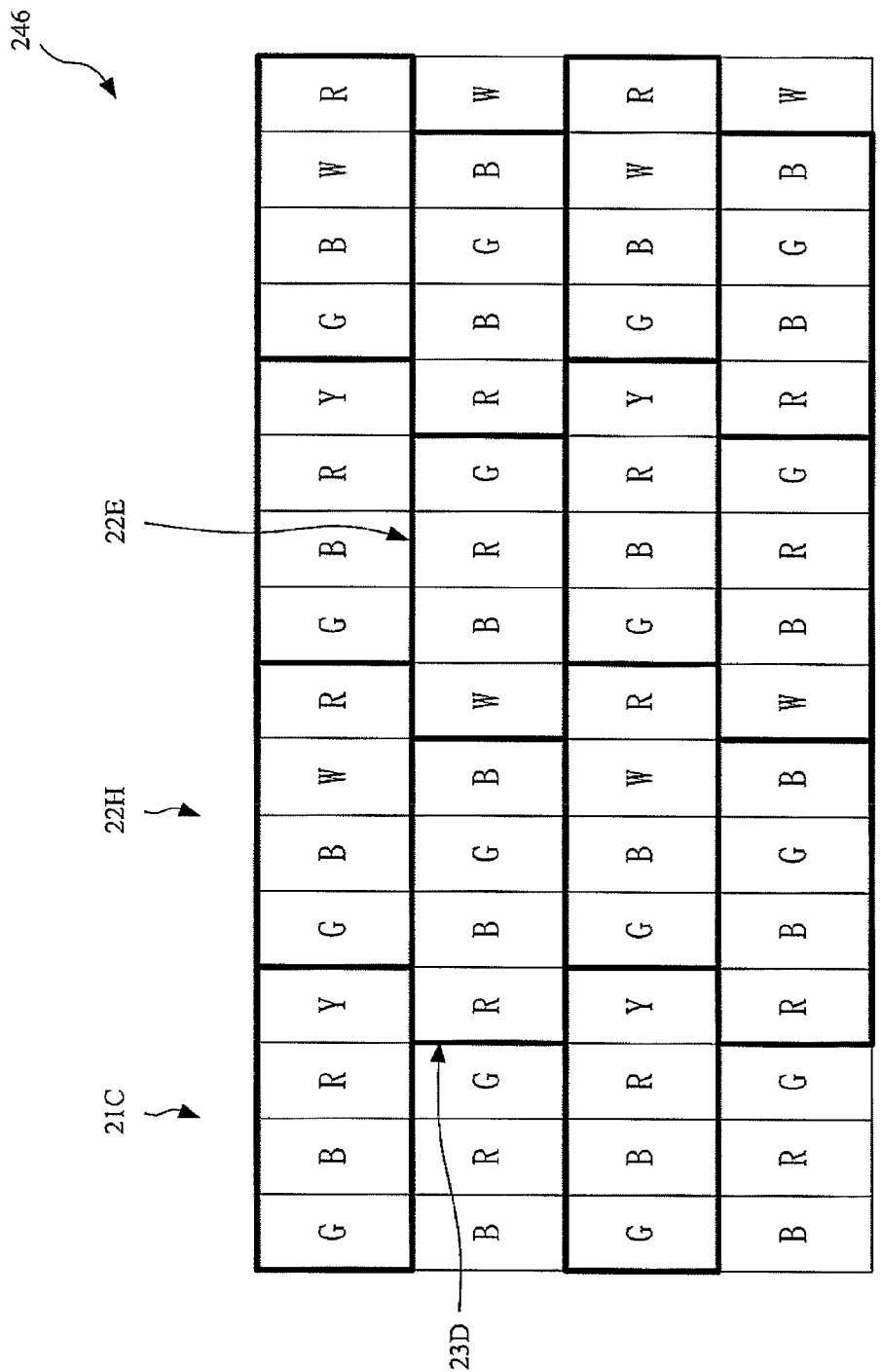
FIG. 46 shows an image device according to an embodiment of the invention.

Referring to FIG. 46, it shows an image device according to an embodiment of the invention. The image device 246 includes a plurality of RGBY pixels 21C, a plurality of RGBW pixels 22E, 22H and a plurality of RBGB pixels 23D. In an embodiment, the RGBY pixel 21C is disposed on a first column and first row position of the image device 246, the RGBW pixel 22H is disposed on a second column and first row position of image device 246, the RBGB pixel 23D is disposed on a first column and second row position of the image device 246, and the RGBW pixel 22E is disposed on a second column and second row position of the image device 246. On the second row, three sub-pixels (the blue sub-pixel, the red sub-pixel and the green sub-pixel) are added to the left of the RBGB pixel 23D.

Figure 47:
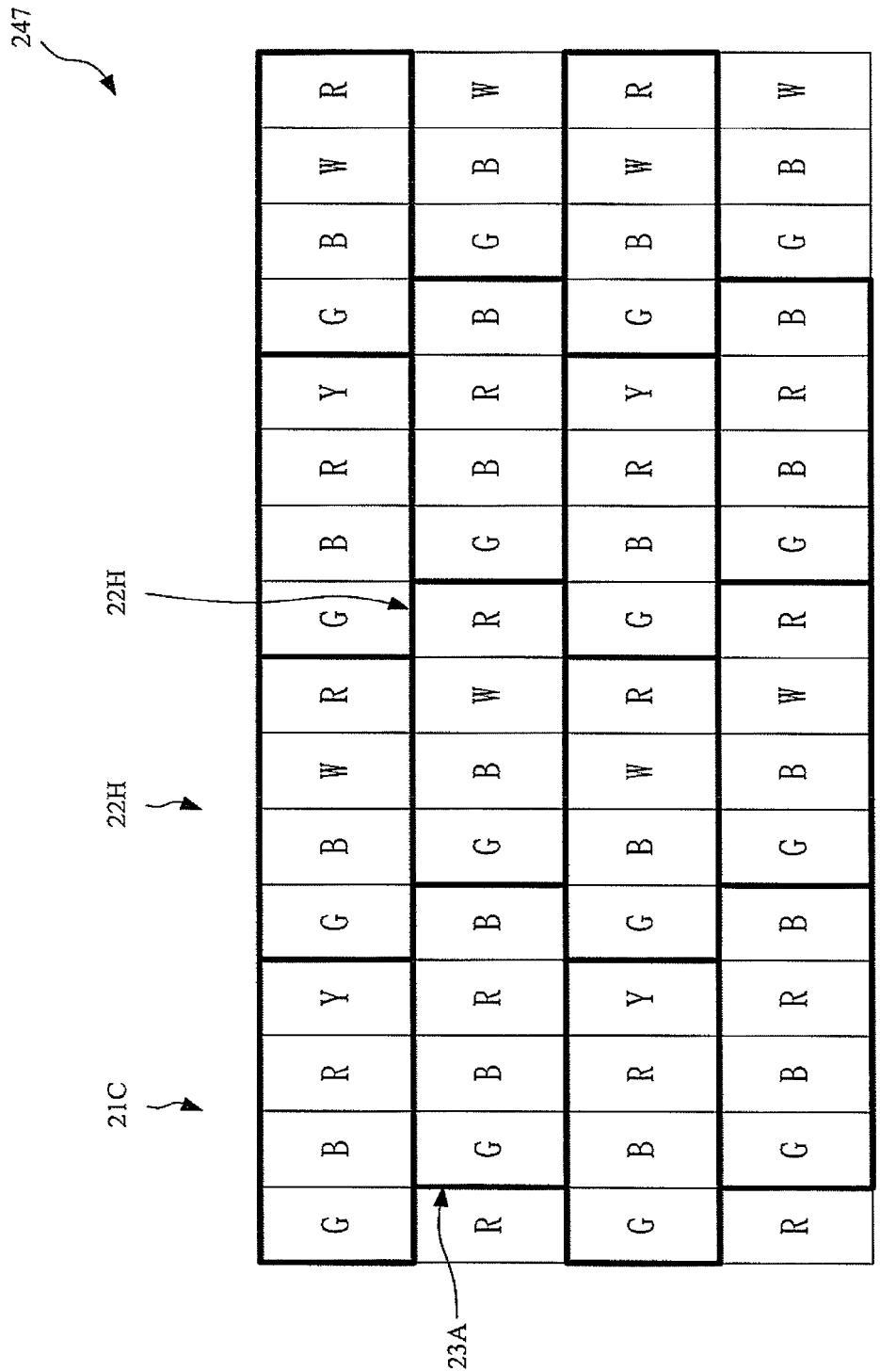
FIG. 47 shows an image device according to an embodiment of the invention.

Referring to FIG. 47, it shows an image device according to an embodiment of the invention. The image device 247 includes a plurality of RGBY pixels 21C, a plurality of RGBW pixels 22H and a plurality of RBGB pixels 23A. In an embodiment, the RGBY pixel 21C is disposed on a first column and first row position of the image device 247, the RGBW pixel 22H is disposed on a second column and first row position of image device 247, the RBGB pixel 23A is disposed on a first column and second row position of the image device 247, and the RGBW pixel 22H is disposed on a second column and second row position of the image device 247. On the second row, one sub-pixel (the red sub-pixel) is added to the left of the RBGB pixel 23A.

Figure 48:
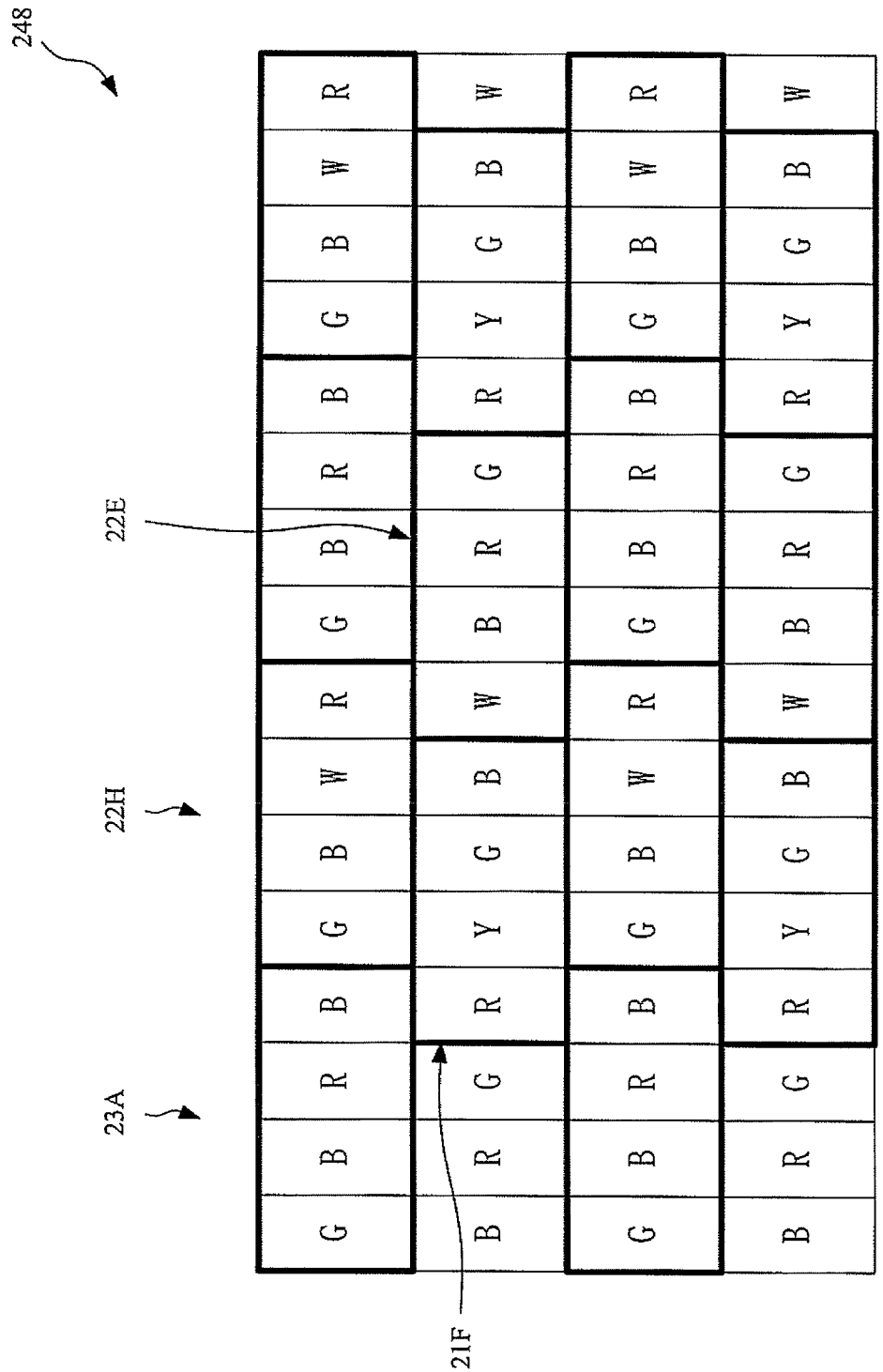
FIG. 48 shows an image device according to an embodiment of the invention.

Referring to FIG. 48, it shows an image device according to an embodiment of the invention. The image device 248 includes a plurality of RGBY pixels 21F, a plurality of RGBW pixels 22E, 22H and a plurality of RBGB pixels 23A. In an embodiment, the RBGB pixel 23A is disposed on a first column and first row position of the image device 248, the RGBW pixel 22H is disposed on a second column and first row position of image device 248, the RGBY pixel 21F is disposed on a first column and second row position of the image device 248, and the RGBW pixel 22E is disposed on a second column and second row position of the image device 248. On the second row, three sub-pixels (the blue sub-pixel, the red sub-pixel and the green sub-pixel) are added to the left of the RGBY pixel 21F.

Figure 49:
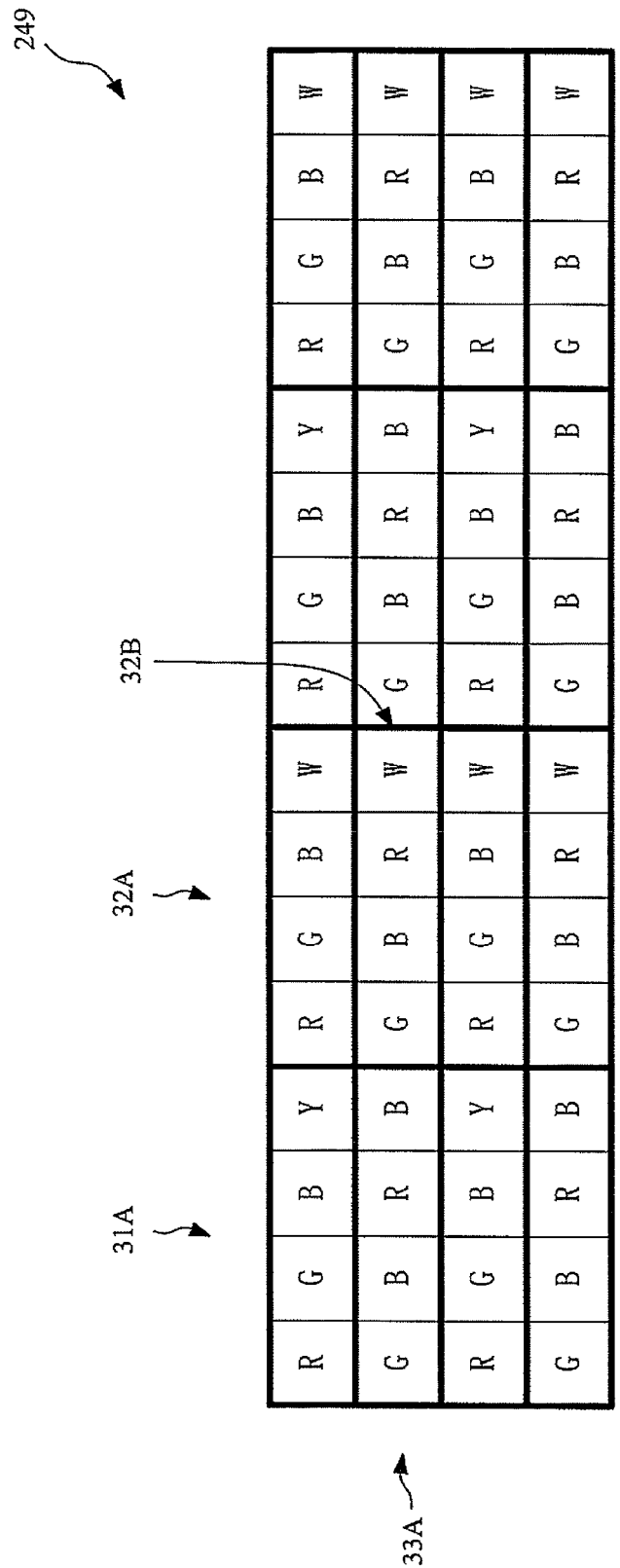
FIG. 49 shows an image device according to an embodiment of the invention.

Referring to FIG. 49, it shows an image device according to an embodiment of the invention. The image device 249 includes a plurality of RGBY pixels 31A, a plurality of RGBW pixels 32A, 32B and a plurality of RBGB pixels 33A. The difference between the image device 249 in FIG. 49 and the image device 201 in FIG. 1 is that each sub-pixel in the image device 249 is formed as about a square shape.

Figure 50:
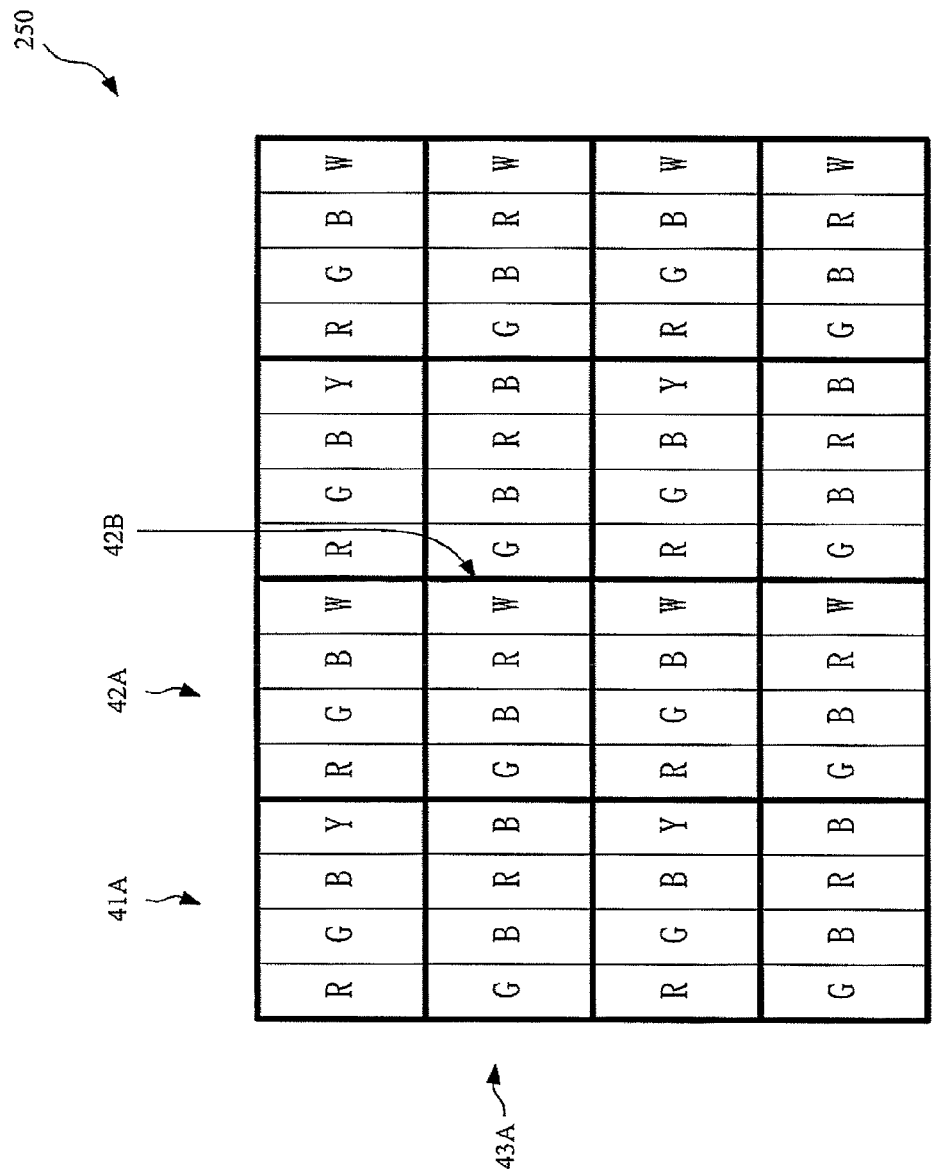
FIG. 50 shows an image device according to an embodiment of the invention.

Referring to FIG. 50, it shows an image device according to an embodiment of the invention. The image device 250 includes a plurality of RGBY pixels 41A, a plurality of RGBW pixels 42A, 42B and a plurality of RBGB pixels 43A. The difference between the image device 250 of FIG. 50 and the image device 201 of FIG. 1 is that each sub-pixel in the image device 250 is formed as about a rectangular shape, and any three adjacent sub-pixels along a longer border are formed as about a square shape.

Figure 51:
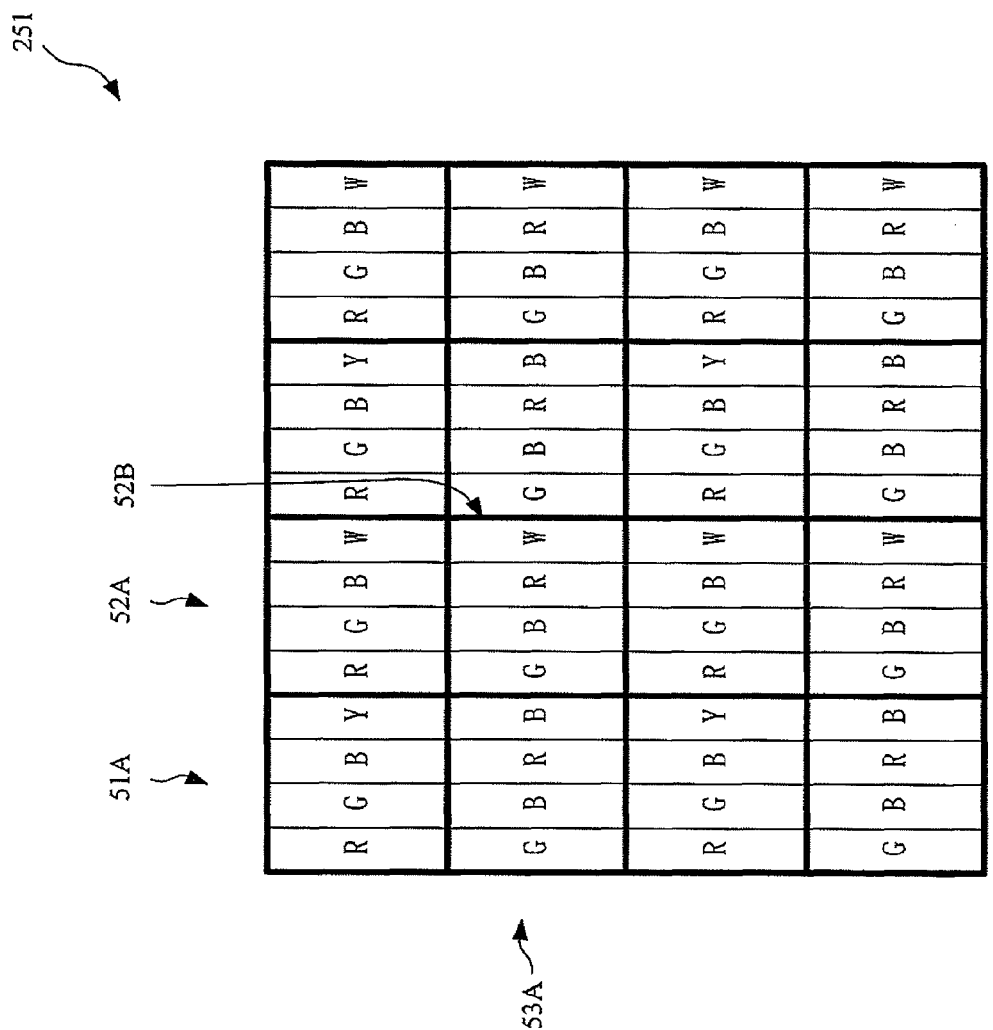
FIG. 51 shows an image device according to an embodiment of the invention.

Referring to FIG. 51, it shows an image device according to an embodiment of the invention. The image device 251 includes a plurality of RGBY pixels 51A, a plurality of RGBW pixels 52A, 52B and a plurality of RBGB pixels 53A. The difference between the image device 251 of FIG. 51 and the image device 201 of FIG. 1 is that each sub-pixel in the image device 251 is formed as about a rectangular shape, and any four adjacent sub-pixels along a longer border are formed as about a square shape.

Figure 52:
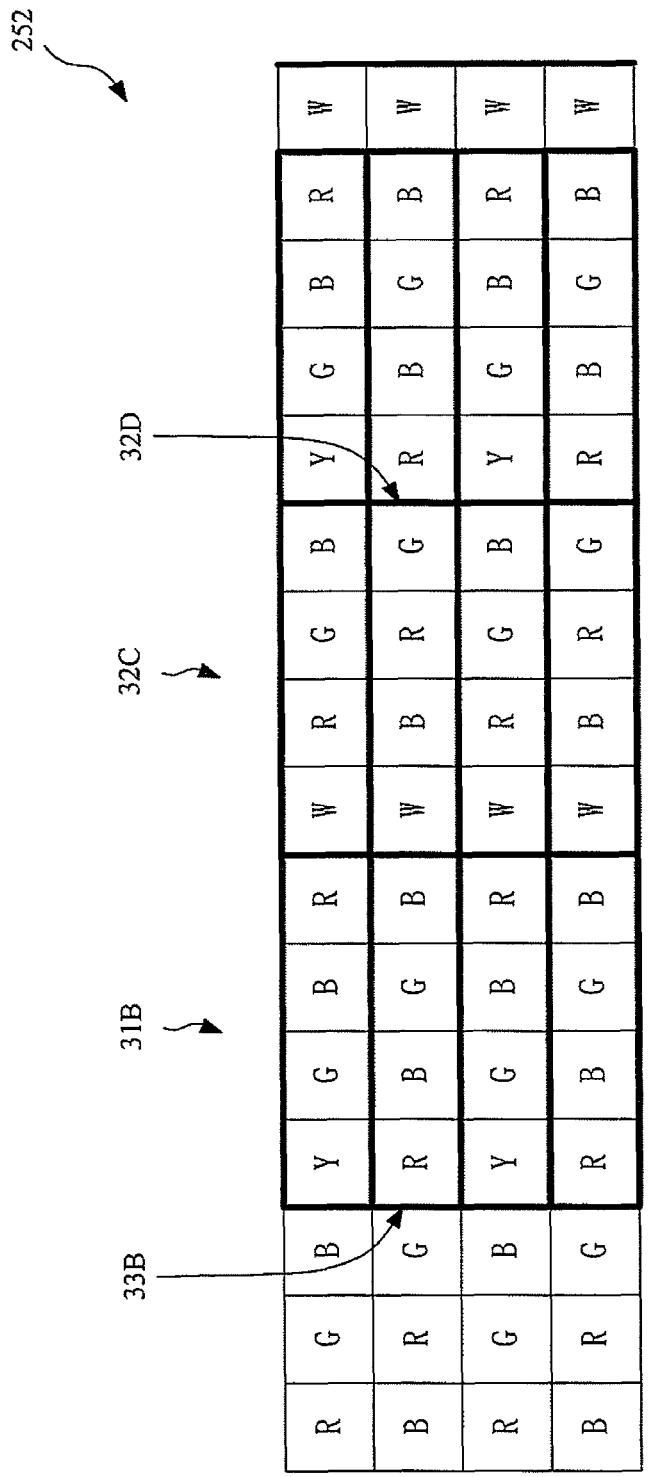
FIG. 52 shows an image device according to an embodiment of the invention.

Referring to FIG. 52, it shows an image device according to an embodiment of the invention. The image device 252 includes a plurality of RGBY pixels 31B, a plurality of RGBW pixels 32C, 32D and a plurality of RBGB pixels 33B. The difference between the image device 252 of FIG. 52 and the image device 222 of FIG. 22 is that each sub-pixel in the image device 252 is formed as about a square shape.

Figure 53:
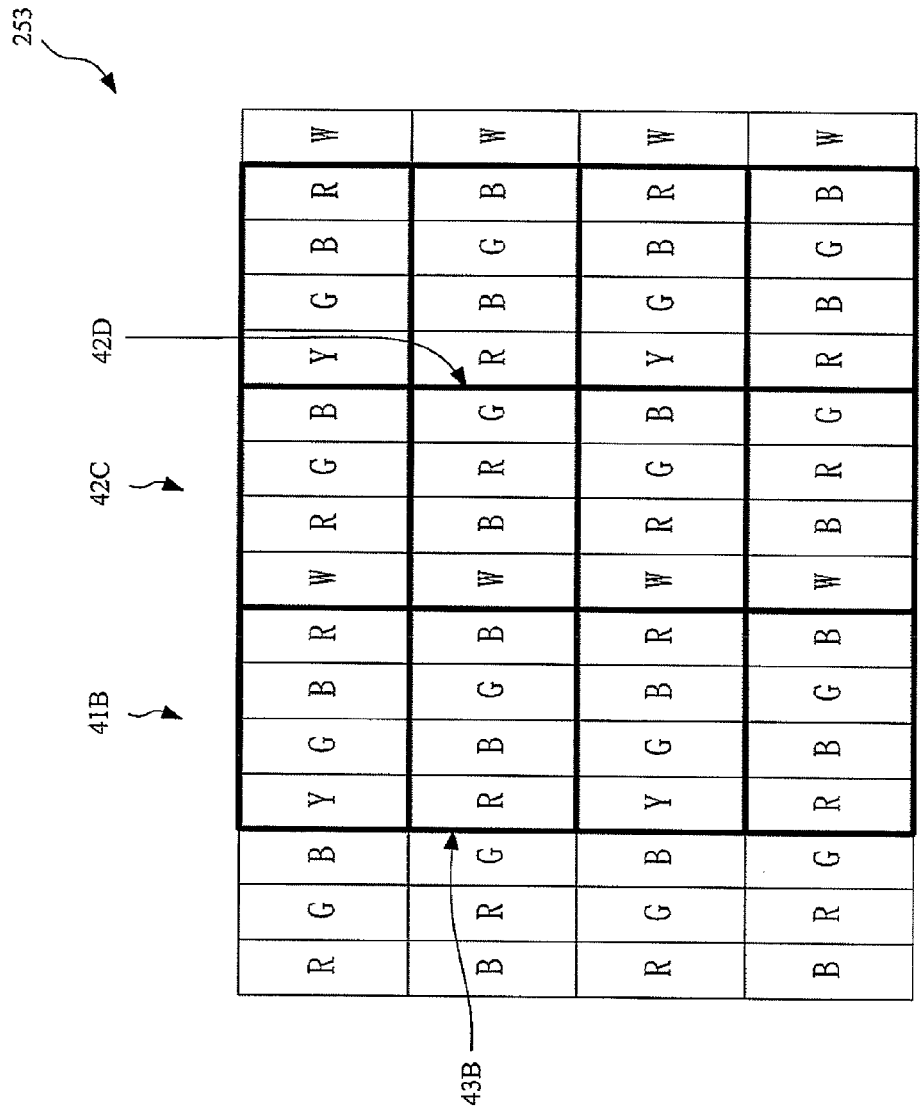
FIG. 53 shows an image device according to an embodiment of the invention.

Referring to FIG. 53, it shows an image device according to an embodiment of the invention. The image device 253 includes a plurality of RGBY pixels 41B, a plurality of RGBW pixels 42C, 42D and a plurality of RBGB pixels 43B. The difference between the image device 253 of FIG. 53 and the image device 222 of FIG. 22 is that each sub-pixel in the image device 253 is formed as about a rectangular shape, and any three adjacent sub-pixels along a longer border are formed as about a square shape.

Figure 54:
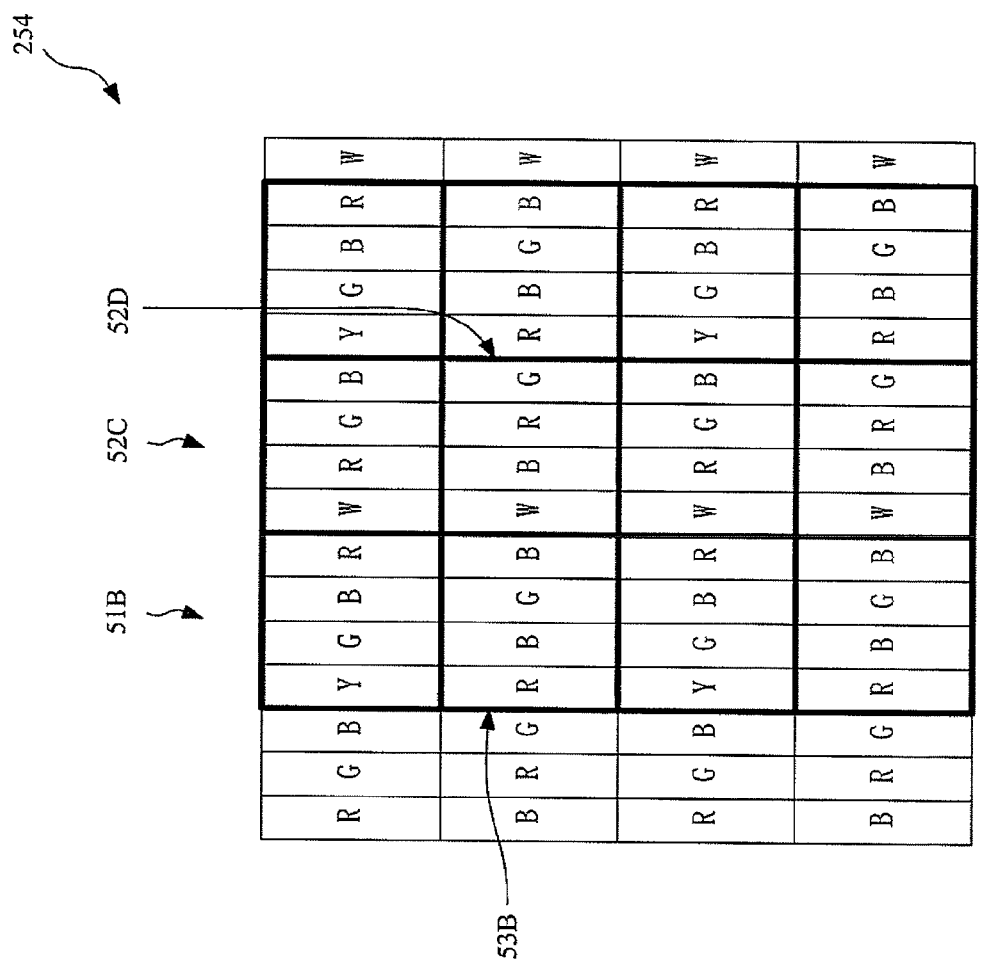
FIG. 54 shows an image device according to an embodiment of the invention.

Referring to FIG. 54, it shows an image device according to an embodiment of the invention. The image device 254 includes a plurality of RGBY pixels 51B, a plurality of RGBW pixels 52C, 52D and a plurality of RBGB pixels 53B. The difference between the image device 254 of FIG. 54 and the image device 222 of FIG. 22 is that each sub-pixel in the image device 254 is formed as about a rectangular shape, and any four adjacent sub-pixels along a longer border are formed as about a square shape.

Figure 55:
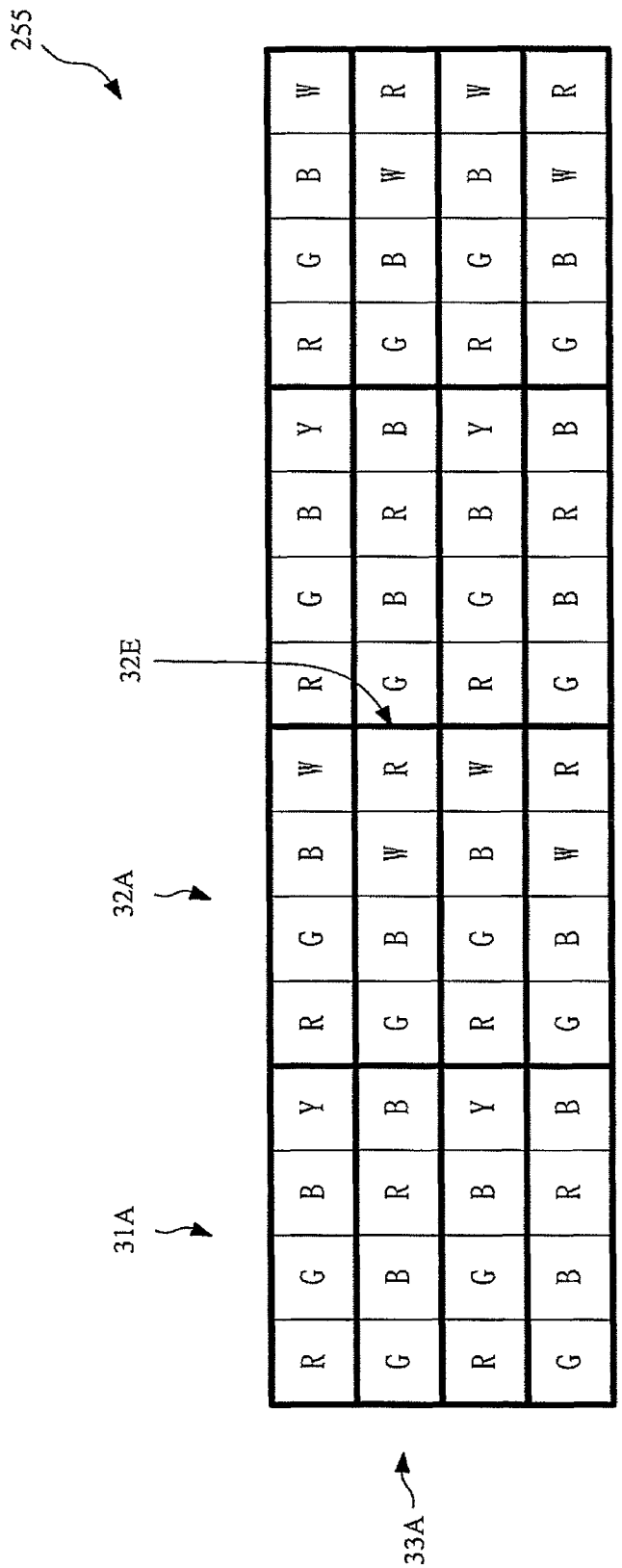
FIG. 55 shows an image device according to an embodiment of the invention.

Referring to FIG. 55, it shows an image device according to an embodiment of the invention. The image device 255 includes a plurality of RGBY pixels 31A, a plurality of RGBW pixels 32A, 32E and a plurality of RBGB pixels 33A. The difference between the image device 255 of FIG. 55 and the image device 232 of FIG. 32 is that each sub-pixel in the image device 255 is formed as about a square shape.

Figure 56:
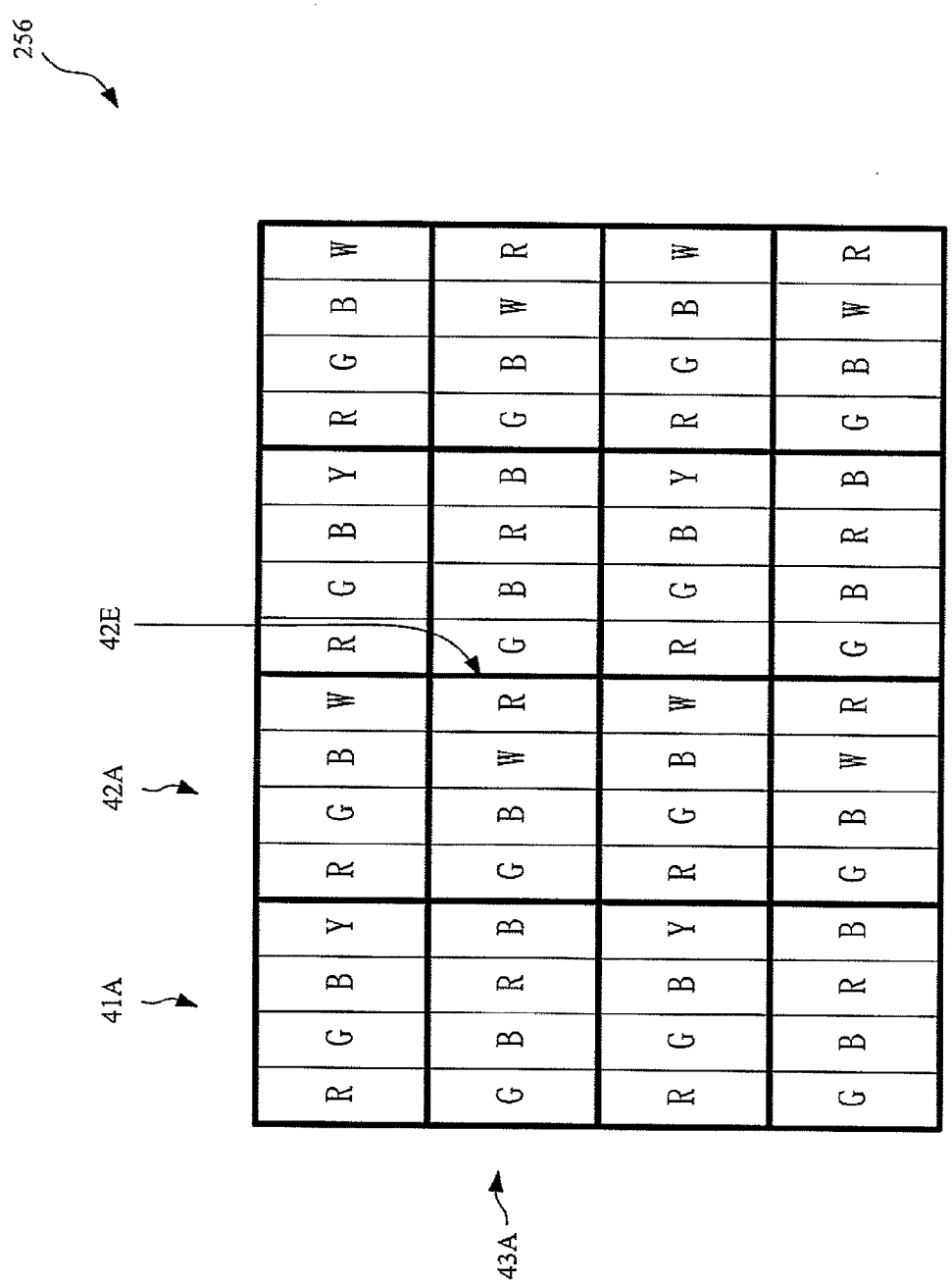
FIG. 56 shows an image device according to an embodiment of the invention.

Referring to FIG. 56, it shows an image device according to an embodiment of the invention. The image device 256 includes a plurality of RGBY pixels 41A, a plurality of RGBW pixels 42A, 42E and a plurality of RBGB pixels 43A. The difference between the image device 256 of FIG. 56 and the image device 232 of FIG. 32 is that each sub-pixel in the image device 256 is formed as about a rectangular shape, and any three adjacent sub-pixels along a longer border are formed as about a square shape.

Figure 57:
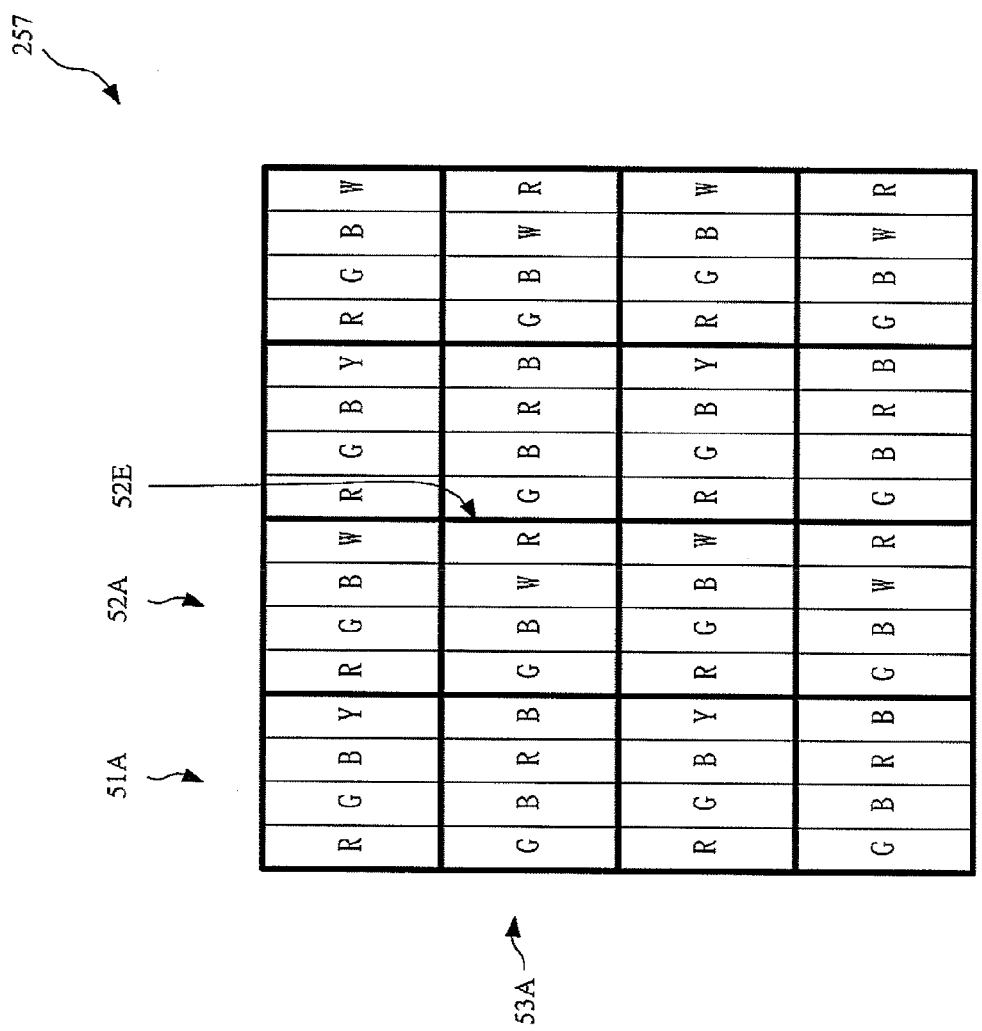
FIG. 57 shows an image device according to an embodiment of the invention.

Referring to FIG. 57, it shows an image device according to an embodiment of the invention. The image device 257 includes a plurality of RGBY pixels 51A, a plurality of RGBW pixels 52A, 52E and a plurality of RBGB pixels 53A. The difference between the image device 257 of FIG. 57 and the image device 232 of FIG. 32 is that each sub-pixel in the image device 257 is formed as about a rectangular shape, and any four adjacent sub-pixels along a longer border are formed as about a square shape.

Figure 58:
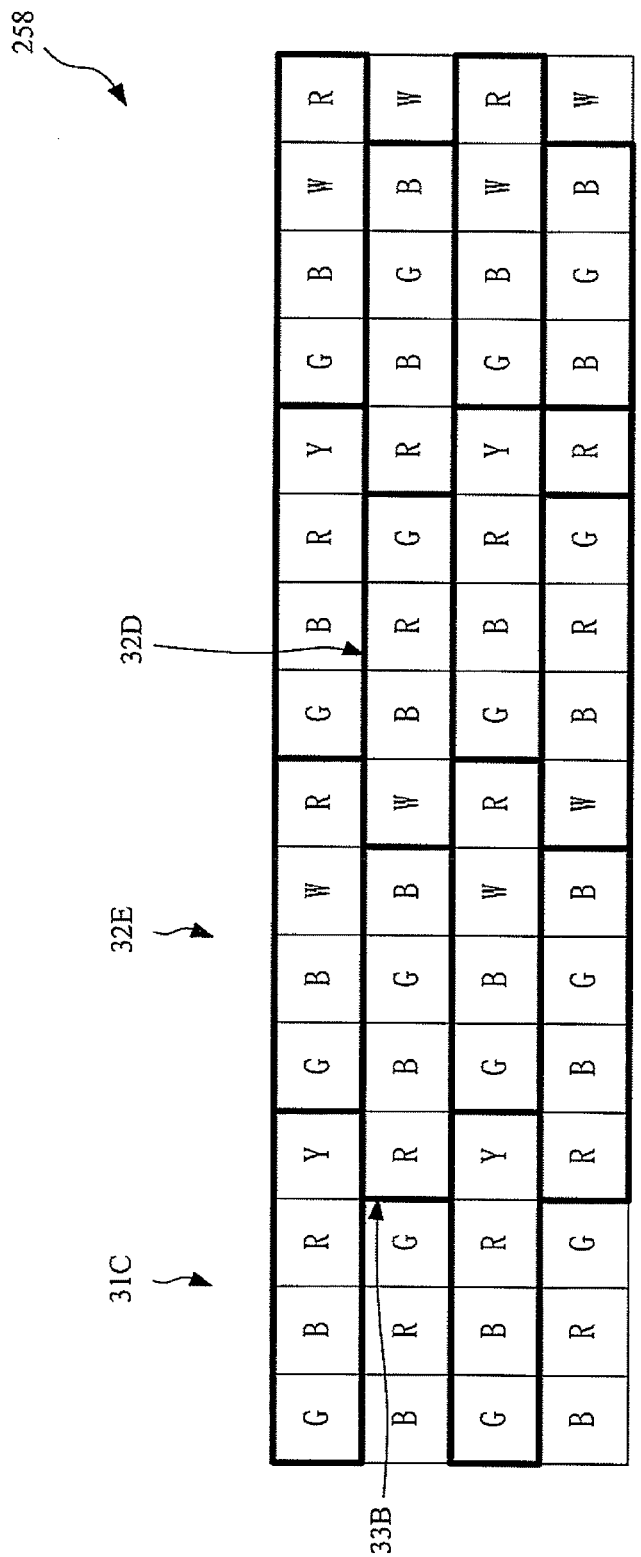
FIG. 58 shows an image device according to an embodiment of the invention.

Referring to FIG. 58, it shows an image device according to an embodiment of the invention. The image device 258 includes a plurality of RGBY pixels 31C, a plurality of RGBW pixels 32D, 32E and a plurality of RBGB pixels 33B. The difference between the image device 258 of FIG. 58 and the image device 246 of FIG. 46 is that each sub-pixel in the image device 258 is formed as about a square shape.

Figure 59:
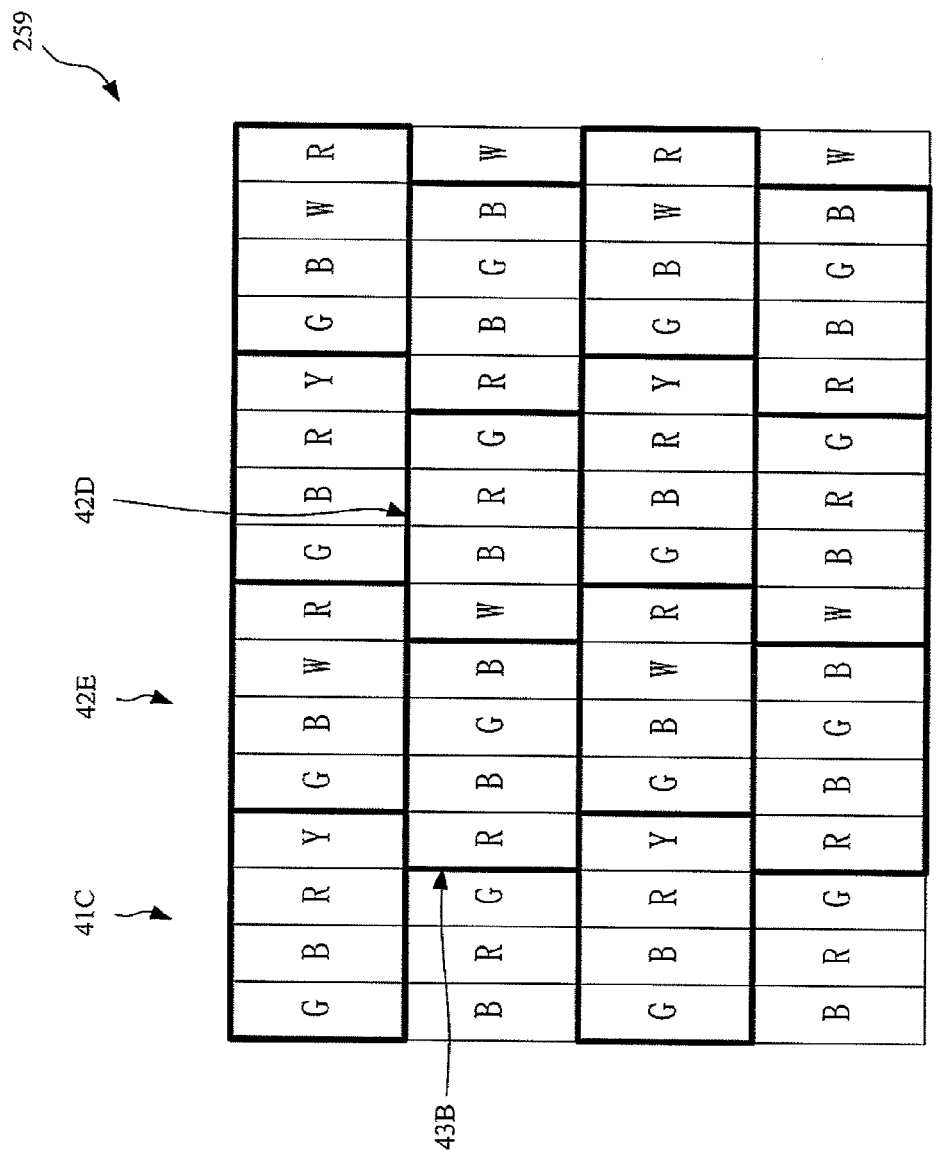
FIG. 59 shows an image device according to an embodiment of the invention.

Referring to FIG. 59, it shows an image device according to an embodiment of the invention. The image device 259 includes a plurality of RGBY pixels 41C, a plurality of RGBW pixels 42D, 42E and a plurality of RBGB pixels 43B. The difference between the image device 259 of FIG. 59 and the image device 246 of FIG. 46 is that each sub-pixel in the image device 259 is formed as about a rectangular shape, and any three adjacent sub-pixels along a longer border are formed as about a square shape.

Figure 60:
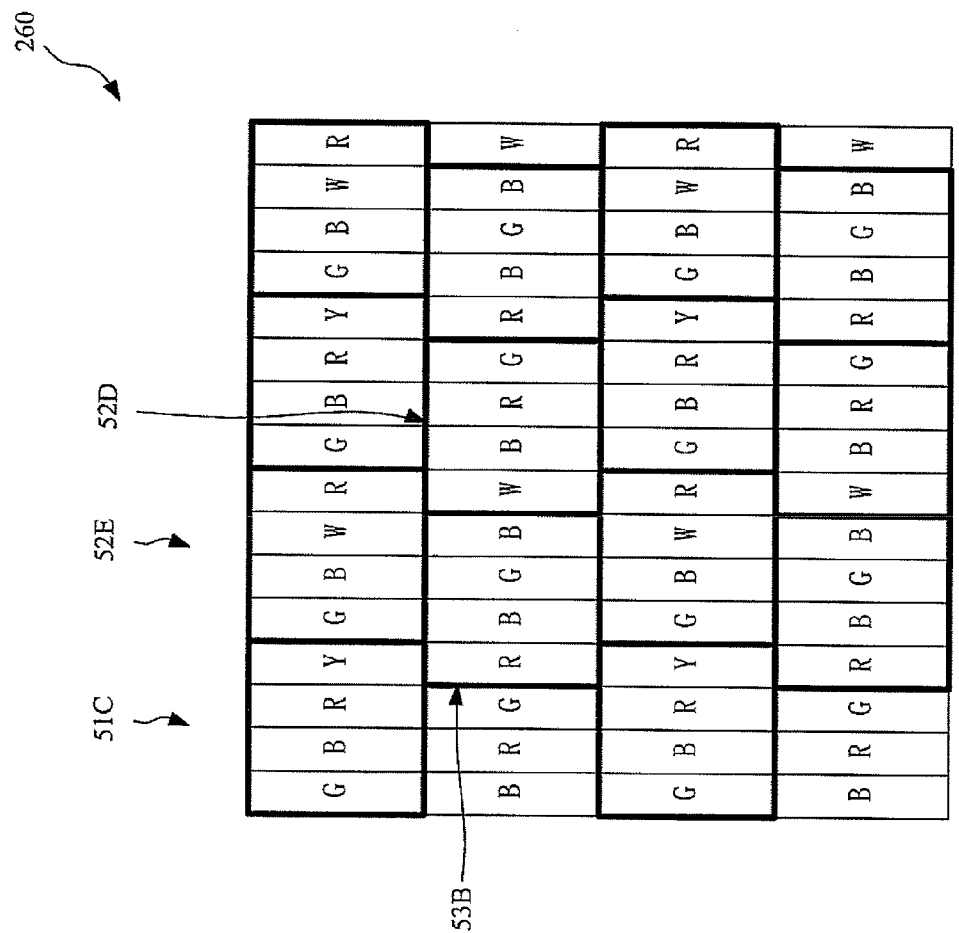
FIG. 60 shows an image device according to an embodiment of the invention.
Figure 61:
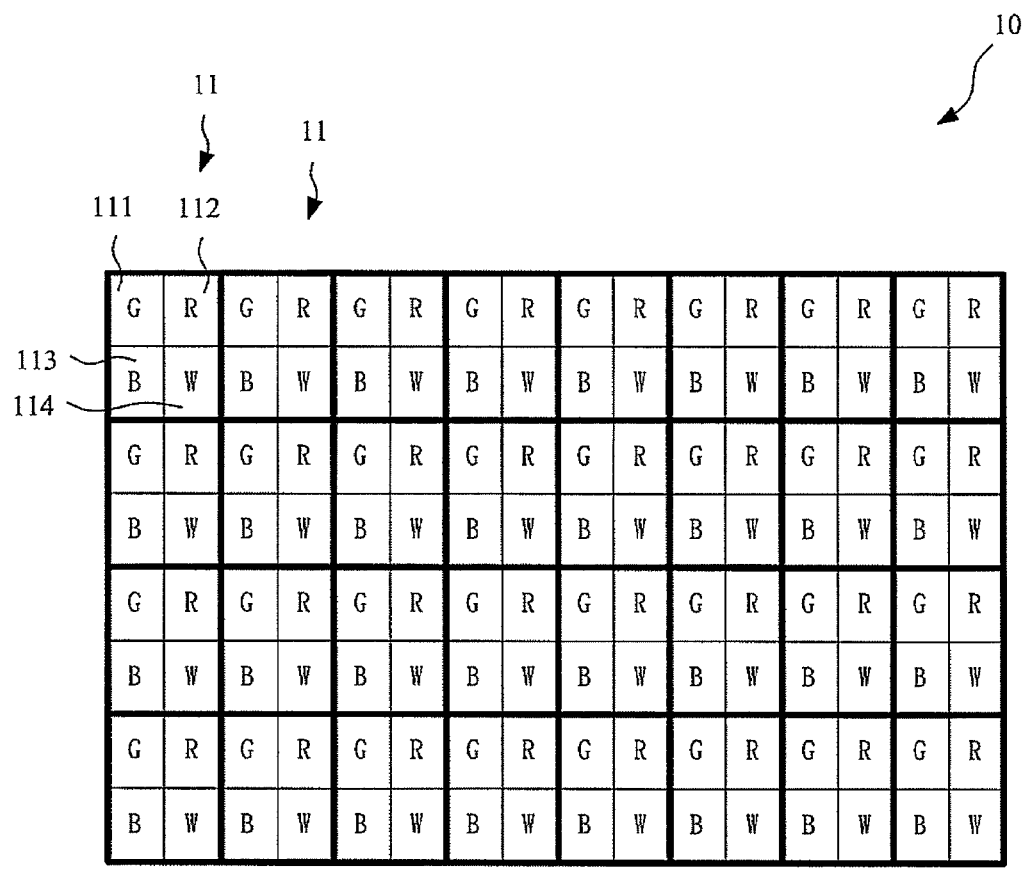
FIG. 61 shows a conventional RGBW display.

Referring to FIG. 60, it shows an image device according to an embodiment of the invention. The image device 260 includes a plurality of RGBY pixels 51C, a plurality of RGBW pixels 52D, 52E and a plurality of RBGB pixels 53B. The difference between the image device 260 in FIG. 60 and the image device 246 in FIG. 46 in that each sub-pixel in the image device 260 is formed as about a rectangular shape, and any four adjacent sub-pixels along a longer border are formed as about a square shape.

By the addition of RGBY pixels, the problem of dark yellow in the conventional RGBW display can be solved and chrominance quality can be improved. The present invention adds both RGBY pixels and RBGB pixels. The RBGB pixels are used to offset the chrominance change caused by the addition of RGBY pixels. The present invention thus can solve the dark yellow problem of conventional RGBW display and at the same time achieve a white balance status.

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:

1. An image device, comprising:
   a plurality of RGBW pixels, each RGBW pixel comprising a red sub-pixel, a green sub-pixel, a blue sub-pixel and a white sub-pixel; and
   a plurality of RGBY pixels, each RGBY pixel comprising a red sub-pixel, a green sub-pixel, a blue sub-pixel and a yellow sub-pixel, and
   a plurality of RBGB pixels, each RBGB pixel comprising a red sub-pixel, a green sub-pixel, and two blue sub-pixels,
   wherein the RGBW pixels and the RGBY pixels and the RBGB pixels are mixed in the image device in such a manner that the RGBY pixels and the RGBW pixels are arranged alternately in a first direction of the image device, and the RGBY pixels and the RBGB pixels are arranged alternately in a second direction, perpendicular to the first direction, of the image device.

2. The image device according to claim 1, wherein the ratio of the number of red sub-pixels to the number of green sub-pixels to the number of blue sub-pixels to the number of white sub-pixels and to the number of yellow sub-pixels is about 4:4:5:2:1.

3. The image device according to claim 1, wherein the ratio of the total area of red sub-pixels to the total area of green sub-pixels to the total area of blue sub-pixels to the total area of white sub-pixels and to the total area of yellow sub-pixels is about 4:4:5:2:1.

4. The image device according to claim 1, wherein each sub-pixel is formed as about a square shape.

5. The image device according to claim 1, wherein each sub-pixel is formed as about a rectangular shape.

6. The image device according to claim 5, wherein any two adjacent sub-pixels along a longer border are formed as about a square shape.

7. The image device according to claim 5, wherein any three adjacent sub-pixels along a longer border are formed as about a square shape.

8. The image device according to claim 5, wherein any four adjacent sub-pixels along a longer border are formed as about a square shape.

9. The image device according to claim 1, wherein each row or each column comprises at least one RGBW pixel.

10. The image device according to claim 1, wherein at least one row or at least one column comprises at least one RGBW pixel and at least one RGBY pixel.

11. The image device according to claim 1, wherein at least one row or at least one column comprises at least one RGBW pixel and at least one RBGB pixel.

12. The image device according to claim 1, wherein every two consecutive rows or every two consecutive columns comprise at least one RGBY pixel.

13. The image device according to claim 1, wherein every two consecutive rows or every two consecutive columns comprise at least one RGBW pixel.

14. The image device according to claim 1, wherein every two consecutive rows or every two consecutive columns comprise at least one RBGB pixel.

15. The image device according to claim 1, wherein each sub-pixel has a plurality of sides adjacent to the other sub-pixels with different color.

16. The image device according to claim 1, wherein each sub-pixel other than white sub-pixels has a plurality of sides adjacent to the other sub-pixels with different color.

17. The image device according to claim 1, wherein at least one row or one column comprises a plurality of yellow sub-pixels and blue sub-pixels.

18. The image device according to claim 1, wherein at least two consecutive rows or two consecutive columns comprise a plurality of yellow sub-pixels and blue sub-pixels.

19. The image device according to claim 1, wherein at least one row or one column comprises a plurality of white sub-pixels.

20. The image device according to claim 1, wherein at least two consecutive rows or two consecutive columns comprise a plurality of white sub-pixels.

21. The image device according to claim 1, wherein the RGBW pixel comprises the red sub-pixel, the green sub-pixel, the blue sub-pixel and the white sub-pixel arranged in a 1×4 matrix.

22. The image device according to claim 21, wherein the sequence of the sub-pixels in the 1×4 matrix is the red sub-pixel, the green sub-pixel, the blue sub-pixel and the white sub-pixel.

23. The image device according to claim 21, wherein the sequence of the sub-pixels in the 1×4 matrix is the green sub-pixel, the blue sub-pixel, the red sub-pixel and the white sub-pixel.

24. The image device according to claim 21, wherein the sequence of the sub-pixels in the 1×4 matrix is the green sub-pixel, the red sub-pixel, the blue sub-pixel and the white sub-pixel.

25. The image device according to claim 21, wherein the sequence of the sub-pixels in the 1×4 matrix is the white sub-pixel, the red sub-pixel, the green sub-pixel and the blue sub-pixel.

26. The image device according to claim 21, wherein the sequence of the sub-pixels in the 1×4 matrix is the white sub-pixel, the blue sub-pixel, the red sub-pixel and the green sub-pixel.

27. The image device according to claim 21, wherein the sequence of the sub-pixels in the 1×4 matrix is the red sub-pixel, the blue sub-pixel, the green sub-pixel and the white sub-pixel.

28. The image device according to claim 21, wherein the sequence of the sub-pixels in the 1×4 matrix is the white sub-pixel, the blue sub-pixel, the green sub-pixel and the red sub-pixel.

29. The image device according to claim 21, wherein the sequence of the sub-pixels in the 1×4 matrix is the green sub-pixel, the blue sub-pixel, the white sub-pixel and the red sub-pixel.

30. The image device according to claim 21, wherein the sequence of the sub-pixels in the 1×4 matrix is the red sub-pixel, the green sub-pixel, the white sub-pixel and the blue sub-pixel.

31. The image device according to claim 21, wherein the sequence of the sub-pixels in the 1×4 matrix is the green sub-pixel, the red sub-pixel, the white sub-pixel and the blue sub-pixel.

32. The image device according to claim 1, wherein the RGBY pixel comprises the red sub-pixel, the green sub-pixel, the blue sub-pixel and the yellow sub-pixel arranged in a 1×4 matrix.

33. The image device according to claim 32, wherein the sequence of the sub-pixels in the 1×4 matrix is the red sub-pixel, the green sub-pixel, the blue sub-pixel and the yellow sub-pixel.

34. The image device according to claim 32, wherein the sequence of the sub-pixels in the 1×4 matrix is the blue sub-pixel, the red sub-pixel, the green sub-pixel and the yellow sub-pixel.

35. The image device according to claim 32, wherein the sequence of the sub-pixels in the 1×4 matrix is the green sub-pixel, the blue sub-pixel, the red sub-pixel and the yellow sub-pixel.

36. The image device according to claim 32, wherein the sequence of the sub-pixels in the 1×4 matrix is the green sub-pixel, the red sub-pixel, the blue sub-pixel and the yellow sub-pixel.

37. The image device according to claim 32, wherein the sequence of the sub-pixels in the 1×4 matrix is the yellow sub-pixel, the green sub-pixel, the blue sub-pixel and the red sub-pixel.

38. The image device according to claim 32, wherein the sequence of the sub-pixels in the 1×4 matrix is the red sub-pixel, the yellow sub-pixel, the green sub-pixel and the blue sub-pixel.

39. The image device according to claim 32, wherein the sequence of the sub-pixels in the 1×4 matrix is the red sub-pixel, the blue sub-pixel, the green sub-pixel and the yellow sub-pixel.

40. The image device according to claim 1, wherein the RBGB pixel comprises the red sub-pixel, the green sub-pixel and two blue sub-pixels arranged in a 1×4 matrix.

41. The image device according to claim 40, wherein the sequence of the sub-pixels in the 1×4 matrix is the green sub-pixel, the blue sub-pixel, the red sub-pixel and the blue sub-pixel.

42. The image device according to claim 40, wherein the sequence of the sub-pixels in the 1×4 matrix is the blue sub-pixel, the red sub-pixel, the green sub-pixel and the blue sub-pixel.

43. The image device according to claim 40, wherein the sequence of the sub-pixels in the 1×4 matrix is the blue sub-pixel, the green sub-pixel, the red sub-pixel and the blue sub-pixel.

44. The image device according to claim 40, wherein the sequence of the sub-pixels in the 1×4 matrix is the red sub-pixel, the blue sub-pixel, the green sub-pixel and the blue sub-pixel.

* * * * *